United States Patent [19]

Kean

[11] Patent Number: 5,670,897

[45] Date of Patent: Sep. 23, 1997

[54] HIGH SPEED MASK REGISTER FOR A CONFIGURABLE CELLULAR ARRAY

[75] Inventor: Thomas A. Kean, Edinburgh, Scotland

[73] Assignee: Xilinx, Inc., San Jose, Calif.

[21] Appl. No.: 711,225

[22] Filed: Aug. 27, 1996

Related U.S. Application Data

[62] Division of Ser. No. 486,464, Jun. 7, 1995, Pat. No. 5,552,722, which is a division of Ser. No. 148,793, Nov. 5, 1993, Pat. No. 5,469,003.

[30] Foreign Application Priority Data

Nov. 5, 1992 [GB] United Kingdom ............. 9223226

[51] Int. Cl.[6] .................................................. H03K 19/177
[52] U.S. Cl. .................................................. 326/41; 326/39
[58] Field of Search .................................. 326/39–41, 44

[56] References Cited

U.S. PATENT DOCUMENTS

| | | | |
|---|---|---|---|
| 4,296,475 | 10/1981 | Nederlof et al. | 364/900 |
| 4,670,749 | 6/1987 | Freeman | 340/825.85 |
| 4,706,216 | 11/1987 | Carter | 365/94 |
| 4,758,745 | 7/1988 | El Gamal et al. | 307/465 |
| 4,758,985 | 7/1988 | Carter | 365/94 |
| 4,870,302 | 9/1989 | Freeman | 307/465 |
| 4,930,107 | 5/1990 | Chan et al. | 365/189 |
| 4,973,956 | 11/1990 | Lin et al. | 340/825.8 |
| 5,003,200 | 3/1991 | Sakamoto | 307/465 |
| 5,015,883 | 5/1991 | Waller | 307/465 |
| 5,047,766 | 9/1991 | Hofmann | 340/825.8 |
| 5,047,983 | 9/1991 | Iwai et al. | 365/200 |
| 5,073,729 | 12/1991 | Greene et al. | 307/465.1 |
| 5,130,947 | 7/1992 | Reed | 365/227 |
| 5,144,166 | 9/1992 | Camarota et al. | 307/465.1 |
| 5,175,865 | 12/1992 | Hillis | 395/800 |
| 5,187,393 | 2/1993 | El Gamal et al. | 307/465.1 |
| 5,221,922 | 6/1993 | Trumpp et al. | 340/825.91 |
| 5,243,238 | 9/1993 | Kean | 307/465 |
| 5,303,181 | 4/1994 | Stockton | 365/96 |
| 5,338,984 | 8/1994 | Sutherland | 307/465.1 |
| 5,559,971 | 9/1996 | Hsieh et al. | 326/41 X |
| 5,570,041 | 10/1996 | El-Ayat et al. | 326/41 |

FOREIGN PATENT DOCUMENTS

WO90/11648  3/1990  WIPO.

OTHER PUBLICATIONS

Zlotnick, Fred; Butler, Paul; Wanhao, Li; Dandas, Tang "A High Performance Fine–Grained Approach to SRAM Based FPGA's" Wescon/93, Conference Record, Sep. 28–30th, San Francisco, CA 1993, pp. 321–326.

Mead and Conway, "Introduction to VLSI Systems", Oct. 1980, Addison–Wesley Pub. Co., Reading Mass., pp. 157–160.

Product Literature, "CLi6000 Series Field–Programmable Gate Arrays" Concurrent Logic, Inc. May 1992, Revision B, 16 pages.

Stone, H. S.; IEEE Transactions on Computers, vol. C19, No.1; "A Logic in Memory Computer"; Jan. 1970; pp. 73–78.

Kautz, W. H.; IEEE Transactions on Computers, vol. C18, No. 8, "Cellular Logic–in–Memory Arrays"; Aug. 1969; pp. 719–727.

El-Ayat, Khaled A. et al., "A CMOS Electrically Configurable Gate Array", IEEE Journal of Solid State Circuits, vol. 24, No. 3, Jun. 1989, pp. 752–762.

IBM Technical Disclosure Bulletin, "Dense Multi–Port SRAM Cell" vol. 32, No. 10A, Mar. 1990, pp. 176–178.

*Primary Examiner*—David R. Hudspeth
*Attorney, Agent, or Firm*—Edel M. Young

[57] ABSTRACT

An field programmable gate array (FPGA) of cells arranged in rows and columns is interconnected by a hierarchical routing structure. Switches separate the cells into blocks and into blocks of blocks with routing lines interconnecting the switches to form the hierarchy. Also, select units for allowing memory bits to be addressed both individually and in large and arbitrary groups are disclosed. Further a control store for configuring the FPGA is addressed as an SRAM and can be dynamically reconfigured during operation.

3 Claims, 41 Drawing Sheets

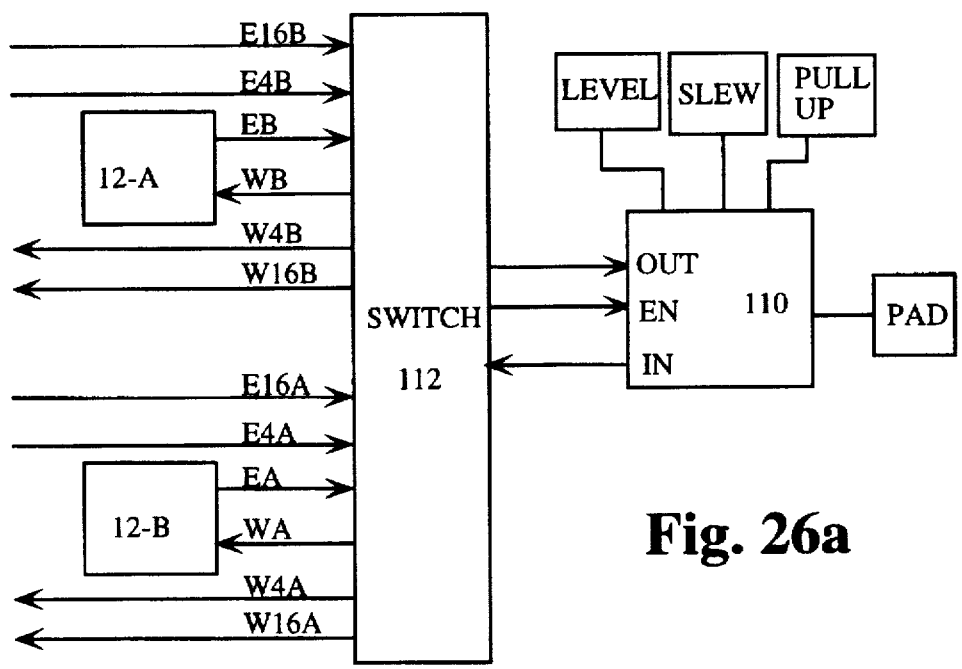
Fig. 26a
| PARAMETER | VALUE |
|---|---|
| MODE | INPUT, OUTPUT, TRISTATE, OPEN DRAIN |
| INPUT LEVEL | TTL, CMOS |
| SLEW RATE | FAST, SLOW |
Fig. 26b
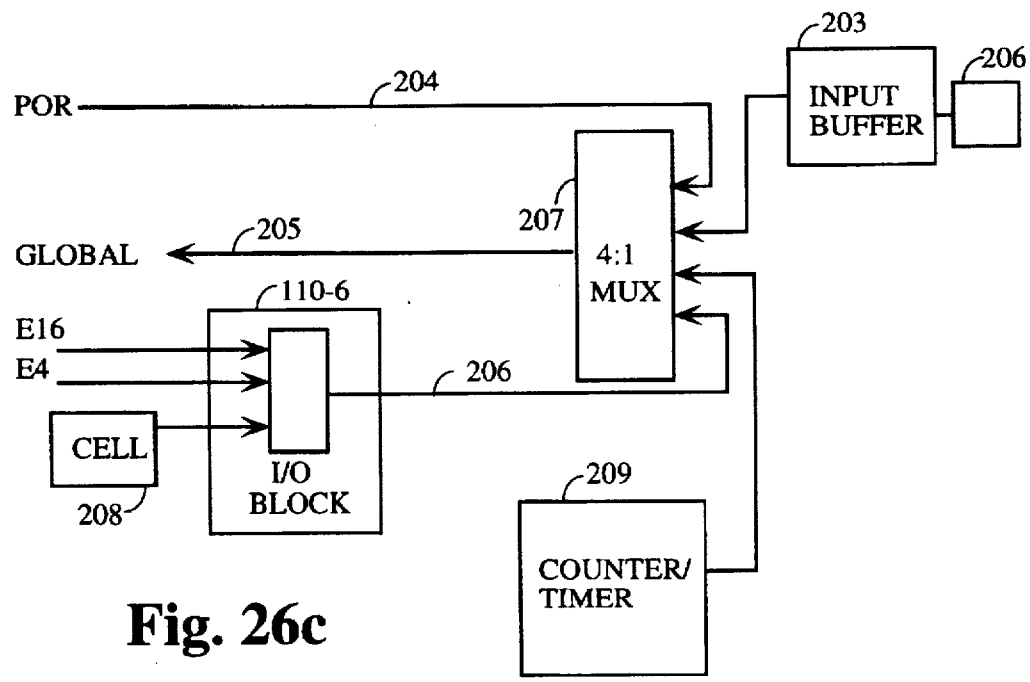
Fig. 26c

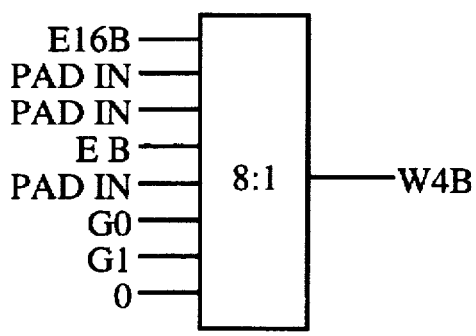
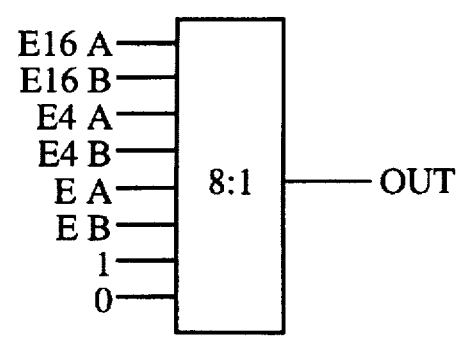
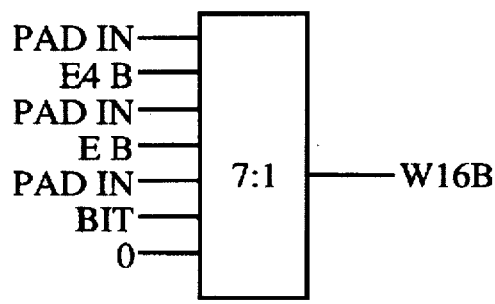
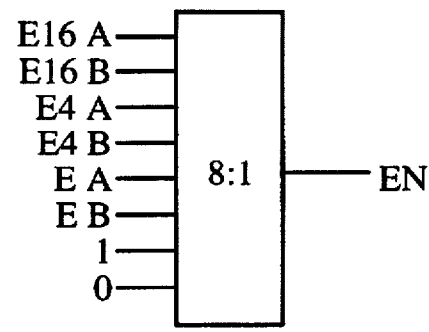
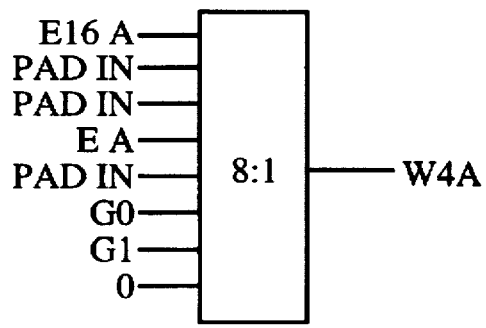
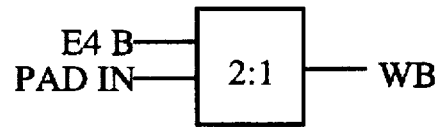
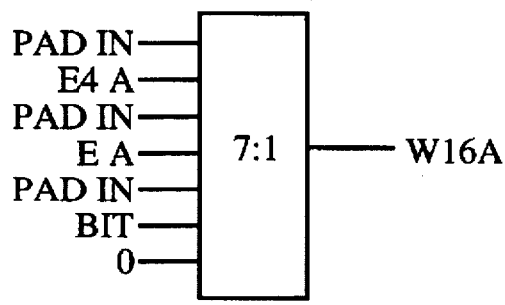
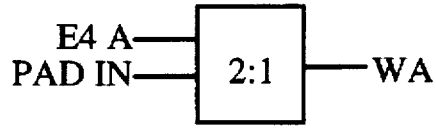
FIG. 26d

| CELL COLUMN | CELL ROW | SIDE | MODE |
|---|---|---|---|
| 0:5 | 6:11 | 12 | 13:14 |

FIG. 29

| MODE0 | MODE1 | STORE SELECTED |
|---|---|---|
| 0 | 0 | CELL ROUTING |
| 0 | 1 | CELL FUNCTION |
| 1 | 0 | CHANNELS, I/O |
| 1 | 1 | STATE ACCESS, DEVICE CONFIG. |

FIG. 30

CELL ROUTING MODE

| BIT | 0 | 1 | 2 | 3 | 4 | 5 | 6 | 7 |
|---|---|---|---|---|---|---|---|---|
| SIDE 0 | SOUTH | | WEST | | EAST | | NORTH | |

FIG. 31a

CELL FUNCTION MODE

| BIT | 0 | 1 | 2 | 3 | 4 | 5 | 6 | 7 |
|---|---|---|---|---|---|---|---|---|
| SIDE 0 | X1[0:1] | | X2[0:1] | | X3[0:1] | | UNUSED | |
| SIDE 1 | X1[2] | Y1 | X2[2] | Y2 | X3[2] | Y3 | COMB/SEQ | UNUSED |

FIG. 31b

| BIT | 0 | 1 | 2 | 3 | 4 | 5 | 6 | 7 |
|---|---|---|---|---|---|---|---|---|
| CELL | ROW | ROW+2 | ROW+4 | ROW+6 | ROW+8 | ROW+10 | ROW+12 | ROW+14 |

FIG. 35

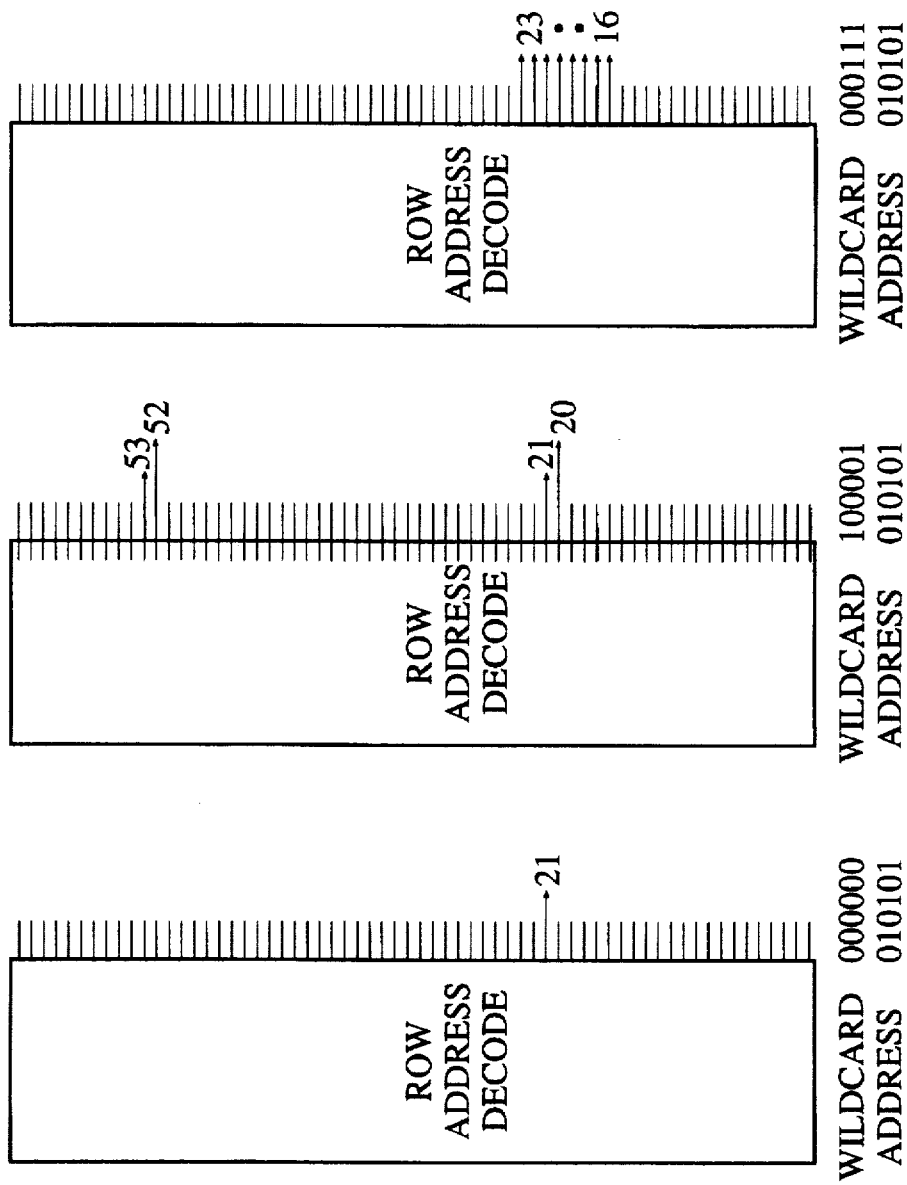

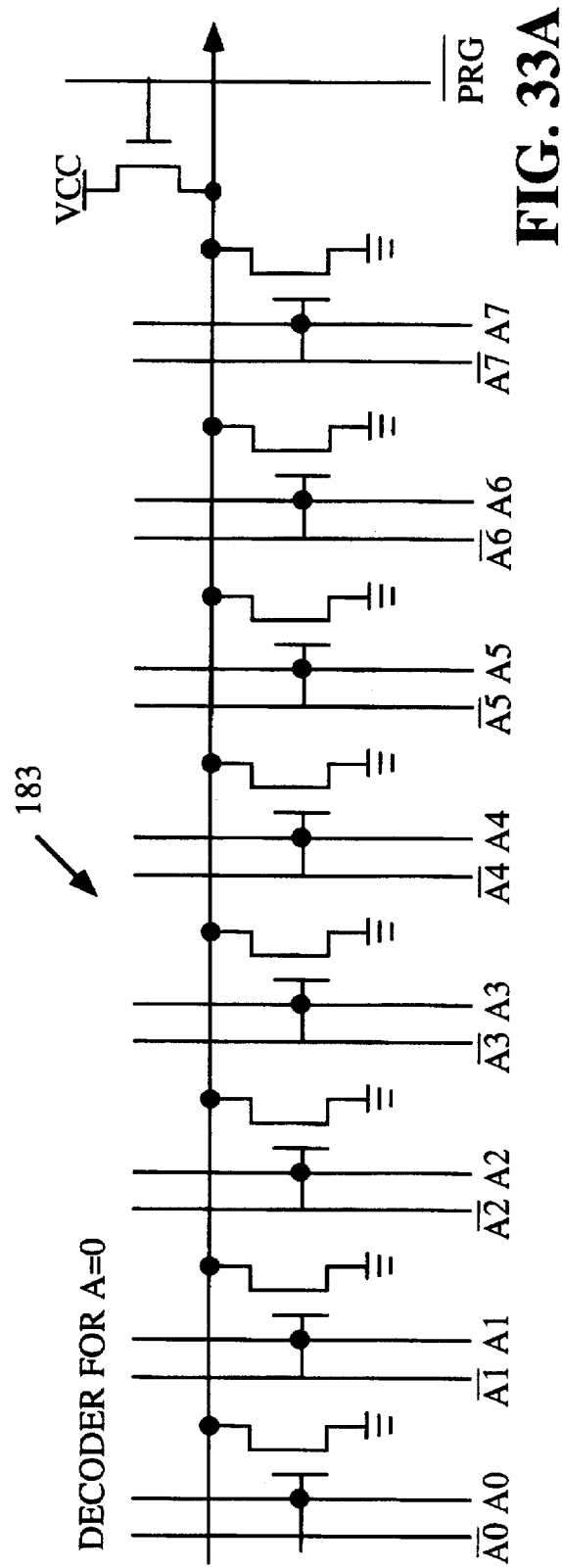
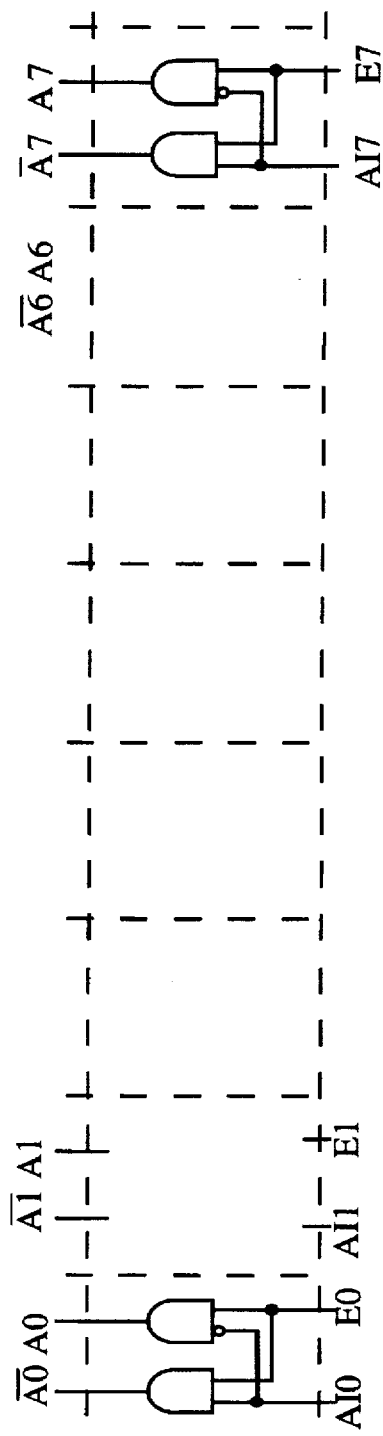
FIG. 33A
FIG. 33B

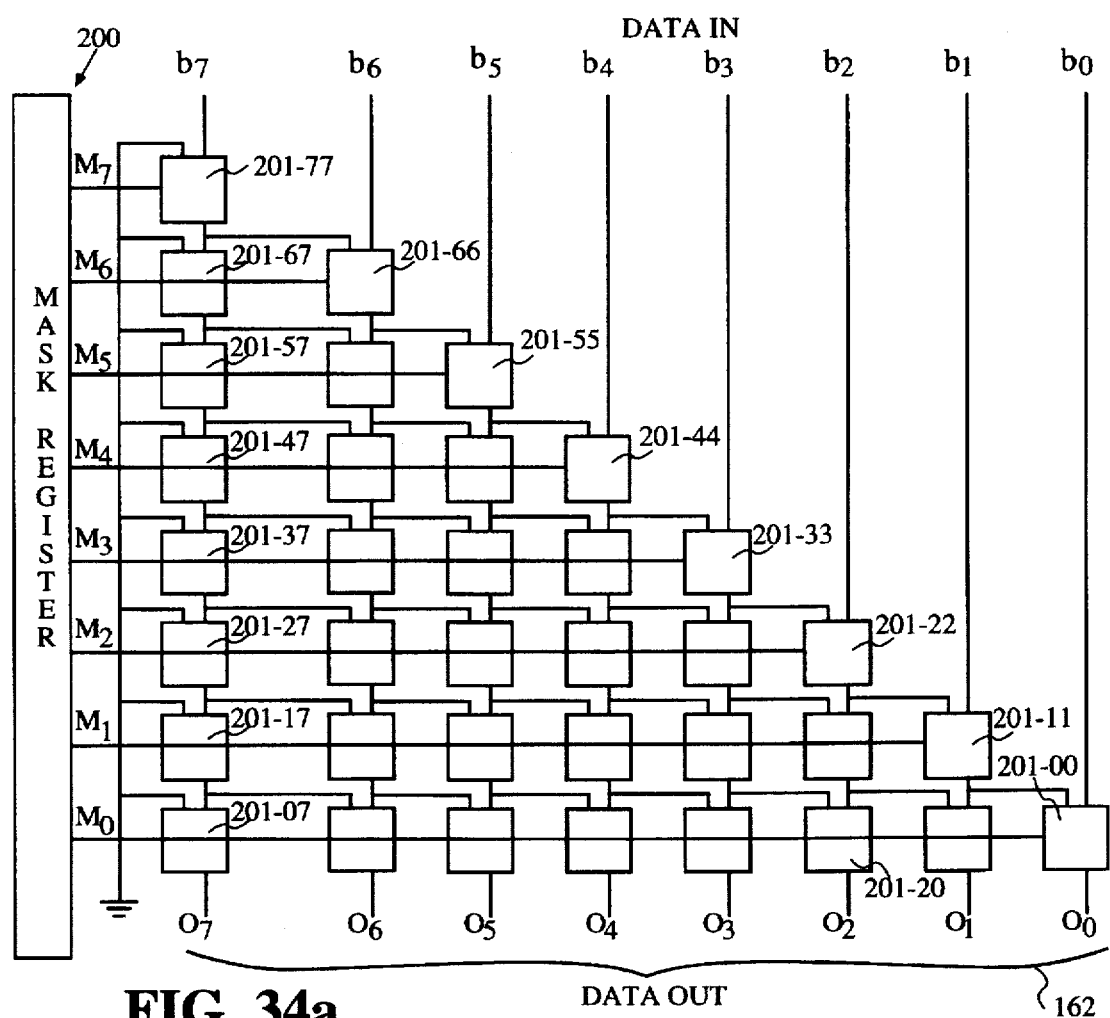
FIG. 34a
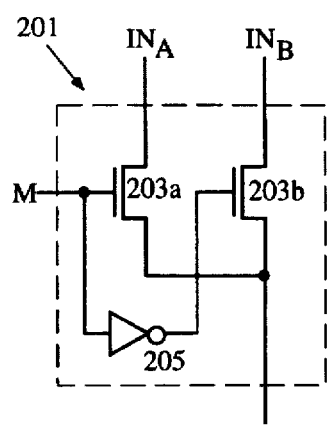
FIG. 34b
| Internal Bit | $b_7$ | $b_6$ | $b_5$ | $b_4$ | $b_3$ | $b_2$ | $b_1$ | $b_0$ | DATA IN |
|---|---|---|---|---|---|---|---|---|---|
| Mask Register | 1 | 0 | 0 | 1 | 0 | 0 | 0 | 1 | ENABLE |
| External Bit | 0 | 0 | 0 | $b_6$ | $b_5$ | $b_3$ | $b_2$ | $b_1$ | DATA OUT |
FIG. 34c

HIGH SPEED MASK REGISTER FOR A CONFIGURABLE CELLULAR ARRAY

This application is a division of application Ser. No. 08/486,464 filed Jun. 7, 1995 now U.S. Pat. No. 552,722 which is a divisional of application Ser. No. 08/148,793, filed Nov. 5, 1993 now U.S. Pat. No. 5,469,003.

FIELD OF THE INVENTION

The present invention relates to a configurable cellular array of dynamically configurable logic elements, such arrays being generally known as Field Programmable Gate Arrays (FPGAs).

BACKGROUND OF THE INVENTION

Reprogrammable FPGAs have been available commercially for several years. The best known commercial family of FPGAs are those from Xilinx Inc. One class of these devices uses Static Random Access Memory (SRAM) to hold control bits which control their configurations. Most FPGA devices replace traditional mask programmed Applications Specific Integrated Circuit (ASIC) parts which have a fixed configuration. The configuration of the FPGA is static and is loaded from a non-volatile memory when power is applied to the system. Nearly all commercially available FPGAs have a stream-based interface to the control store. (The control store contains the set of bits which determine what functions the FPGA will implement.) In a stream-based interface to the control store, a sequence of data is applied to a port in the FPGA to provide a complete configuration for the whole device or for a fixed (normally large) sub-section of the FPGA. This stream-based interface, when combined with an address counter which is implemented on the FPGA itself, provides an efficient method of loading the complete device configuration from adjacent EPROM or other non-volatile memory on power up without any additional overhead circuits. A stream based interface with an address counter is a suitable programming interface for an FPGA which is used as a replacement for a standard ASIC. Some FPGAs can be partly or totally reconfigured using one of a set of static configurations stored at different addresses in an EPROM, and can trigger the reconfiguration from within the design implemented on the FPGA.

Published International Application WO 90/11648, corresponding to U.S. Pat. No. 5,243,238, discloses an architecture hereafter referred to as CAL I, which has been implemented in an Algotronix product designated CAL 1024. CAL I is different from other commercially available FPGAs in that its control store appears as a standard SRAM to the systems designer, and can be accessed using address bus, data bus, chip enable, chip select and read/write signals. Addressing the control store as an SRAM supports a user program running on the host processor mapping the FPGA control store (configuration memory) into the memory or address space of the host processor so that the processor can configure the FPGA to implement a user-defined circuit. This arrangement, which is implemented in the CAL 1024 FPGA, allows the user to partition an application between the processor and the FPGA with appropriate sections being implemented by each device. The control store interface provides an important input/output (I/O) channel between the FPGA and the processor, although the I/O can also take place using more traditional techniques via, for example, a shared data memory area. This latter type of FPGA provides a passive control store interface because an external agent is required to initiate configuration or reconfiguration of the device, as required.

Experience with the CAL I architecture and trends within the electronics industry have made this second passive form of control store interface increasingly attractive for many applications. Microprocessors or microcontrollers are now pervasive components of computer systems and most bard level systems contain one. The major benefit of the stream based "active" FPGA programming approach is that no overhead circuits are required to initiate reconfiguration. In systems where a microprocessor or microcontroller is present, the "passive" RAM emulating FPGA interface is preferable for several reasons:

(1) the FPGA configuration can be stored in the microprocessor's program and data memory (reducing the number of parts by removing the need for a separate memory chip), (2) the existing data and address buses on the board can be used to control the FPGA (saving printed circuit board area by removing dedicated wires between the configuration EPROM and the FPGA);

(3) the FPGA control store can be written to and read from by the microprocessor, and thereby used as an I/O channel between the FPGA and the microprocessor, thereby potentially saving additional wiring between the FPGA and the processor buses and freeing the FPGA programmable I/O pins for communication with external devices, and (4) the intelligence of the microprocessor can be used to support compression schemes for the configuration data and other techniques, which allows more flexibility in reprogramming the FPGA.

In addition, the difference in cost between an "active" FPGA with an associated EPROM holding its configuration and a passive FPGA with an active microcontroller chip containing an EPROM and a simple processor is minimal. The easy reprogrammability makes the passive FPGA attractive, even if the microcontroller has no other function apart from reprogramming the FPGA.

Another trend within the Electronics Industry has been the provision of "support chips" for microprocessors which provide an interface between I/O devices and a particular microprocessor. Examples of these devices include Universal Asynchronous Receiver Transmitters (UARTs) for low bandwidth serial I/O, Programmable Peripheral Interfaces (PPIs) for low bandwidth parallel I/O and various specialised chips for higher bandwidth connections to networks and disk drives. These support chips appear to the processor as locations in the I/O or memory address space to and from which data are transferred. Some support chips can interrupt the processor via interrupt lines or take over the bus for Direct Memory Access (DMA) operations. In many ways a passive FPGA chip can be viewed as a successor to a support chip, providing an interface to the processor via its control store on the one hand, and an interface to the external world via a large number of flexible I/O lines on the other, for example 128 programmable I/O lines on the Algotronix CAL 1024 device.

A passive FPGA chip has a number of advantages. For example, it is cost-effective to provide a single FPGA with a library of configurations instead of providing a number of support chips. In addition, providing a single FPGA for several functions reduces the number of devices in the processor manufacturer's catalogue. Also, reconfigurable FPGAs can support changeable I/O functions, such as when a single external connector can be used as either a serial or a parallel port. With a passive RAM control interface, the FPGA is able to support other functions as well.

Each time an FPGA is reconfigured to implement a different set of functions, the microprocessor must access the configuration memory. One reconfiguration typically requires many control store accesses, one access for each word of configuration memory to be changed. Several important classes of reconfiguration have been identified.

(1) Application swapping occurs when one application terminates and a completely different application wishes to make use of the FPGA. In this case the FPGA chip is completely reconfigured, usually from a static configuration.

(2) Task swapping occurs when the application must configure relatively large sections of the FPGA to implement a new phase in the computation. For example, a sorting application might first sort small batches of data completely using configuration A and then merge those sorts into a completely sorted stream of data using configuration B. In this case, the application has knowledge of both configurations and need only change those resources which are different in configuration B. At a later point, configuration A may itself be restored.

(3) Data dependent reconfiguration occurs when the configurations of some cells are computed dynamically based on input data by the application program, rather than being loaded from a static configuration file. Often a static configuration is first loaded, then a relatively small sub-set of cells are reconfigured dynamically (that is, reconfigured while the chip is operating). An important example of this class of reconfiguration is where an operand (such as a constant multiplier or a search string) is folded directly into the logic used to implement the multiply or sort unit rather than being stored in a register. This technique is advantageous as it frequently results in smaller and faster operation units.

(4) Access to gate outputs occurs for debugging. The outputs of all the logic cells on the CAL I FPGA are mapped to bits of the control store. Debugging programs are available which read back this information on the display or design layout to show the logic levels on internal wires.

(5) Access to gate outputs for I/O is similar to the previous access to gate outputs for debugging. But in this particular case only a small fraction of the logic nodes, namely those which correspond to input and output registers, will be accessed repeatedly. The ability to rapidly assemble a word representing input to or the result of a computation from several bits at different locations in the control store is critical to the effectiveness of this technique.

It is desirable to reduce the number of accesses required and hence the time to wholly or partially reconfigure the device. Several systems other than CAL I have been proposed which allow direct access to internal signals in an FPGA or an FPGA-like device, for example, as disclosed in Cellular Logic-in-Memory Arrays, William H. Kautz, IEEE Transactions on Computers Vol C18 No. 8, August 1969; A Logic in Memory Computer, Harold S. Stone, IEEE Transactions on Computers, Vol C19 No. 1, January 1970 and Xilinx U.S. Pat. No. 4,758,985 Microprocessor Oriented Configurable Logic Element, although all these proposals suffered from major drawbacks and were not made available commercially.

It is also desirable to improve the means of accessing state information in designs implemented on FPGAs so that an external processor can perform word-wide read or write operations on the registers of the user's design with a single access to the control store. Thus the control store interface allows high bandwidth communication between the processor and the FPGA. It is also desirable to provide mechanisms for synchronising computations between the FPGA and the processor and to provide a mechanism for extending design configuration files to support dynamic reconfiguration while allowing use of conventional tools for static designs to create FPGA configurations The architecture of the CAL 1024 was based on 1.5 micrometer technology available in 1989. One problem with the CAL I architecture in which cells are connected only to their nearest neighbours was that cells in the middle of the array became less useful with increasing array size as the distance and hence delay to the edge of the chip increased. This problem became more serious as improvements in processing technology meant that the number of cells implementable per chip increased from 1024 to about 16,384. This resulted in a scalability problem because of increased delays, and reduced the performance below the desired criteria. Thus, although scalability of chips using the CAL I architecture can be achieved, it is at the expense of performance. The limited number of cells available on a single chip with 1.5 um technology meant that it was desirable to ensure scalability over chip boundaries so that large designs typical of many computational applications could be realised using multiple chips. The limitations of the then processing technology also made it essential to optimise the architecture for silicon area and sometimes this optimisation was at the expense of speed. The original Algotronix CAL 1024 chips were designed to bring out peripheral array signals to pads on the edges of the cellular array so that they could be cascaded into larger cellular arrays on a printed circuit bard. Packaging technology has not evolved as rapidly as chip technology and limitations on the number of package I/O pins make it uneconomic to produce fully cascadable versions of the higher cell density chips.

The CAL I architecture suffered from a number of other disadvantages. For example, in order to access a cell in the existing CAL I FPGA, five to six processor instructions are needed to calculate the address of the cell; this again takes time and slows operation. With the existing CAL I cell array the routing architecture used meant that with increased number of cells per chip, routing via intermediate cells added considerably to the delays involved. In addition, in the CAL 1024 device, global signals are coupled to all the cells in the array so that the cells can be signalled simultaneously. It logically follows that at high clock frequencies, global signals could consume high power.

SUMMARY OF THE INVENTION

An object of the present invention is to provide an improved field programmable gate array which obviates or mitigates at least one of the aforementioned disadvantages.

A further object of the present invention is to reduce the number of control store accesses required and the time to wholly or partially reconfigure the device from one configuration to another.

A further object of the invention is to enable an external processor to perform word-wide read or write operations on registers of a user's design with a single access to the control store.

A yet further object of the present invention is to provide a mechanism for extending design configuration files to support dynamic reconfiguration while allowing the use of conventional tools for static designs to create FPGA configurations.

A further object of the invention is to provide mechanisms for the synchronisation of computations between the FPGA and an external processor.

A yet further object of the invention is to provide a novel routing architecture which can be scaled up to operate on arrays having different numbers of cells to reduce delays involved in routing between cells in large cell arrays.

Array of Cells with Hierarchical Routine Structure

In accordance with the present invention, a 2-dimensional field programmable gate array (FPGA) of cells arranged in rows and columns is provided. Each cell in the array has at least one input and one output connection at least one bit wide to each of its neighbouring cells. Each cell also has a programmable routing unit and a programmable function unit to permit intercellular connections to be made. The programmable function unit can select one of a plurality of functions of several input signals for generating a function unit output signal. The routing unit of a cell directs inputs of the cell to function unit inputs, and also directs inputs of the cell and the function unit output to neighbouring cells. Groups of cells in the array are arranged so as to be connected to additional conductors of a length equal to a predetermined number of cells. Cells in the array are coupled to the additional conductors via switches. Typically, four such conductors are provided for each cell, two conductors arranged in one direction in the array and two conductors arranged in the orthogonal direction in the array. Each pair of conductors is arranged such that one conductor in the pair carries signals in one direction and the other conductor carries signals the opposite direction. This novel architecture is referred to hereafter as the CAL II architecture, or simply as CAL II.

A predetermined block of cells, for example a 4×4 block of cells, has the additional conductors of at least cell length 4 (four cells long). These blocks are arranged into repeating units to form an array of these cells whereby 16 of such 4×4 blocks of cells result in a unit of 16 cells×16 cells with each 4×4 block having the additional conductors, the longer conductors hereinafter referred to as flyovers, associated with each row or column of 4 cells. The 16×16 block of cells may itself have additional flyover conductors.

In larger cellular arrays, the structure of the hierarchical routing can be extended to any number of levels, a third level using conductors of length 64, and a fourth level using conductors of length 256 and so on.

This arrangement permits scaling of the array with the advantage that the scaling is logarithmic in terms of distance, thereby significantly reducing delay between cells. Specifically, a signal travels from an origin cell to its closest associated switch located at a cell block boundary, then along appropriate flyovers to the destination cell. Thus, this structure creates a hierarchical cellular array with a variety of routing resources whose lengths scale, in one embodiment by a factor of 4 each time, built on top of a simple array of neighbour connections only.

The principal advantage of providing different levels of routing resources is that it allows the number of conductor segments required to route from cell to cell on the array to be minimised. For example, if a path is provided between two points in the array using neighbour interconnect only, the number of routing segments would be equal to the number of cells between the two points, whereas with the hierarchical interconnect, the number of segments increases with the logarithm of the distance between the cells.

Single-Source Directed Wiring

In one embodiment of a pre-programmable cellular array with hierarchical routing, all the wires in the array are directed and have a single source. Thus, 3-state drivers are not used. In one embodiment, all the connections in the array are completely symmetrical so that if the array is rotated the structure remains unchanged. Single source wiring has the advantage of being simpler to implement than multiple-source wires. Multiple-source wires, while allowing additional flexibility, require a considerable area overhead, and produce contention when different drivers attempt to place opposite values on the same wire. Contention dissipates heavy power, which can result in device failure. Contention is prevented by the present invention, in which a wire is driven by a single multiplexer output. The symmetry feature simplifies the CAD software to map user designs onto the array and allows hierarchical blocks of those designs to be rotated or reflected to provide better utilisation of the array area.

Preferably, the switches providing connections between the flyovers and the cells are static RAM controlled multiplexers. Conveniently, the switches at 4-cell and 16-cell boundaries permit direct neighbour connections as well as additional connections via the longer flyover conductors.

Automatic Routing Optimization Portability

The hierarchical routing resources in the improved FPGA can be used in two principal ways. Firstly, the user can design using simpler neighbour programming models ignoring the availability of the longer connections. In such a case, the software will automatically detect nets in the layout which may benefit from new routing resources, and take advantage of these resources to speed up performance of the design. Secondly, the user can design using improved programming models and make explicit assignments to the extra routing resources. In this case, extra density is achieved by assigning different nets to various levels of interconnect at the same point in the cellular array. For example, a length-16 wire could carry a signal over a sub-unit (for example, several 4×4 blocks) without interfering with the local interconnect in that sub-unit. When flyovers are used to bypass a block of cells, blocks of the user design might have to be placed in the FPGA on these 4-cell or 16-cell boundaries. Automatic addition of flyover routing is easier to use and is independent of the number of levels of routing provided by a given FPGA chip. Using software to add the flyovers provides design portability between different chips, and using improved programming models which use flyovers to bypass a block, or manually assigning flyover resources as appropriate, allows more efficient use of the resources provided.

Use of longer routing resources may be achieved using low level CAD software as described above or using hardware in the chip itself to automatically route signals to longer wires where possible. This provides more device portability and allows special "fast" versions of existing chips to be made with additional longer wires without requiring any changes to the existing design. This "dynamic" selection of longer routing wires simplifies the CAD software, allowing it to run faster. Dynamic selection of longer wires is particularly attractive for applications which involve dynamically reprogramming FPGA chips.

According to another aspect of the invention the speed of propagation of signals through an FPGA is improved by automatically mapping onto flyovers those signals capable of being speeded up using circuitry fabricated on the FPGA. The method comprising the steps of:

detecting control store bit patterns which correspond to routing a signal straight through a cell, detecting when a group of cells beneath a flyover all route the signal in the direction of the flyover by using the 4-input gate provided for that flyover direction, and taking as input the output of the 4-input gate of the appropriate neighbour multiplexer, feeding an output from one of the 4 input gates to switches at both ends of the flyover, whereby the signal is carried automatically by the flyover as well as by neighbour routing, and the faster signal on the flyover is selected by the switch at the end of the flyover.

The method is scalable and can be applied to a group of 4 length-4 flyovers under a length-16 flyover when this group all route a signal in the direction of the length-16 flyover. This is done using a 4-input gape which takes inputs the outputs of the 4-input gates used for receiving signals from the neighbour cells.

The type of gate used depends on the control bits being detected. For example, a NOR gate is used for detecting bits 0,0 in an East to West direction in a West routing multiplexer. Alternatively, to detect a bit pattern of 1,1, a NAND gate and associated logic circuitry are used.

Block Correspondence Allows Easy Reconfiguration

An important feature of the present invention, is that a rectangular area of cells specified as a hierarchical block of the user's design (for example, a 4×4 block or a 16×16 block of cells) corresponds directly, i.e. by a straight-forward physical relationship, with one or more rectangular areas in the configuration memory (control store) of the CAL II FPGA device representing instances of that block. This means that a block of the user's design can be dynamically replaced by another block of the same size, for example, a register can be replaced by a counter of equal size. Thus, in accordance with the present invention, the host processor must reconfigure only the corresponding area of the control store RAM. The binary data for both blocks can be pre-calculated from the user's design, and the actual replacement can be done very rapidly using a block transfer operation, as is well known in the art. During dynamic reconfiguration, registers can be initialised either to a default associated with a block definition or to restore the previous state of the unit whose configuration is being restored or to a convenient value decided by the application program performing the reconfiguration.

Wildcard Feature

According to a further aspect of the present invention an FPGA is provided having a randomly accessible writable control store in which more than one word of control memory is written simultaneously as a result of a single write access. Conveniently, the row and column decoders may be implemented by standard NOR gates coupled to wildcard registers associated with the address buses to the respective row and column decoders.

Match Feature

Alternatively, the FPGA includes a plurality of programmable rather than fixed row decoders, which are implemented by means of match registers. Also, the FPGA includes a plurality of column decoders which are implemented by match registers.

Shift and Mask Feature

According to a further aspect of the present invention shift and mask registers are provided between an external data bus and internal data bus to the bit line drivers. This has the advantage of allowing for additional flexibility in selecting which bits of the addressed word are significant for the current transfer and presenting that information in a more convenient form, such as left aligned to the external processor.

Preferably, the FPGA writable control store includes a mask unit for allowing some bits of a word to be programmed selectively. Conveniently, the mask unit includes shift components which can expand left aligned data for unmasked bits or produce left aligned data from a word with some bits masked out.

In the FPGA, word-wide read and write accesses may be made through the control store interface to registers of a user design. Register access can be extended to an antifuse, EPROM, EEPROM or mask programmable logic device by providing an additional RAM like interface for accessing internal state information.

Configuration and State Information Segregated

Advantageously, in the CAL II FPGA, the values present on internal nodes appear in the control store address space such that any word in the address space contains bits representing values on internal nodes or bits containing configuration information, but not both. Conveniently, the values in internal nodes appear in the control store address space such that addresses corresponding to state information are distinguishable from addresses corresponding to configuration information by examining one or a small subset of mode bits from the address bus.

Conveniently, the FPGA includes a further set of bit and word line drivers which are arranged orthogonally to the first set of bit and word line drivers such that logic state information in a dual-ported memory in the device is accessible word-wide in either the horizontal (bit) or vertical (word) direction.

Multiple Address Decoders

According to another aspect of this invention bit and word lines in the RAM are associated with multiple address decoders, and additional address bits are fed to these secondary decoders. Using more than one address decoder allows a more complex mapping between internal memory bits and external addresses, including the possibility of multiple bits of memory having a single address. This technique allows for density of the memory array while preserving logical fields corresponding to different device functions in the external address.

Microcontroller Integrated with FPGA

A further aspect of the invention integrated FPGA architecture on the same chip with a microprocessor or microcontroller, wherein the FPGA control store memory is mapped into the processor address space.

On-Chip Timers

The FPGA architecture may include programmable counter-timers integrated on the chip to drive in global clock signals.

External and Internal Programmability

The address and data buses in the CAL II FPGA used for programming can also be connected to cell inputs and outputs as well as external signals.

To external systems, the CAL II array appears as two separate devices: a static random access memory control store and a programmable logic unit which is effectively the user's design. The memory control store is normally mapped into the address space of the host computer allowing rapid changes of configuration. Use of random access control memory in the CAL II FPGA means that only those cells or parts of cells whose function has changed need to be reprogrammed. It will be understood that the programmable logic unit consists of the array of functional cells surrounded by programmable input/output blocks.

High Speed Path

According to another aspect of the present invention, the function unit of a cell has a plurality of input signals for receiving a plurality of input variables, the input variables being processed in parallel paths, whereby one of the parallel paths is optimised for speed so that a user can direct critical signals to the optimised path to ensure minimal delay in processing the signal.

Reconfiguration Synchronized with Computation

According to a further aspect of the invention there is provided a method of writing data directly into a register of the CAL II array. The method comprises the steps of using the bit or word lines to the control store as clocks or signals for synchronising computations in a circuit implemented in the CAL II array. In this manner, user logic implemented on the FPGA is synchronized to a microprocessor.

According to a further aspect of the invention, external signals may be monitored by circuits implemented on an FPGA. The monitoring method comprises the steps of connecting the external signals to be monitored to positions at the periphery of the cell array which do not have associated I/O pads. Available external signals include data bus, address bus, mode, read/write, chip enable, chip select, reset, and force high impedance (FHZ).

Advantageously, a circuit implemented on the FPGA detects external reads and writes to the control memory, and automatically clocks itself to process an input value or produce the next output value.

According to yet a further aspect of the present invention there is provided an FPGA in which circuits are implementable as one or more replaceable blocks, configuration data for each potential configuration of each replaceable block being storable in memory, the replaceable blocks being selected from a hierarchical selection of blocks with associated bounding box sizes, the blocks being replaceable by alternative configurations having the same bounding box and I/O signals appearing at the same point on the block periphery.

These and other aspects will become apparent from the following description when taken in combination with the accompanying drawings.

BRIEF DESCRIPTION OF THE DRAWINGS

FIG. 26a depicts a preferred input/output architecture arrangement for each pad used with the FPGA of the present invention;

FIG. 26b is a table of the various I/O block modes for the architecture shown in FIG. 26a;

FIG. 26c shows an example circuit in which a global signal can be taken from several sources by a user programmable multiplexer.

FIG. 26d shows a schematic diagram of a switch used in the input/output architecture of FIG. 26a.

FIG. 29 is a table depicting the address bus format for use with FPGA implemented by an embodiment of the CAL II architecture having 4096 cells;

FIG. 30 is a table depicting the area of the control store which is selected by using particular mode values;

FIG. 31a is a table showing the cell routing mode in which bytes read from and written to the control store have the format depicted in the table;

FIG. 31b is a table illustrating the cell function mode showing the byte read from and written to the control store in a particular format;

FIGS. 32a, 32b, and 32c illustrate rows which are addressed by three different combinations of a row address and a wildcard register value;

FIG. 33a, 33b and 33c show the wildcard mask and shift register addressing circuits implemented with a standard address decoder;

FIG. 34a is a schematic block diagram of a mask register and alignment unit for use with a wildcard register for use with read cycles;

FIG. 34b is a schematic diagram of the internal layout of one of the switches of the mask register shown in FIG. 34a;

FIG. 34c is a table of state information which depicts bits presented in a right justified form on the external interface following a shift/mask operation;

FIG. 35 depicts a table showing the state access bits retrieved in an example access using the separation register technique;

FIG. 36a shows an alternative structure to that of FIG. 34a;

DETAILED DESCRIPTION OF SOME PREFERRED EMBODIMENTS

Figure 1:
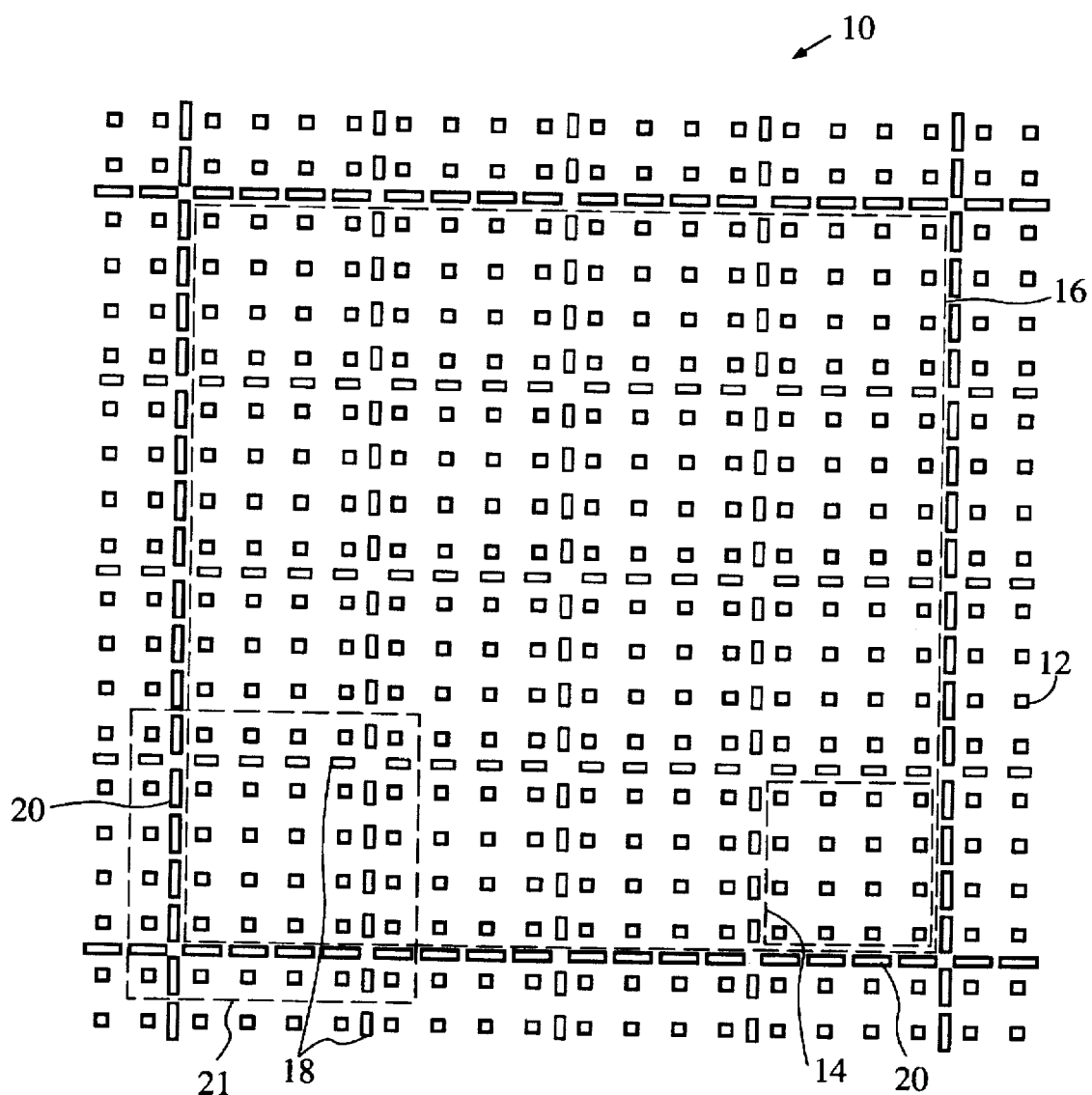
FIG. 1 is an enlarged plan view of a representative area of an FPGA in accordance with a preferred embodiment of the invention, showing the spatial 2-dimensional relationship between individual cells and switches, the representative relevant area having 16 cells×16 cells.

FIG. 1 depicts an enlarged plan view of part of an FPGA 10 in accordance with a preferred embodiment of the invention. A plurality of cells 12 are arranged in a 2-dimensional array in orthogonal rows and columns on the chip. Cells 12 are arranged into 4-cell×4-cell blocks 14, and the 4-cell×4-cell blocks are arranged into a 16-cell×16-cell block 16. Cell block 14 is defined by routing switches 18 and 20 at its cell boundaries. Another block 14 can be defined by routing switches 18 at all boundaries. It will be seen from FIG. 1 that there are two types of such routing switches: routing switches 18 which form a boundary between 4-cell× 4-cell blocks, and routing switches 20 which form the boundary between 16-cell×16-cell blocks. The routing switches 18 and 20 provide connections between various wires and cells 12. The structure and function of these different types of routing switches will be disclosed in detail later.

Figure 2:
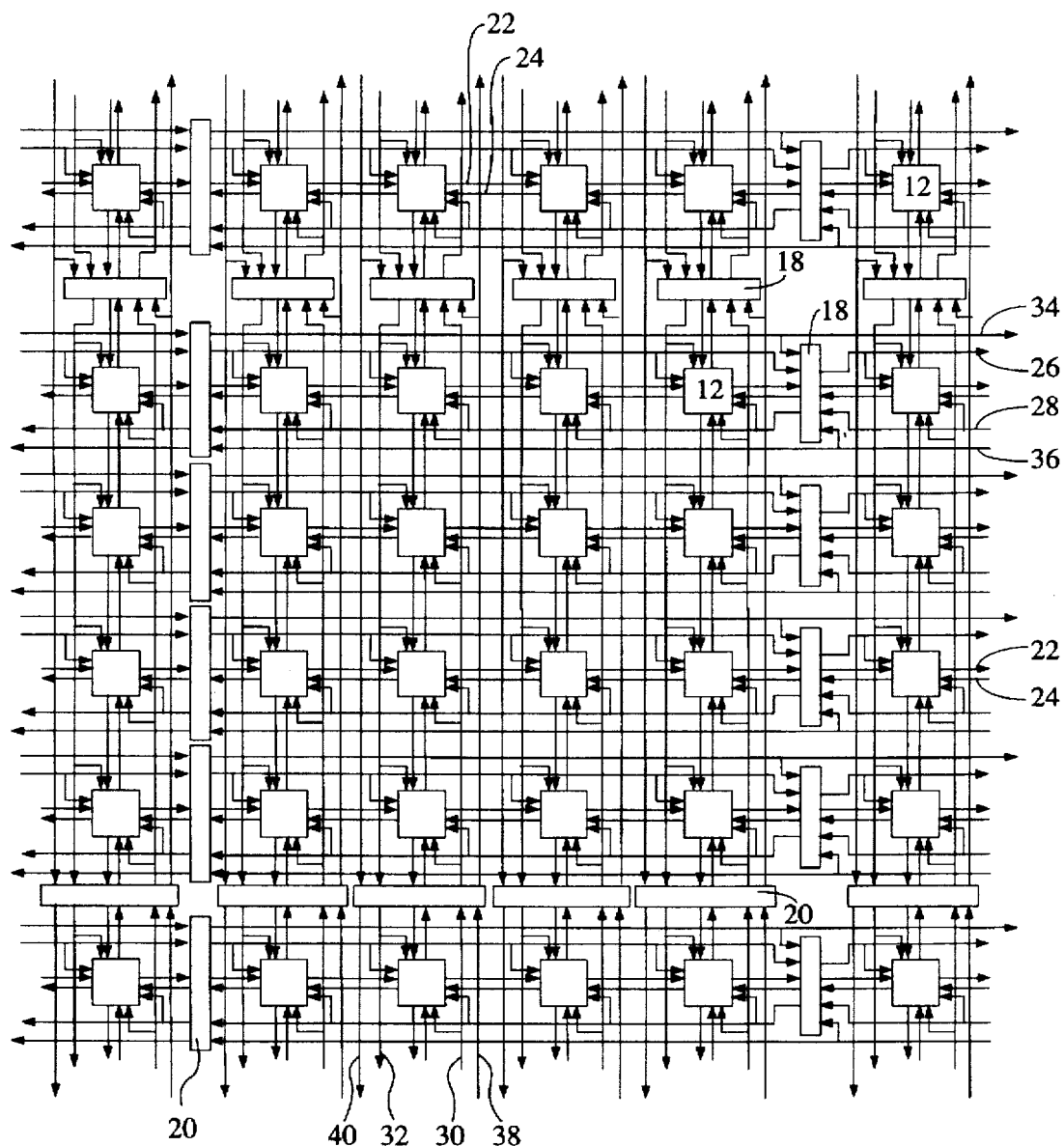
FIG. 2 is an enlarged portion in more detail of the area indicated in broken outline of FIG. 1 showing the routing paths between the cells and the switches in the representative area.
Figure 3:
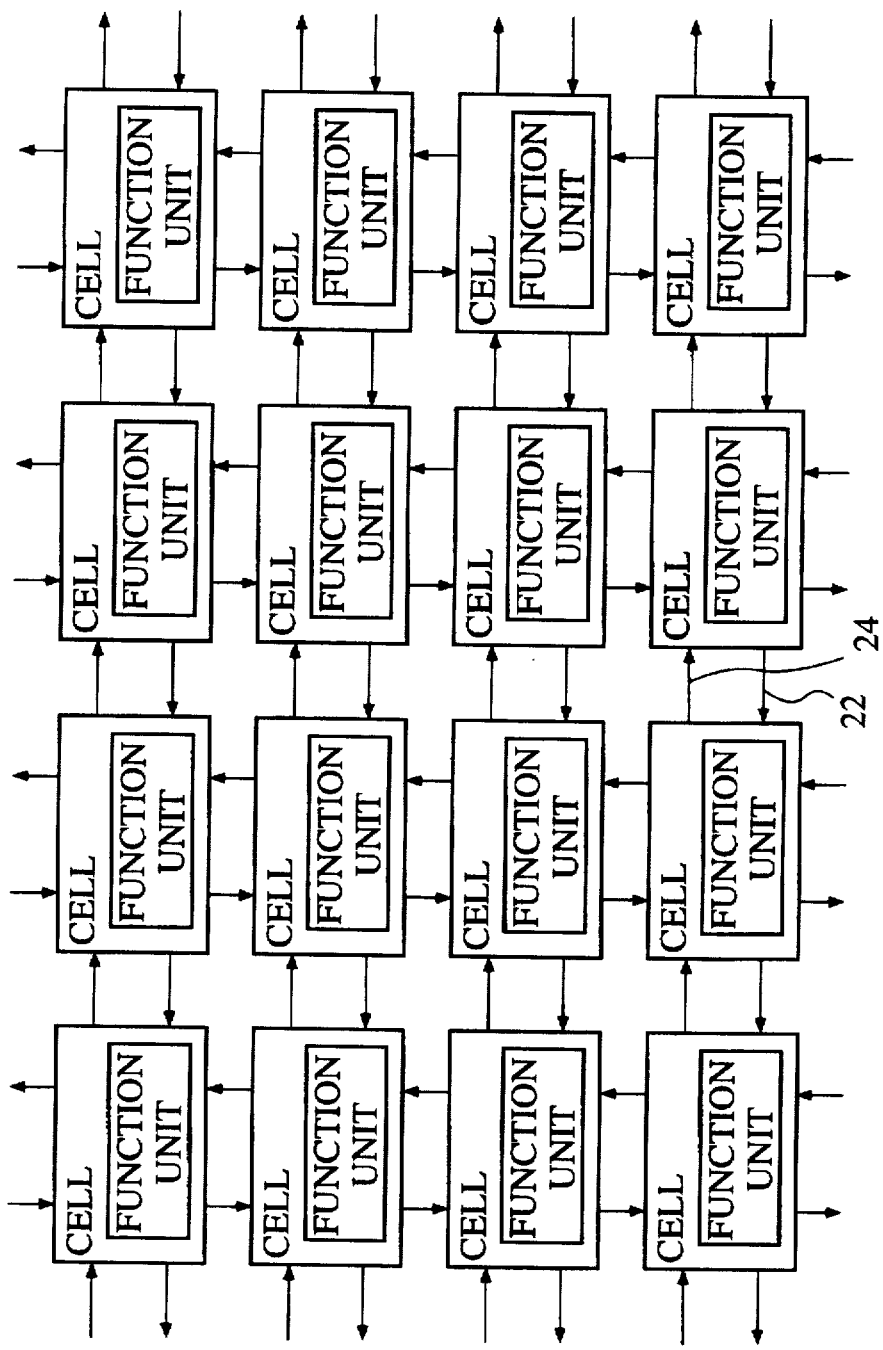
FIG. 3 is a schematic block diagram of the representative area shown in FIG. 1 at its basic routing level, that is with neighbour interconnects only.
Figure 4:
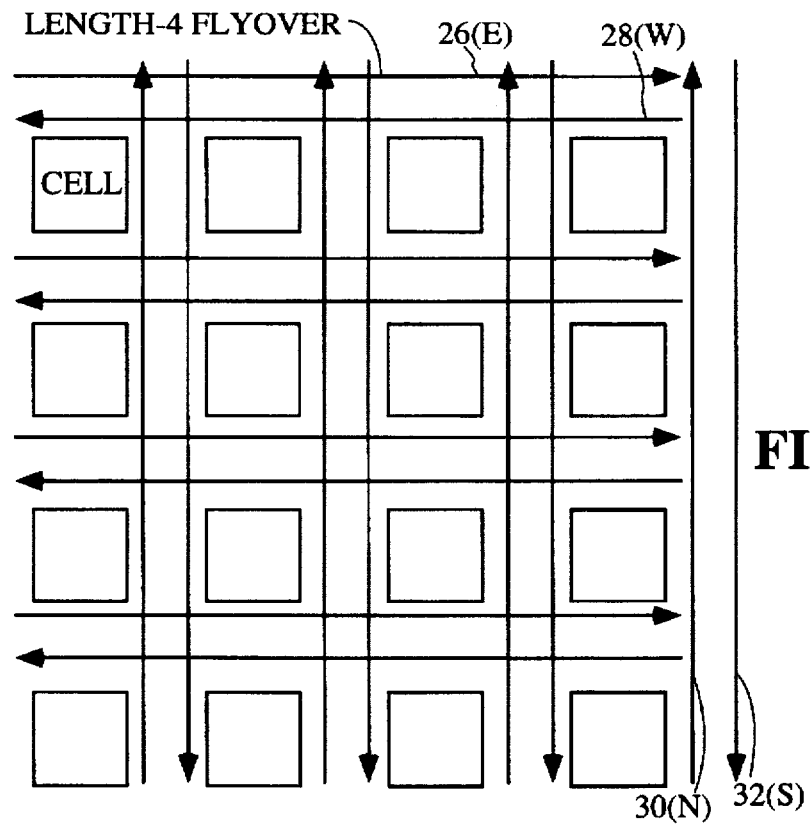
FIG. 4 depicts the array structure shown in FIG. 1, with the neighbour interconnects omitted in the interest of clarity, and with additional first level routing flyovers for a 4-cell×4-cell block.

FIG. 2 depicts an enlarged portion of the area 21 shown in broken outline in FIG. 1 with all the routing resources shown. As will be explained with reference to FIGS. 2, 3, 4 and 5, there are three main ways by which cells may be connected to each other. As best seen in FIG. 3, at the first level neighbouring cells are interconnected to each other by neighbour interconnects 22 and 24. This is the structure of the above mentioned CAL I array. As shown in FIGS. 2 and 4, in each 4×4 block 14, additional wires or conductors 26, 28, 30, and 32, hereafter referred to as length-4 flyovers, are routed between the neighbour interconnections. For each row or column having 4 cells there are two length-4 flyovers. In FIG. 4, each pair of flyovers for each row or column of cells is shown on one side of the cells, whereas in FIG. 2 the flyovers are located on either side of a row or column of cells. In the top-most row of cells shown in FIGS. 2 and 4 in cell block 14, length-4 flyovers 26 and 28 are provided. Length-4 flyover 26 conducts signals in the East direction and length-4 flyover 28 conducts signals in the West direction. Vertical flyovers 30 (North) and 32 (South) are provided for each column of 4 cells×4 cells so that each cell 12 in the 4×4 array not only has neighbour interconnects 22, 24 but can also interconnect to any of the length-4 flyovers 26, 28, 30 and 32. From FIG. 2 it will be seen that horizontally arranged flyovers 26 (E) and 28 (W) are interconnected between switches 18 and 20 as are vertical flyovers 30 (N) and 32 (S).

Each 4×4 block of cells 14 with the length-4 flyovers shown in FIGS. 2 and 4 can itself be considered as being a repeatable cell. One can form an array of these cells each of which communicates with its near neighbours as in FIG. 4. At each position in this array there are two length-4 wires and two length-1 wires, the pair passing to the neighbouring cell in opposite directions. Thus, this array of 4-cell×4-cell blocks has four directed wires for providing output to its nearest neighbours, four wires for receiving signals from its four neighbors, and four wires for receiving input from the length-4 wires directed in the four directions.

Figure 5:
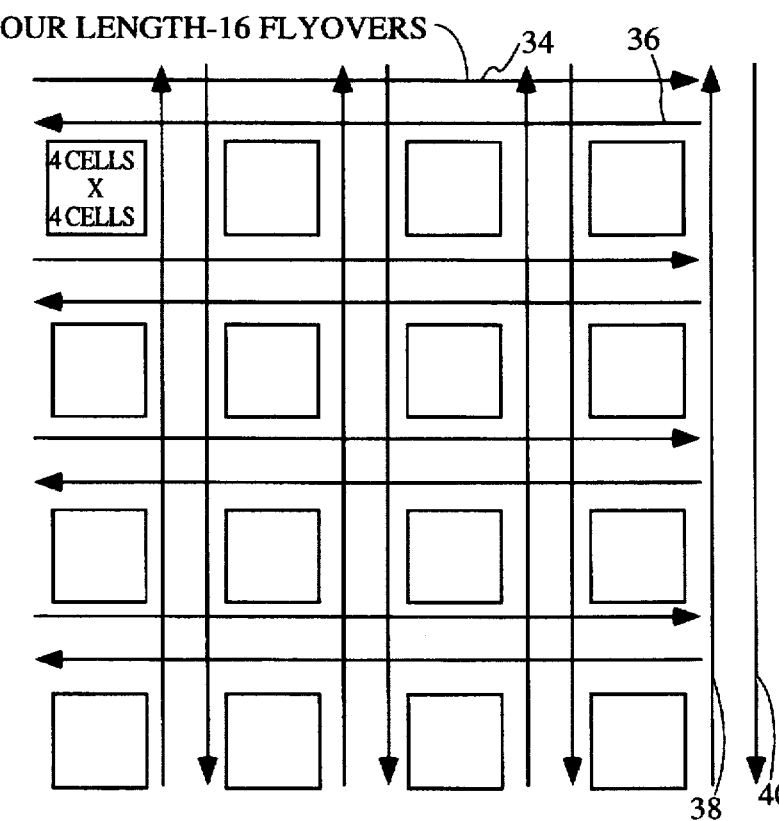
FIG. 5 is a view similar to FIG. 4 but with the length-4 flyovers omitted, and shows the routing flyover arrangement for the entire 16-cell×16-cell block of FIG. 1 and depicts length-16 flyovers only.

In the same way, for a 16×16 array length-16 wires 34, 36, 38, and 40 can be added in the same way as the length-4 wires, as is shown in FIGS. 2 and 5. Although FIG. 2 represents only a part of the 16×16 array shown in FIG. 1, it includes the length-16 flyovers 34, 36, 38, and 40. These length-16 flyovers are both horizontal and vertical. An illustration of this is best seen in FIG. 5 of the drawings, which depicts 4-cell×4-cell blocks and is at a higher level than the arrangement shown in FIG. 4. Since each block includes four rows of cells and four columns of cells, there are four East length-16 flyovers 34 for each row of blocks, one length-16 flyover for connecting each row of cells in the block. The same is true for the West, North, and South length-16 flyovers. From FIG. 2 it will be seen that the horizontal and vertical length-16 flyovers 34, 36, 38, and 40 are inputs and outputs of the larger boundary switches 20 and inputs to the smaller 4-cell×4-cell boundary switches 18. There is no direct connection from any of the length-16 flyovers to an individual cell 12.

It is clear that this process can be repeated with the larger switches 20 of the 16-cell×16-cell blocks. For the 16-cell× 16-cell blocks, in switches 20, three wires are provided in each direction, 3 exiting East, 3 exiting West, 3 entering East, and 3 entering West, for example. The next step would be 64×64 cell blocks in which switches not shown would have 4 connections in each direction between neighbouring blocks. The arrangement described above defines a hierarchical cellular array built on top of the simple array shown in FIG. 3, with a variety of routing resources whose lengths scale by a factor of 4 each level of the hierarchy. If the level of the hierarchical array is represented as L, with L=0 for the cellular array shown in FIG. 3 (neighbour interconnections only), and the scale factor applied to the array at each stage of the hierarchy is represented as S, which in this example is 4, the flyover wire lengths and the array block sizes (the side length of the blocks) in basic cells for a given hierarchical level are given by S to the power L. For example, $4^0=1$ for the neighbour interconnect array. Except for the highest-level switches, there will be 2L+1 wires in each direction for a total of 2(2L+1) wires between blocks on a level L boundary switch. At the highest level, the switch does not have wires connecting to a higher level, so there are 2(2L) wires entering or exiting that boundary switch. Normally, the width and height of an FPGA chip in cell units will be an integer multiple of $S^L$, where L is the highest level of interconnect. Note that for S=4, the maximum number of levels=$\log_4$ chip width, assuming chip width is equal to chip height, but it may be convenient to provide fewer levels. It should also be clear that while S=4 appears to be particularly attractive for the scale factor, other values can be used, for example, S=2, S=3, S=5, and S=8. It will also be appreciated that the process of hierarchical scaling can be applied to base cells with different connections or can be started with a cluster of cells representing the basic repeating unit at level 0, i.e. the arrangement as shown in FIG. 3.

Figure 6:
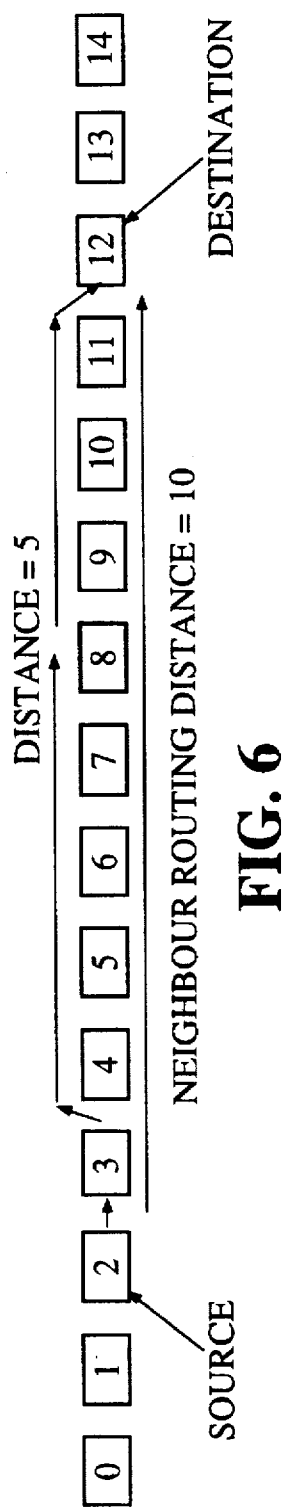
FIG. 6 is a schematic diagram showing a row of cells and how a signal may be passed along the line of cells using the neighbour connect and the length-4 flyover arrangement shown in FIGS. 3 and 4.
Figure 7:
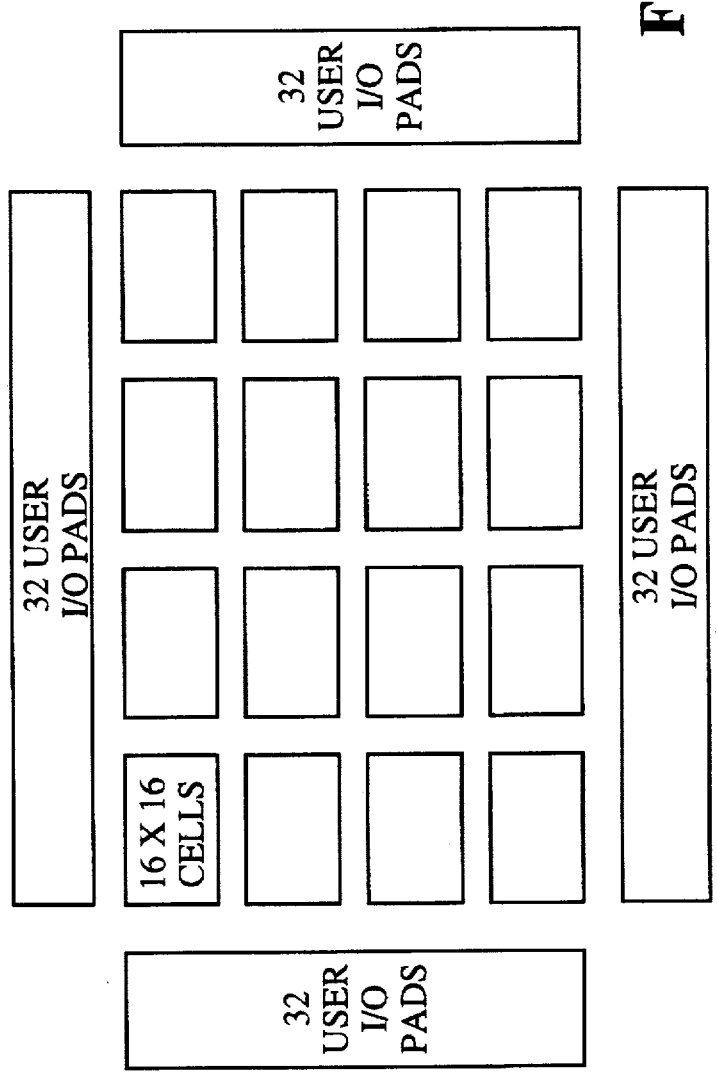
FIG. 7 is a schematic diagram of a 64×64 cell array which embodies the CAL II architecture, showing the I/O units along the perimeter of the chip.

The provision of different levels of routing resources allows the number of segments required to route point to point (cell to cell) on the FPGA array to be minimised. If a straight line path is considered between two points or cells on the array with neighbour connect only, then the number of routing segments would equal the number of cells between the two points. In contrast, as best seen in FIG. 6, the hierarchical interconnect results in the number of segments being proportional to the logarithm of the distance between the origin or source and destination cells (plus a few local segments). For example, for a source at cell 2 travelling to cell 12 via cell 3, the effective distance via flyovers on the hierarchical routing arrangement is 5, whereas the neighbour cell routing distance is 10. FIG. 7 shows the 64-cell×64-cell structure of a chip which embodies the CAL II architecture. Note that length-64 flyovers (level 3) are not provided since with only a single 64-cell×64-cell block they do not provide a significant reduction in routing delays.

With the CAL II structure all the wires in the array are directed, and have a single source. Therefore, 3-state drivers are not used. In addition, it will be understood that in the array the connections are completely symmetrical, that is to say that if the array is rotated or reflected, the structure remains unchanged. Both these properties provide considerable advantage. Firstly, multiple-source wires, although allowing additional flexibility, can result in a considerable area overhead, and experience contention where different drivers attempt to place opposite values onto the wire. Contention causes heavy power dissipation and can result in device failure. This is prevented by the single source arrangement of CAL II. Secondly, symmetry of the array simplifies the CAD software which maps user designs onto the array and allows hierarchical blocks of those designs to be rotated or reflected in order to provide better utilisation of the array. It will be understood however that the principle of hierarchical scaling can be successfully applied to arrays which are not symmetrical. It should also be understood that although the previous discussion referred only to single wires, the hierarchical scaling technique is equally applicable where wires are replaced by multi-bit buses running between the blocks.

Figure 8:
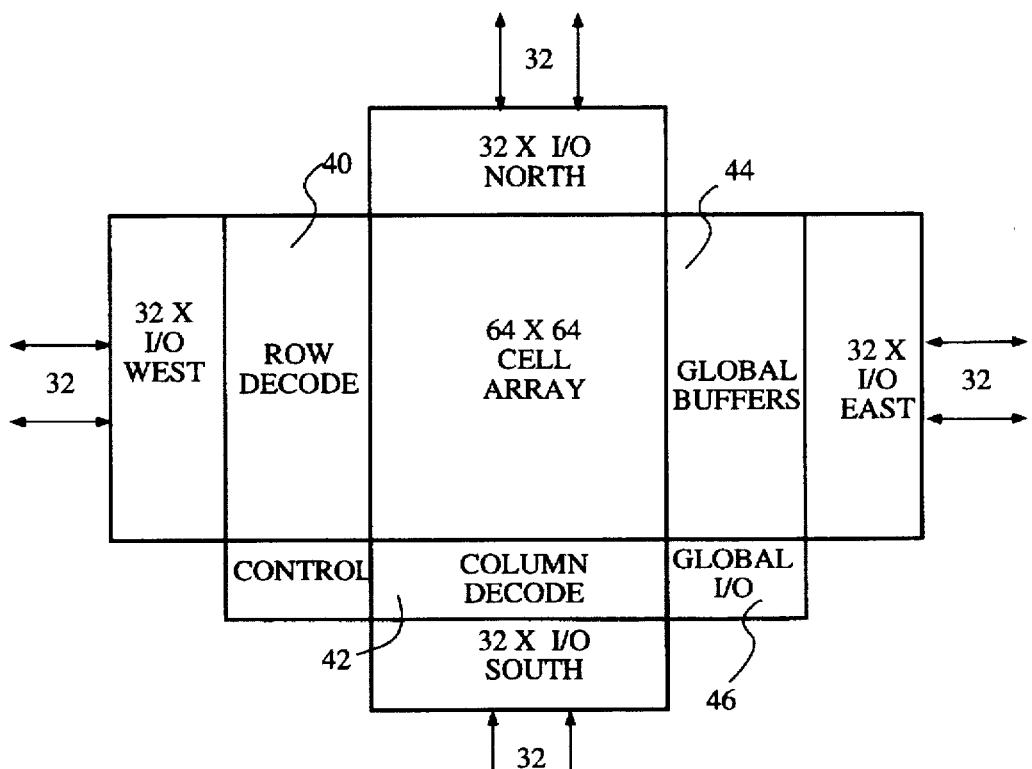
FIG. 8 is a block diagram of the above device showing the row and column decode units, control and global I/O units and global buffers of this embodiment of the CAL II architecture device.

FIG. 8 depicts a block diagram of a 64×64 CAL II array. FIG. 8 is essentially a floor plan of the array and demonstrates that there are a row decoder 40 and column decoder 42 for addressing the RAM control store and a total of 128 I/O lines. In addition, there are buffers 44 for global signals and a global I/O 46 associated with the global buffers. There are 15 address and 32 data lines as well as the 128 I/O lines. In addition, there are four global inputs G1 to G4, a reset input and an FHZ input which forces all user outputs to a high impedance state.

Figure 9:
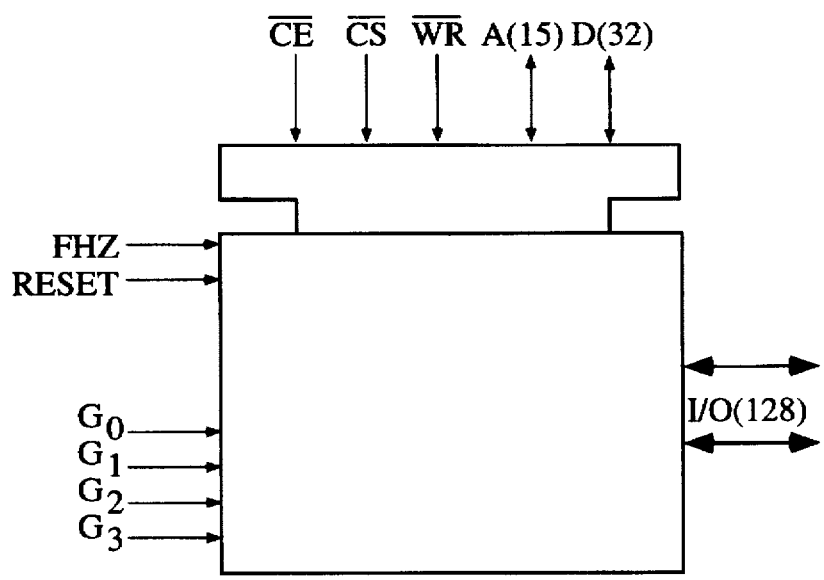
FIG. 9 is a logic symbol for the CAL II array shown in FIG. 8 used in schematic diagrams of systems containing the above embodiment of the CAL II architecture.

FIG. 9 is a logic symbol for the CAL II array shown in FIG. 8 and depicts the programming interface for static RAM using chip enable $\overline{CE}$, chip select, $\overline{CS}$ and read/write $\overline{WR}$ control signals. The $\overline{CE}$ signal starts the programming mode, and normally it will be fed to all chips in a large array. The $\overline{CS}$ signal may be used to address a single chip in an array of chips such as the 4096 cell embodiment of the CAL II architecture, and read or write data to the addressed chip. Timing on these signals is compatible with common SRAM parts such as the HM 628128 (Hitachi) with a 50 ns cycle time. The SRAM programming interface is supplemented by additional hardware resources designed to minimise the number of processor cycles required for reconfiguration. These resources are initially inactive so that the device looks exactly like an SRAM on power-up.

Figure 10:
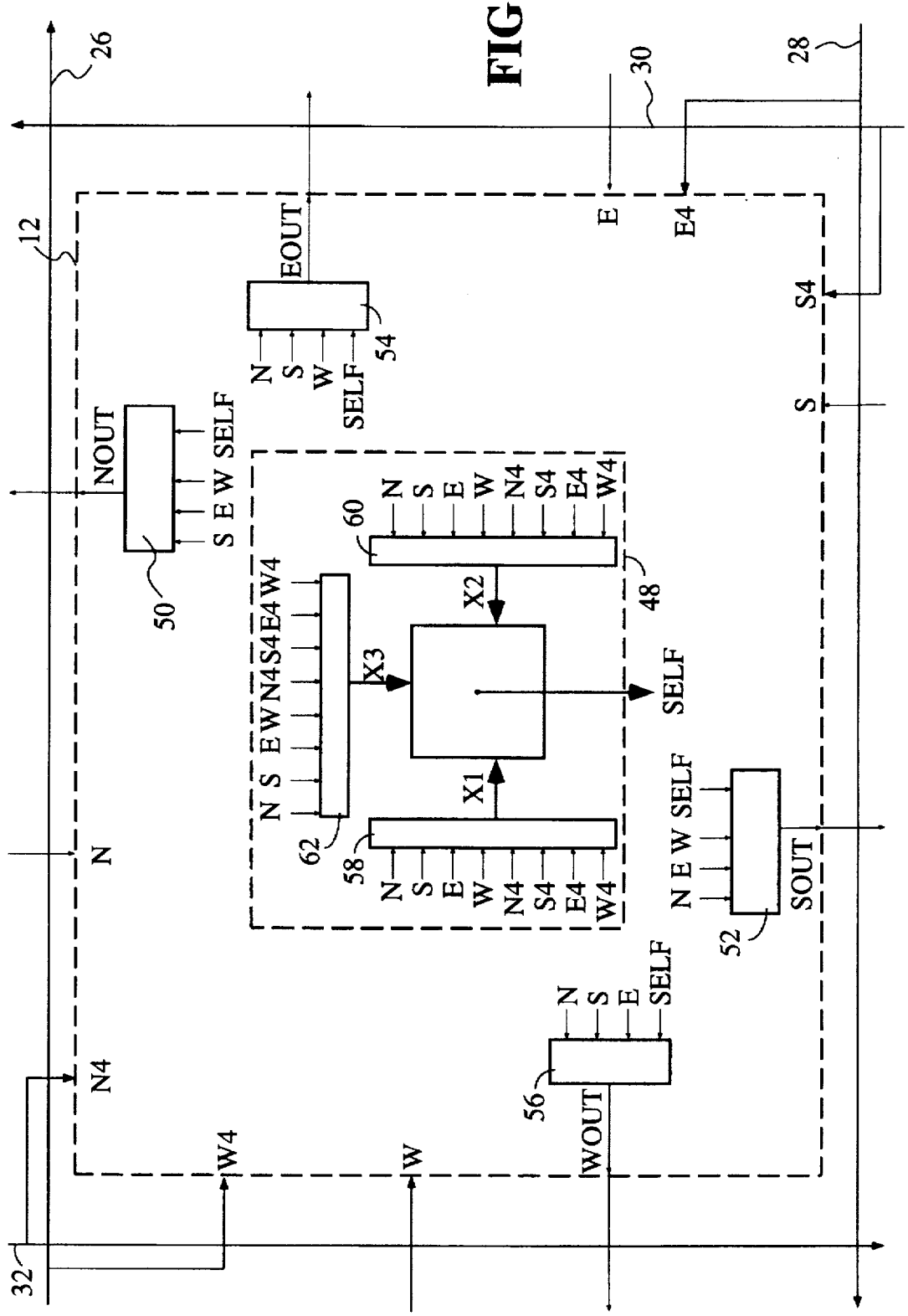
FIG. 10 is an enlarged schematic diagram of one of the cells shown in the representative area of FIG. 2.

FIG. 10 is an enlarged schematic view of one of the cells 12 of the FPGA shown in FIGS. 1 and 2. Firstly, the cell 12 is shown as having 8 neighbour interconnects; 2 to each designated North, South, East and West cell. In addition, cell 12 is also connected to the East and West flyovers 26 and 28 and the North and South flyovers 30 and 32 respectively. Within cell 12 is a function unit 48, and also within cell 12 are various switches 50, 52, 54 and 56 for receiving signals from the respective neighbour interconnects. The SELF output of function unit 48 can be connected to lines Nout, Sout, Eout, and Wout through multiplexers 50, 52, 54, and 56, respectively. Also, in cell 12, function unit 48 receives input from three multiplexer switches 58, 60 and 62, which receive inputs from neighbouring cells and flyovers and which generate three outputs, X1, X2 and X3, respectively.

Figure 11:
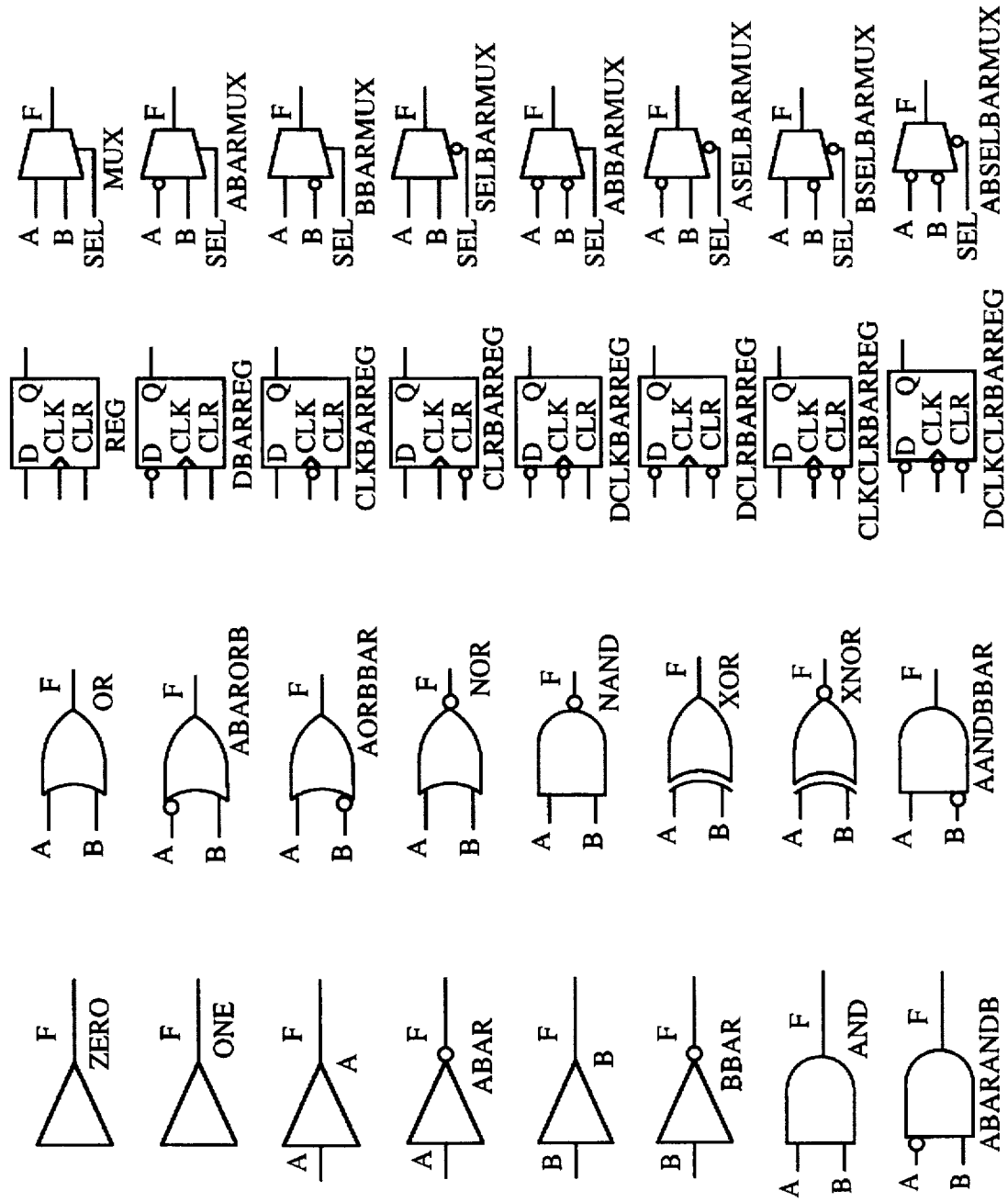
FIG. 11 shows functions implementable by function unit 48 of the cell shown in FIG. 10.

Function unit 48, one of which is present in each cell 12, is capable of implementing any combinational function of two boolean variables, A and B. Additionally, function unit 48 can implement one of several three-input functions, namely a two-to-one multiplexer with true or inverted inputs or a D-type edge triggered flip-flop with true or inverted clock, data and reset inputs. These functions are illustrated in FIG. 11.

As indicated above, each cell 12 has four neighbour inputs and four inputs from flyovers. From FIG. 10 it will be seen that any neighbour input can be connected to any of the function unit inputs X1, X2 and X3 via multiplexers 58, 60, and 62, and then to the cell neighbour outputs Nout, Sour, Eout, and Wout via programmable multiplexers 50, 52, 54, and 56. The cell function unit output is available to an external device by reading a bit in the control store. This allows applications to read results from CAL II computations. In addition, register values within circuits implemented on the array can be set by writing to the control store. Vertically adjacent cells have state access bits connected to adjacent bit lines in the RAM. This allows registers of the user's design implemented in the CAL II array to be read and written 8, 16, or more bits at a time according to the selected width of the data bus. Thus, it will be appreciated that the CAL II array architecture effectively supports the "active-memory" model of computation in which operands can be written to memory locations and results read from memory locations.

Figure 12:
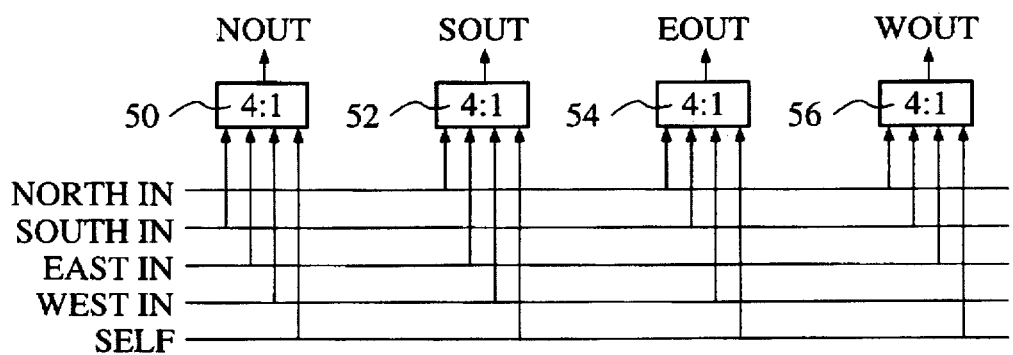
FIG. 12 is another representation of output elements 50, 52, 54, and 56 of in FIG. 10.
Figure 13:
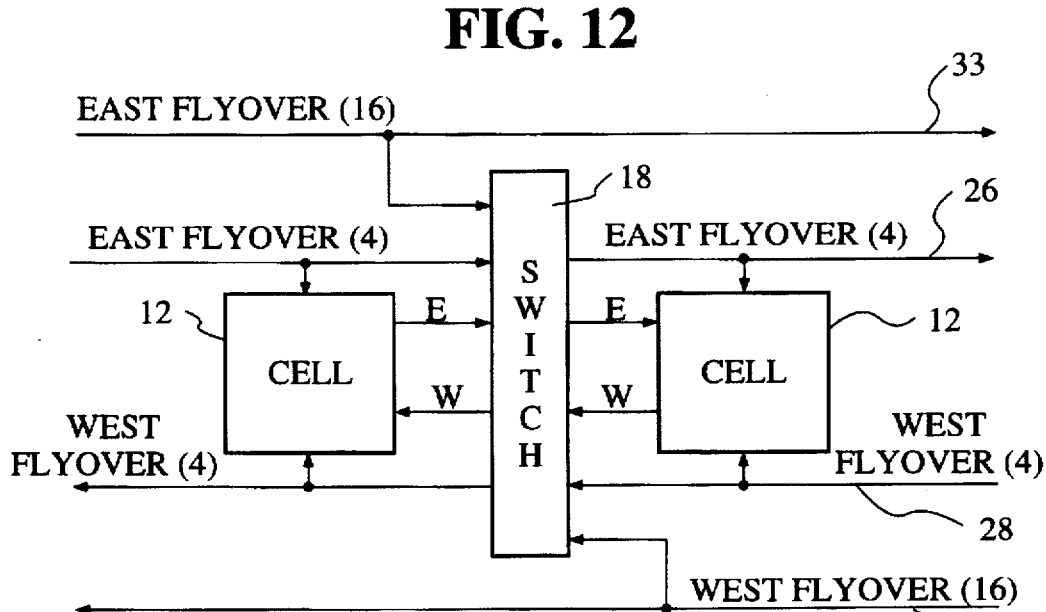
FIG. 13 is a schematic diagram of a switch at a 4-cell boundary showing the interconnections to the switch.

The routing associated with a cell is best described with reference to FIGS. 12, 13 and 14 of the accompanying drawings. FIG. 12 shows the basic routing resources provided in cell 12, as shown in FIG. 10. The designation "SELF" refers to the output of function unit 48, which implements the logical operations required by the design. It will therefore be seen that within the cell the routing requires four 4:1 multiplexers 50, 52, 54 and 56 respectively for routing the signals into Nout, Sout, Eout, and Wout respectively. Each of those multiplexers receives the SELF signal from function unit 48 and therefore each multiplexer can route signals from one of the other three directions, that is for multiplexer 56 (Wout), output can come from either North, South, East or SELF. Likewise, the other multiplexers can select from the various other inputs to provide the respective output. The implementation of these multiplexers in CMOS technology is disclosed in U.S. Pat. No. 5,243,238 (the CAL I patent); all the other multiplexers in the array can be implemented using this technique.

At the next level in the hierarchy, that is, at the junction of the 4-cell×4-cell blocks, another switching function must be provided. This is best seen in FIG. 13, which depicts a switch 18. FIG. 13 shows the potential inputs and outputs of switch 18. Switch 18 handles only the horizontal East/West going signals, but the switches for the vertical signals are identical. Switch 18 has six inputs; two inputs from cells 12, two inputs from the length-4 East and West flyovers and two inputs from the East and West length-16 flyovers. Because the 4×4 boundaries occur at the same position in the array as neighbour boundaries, it is advantageous for switch 18 to include the direct neighbour connections as well as additional connections to longer wires. Including both neighbour and longer wires allows a design which uses only neighbour connections to be mapped onto the hierarchical array without using additional switching units. In general, the outputs of a switch at level 'L' in the array will be a 'superset' of (that is, will include) outputs of a switch at level 'L–1'. As is seen in FIG. 13, it is also convenient to connect the longer length-16 wires into switch 18, which serves lower hierarchical levels. In a larger array using higher levels of hierarchy, length-64 or longer wires may also be provided as inputs to the switch. However, to preserve the hierarchy for switches at 4-cell boundaries, the only outputs are length-1 (neighbour) and length-4 signals.

Figure 14:
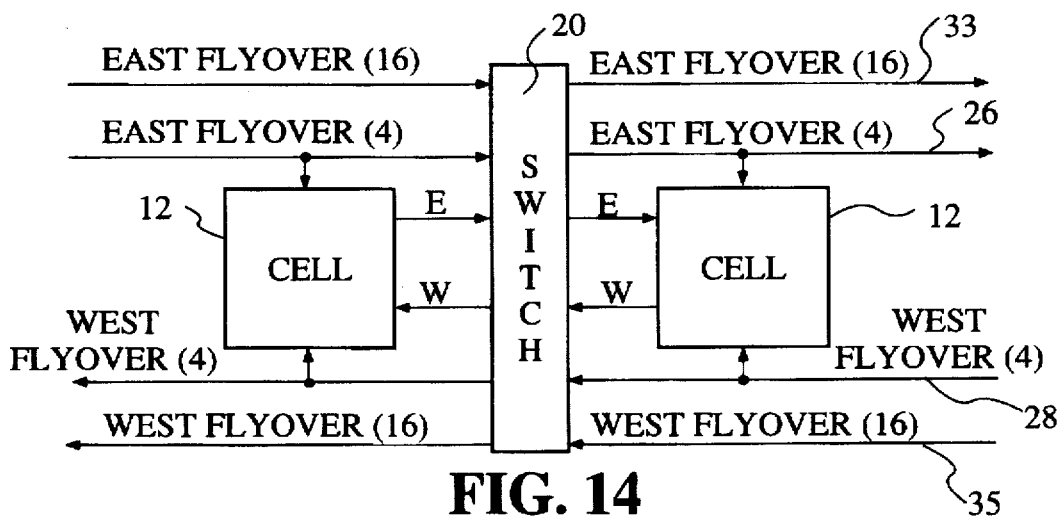
FIG. 14 is a schematic diagram of a switch at a 16-cell boundary showing the interconnections to the switch.

FIG. 14 depicts the inputs and outputs of the switching function on a switch 20 located at the boundaries of the 16-cell×16-cell blocks (see FIGS. 1 and 2). Because 16×16 boundaries also occur at 4×4 cell boundaries, then in order to preserve the hierarchy and regularity of the array, the 16-cell boundary switches are arranged to offer all the routing permutations of the 4-cell boundary switches, but also offer additional options related to the length-16 wires. This is illustrated by the arrangement shown in FIG. 14. In FIG. 14, the hierarchy stops at 16×16 blocks and there are no length-64 wires. However, in a larger embodiment, switches using longer wires can be provided.

Figure 15:
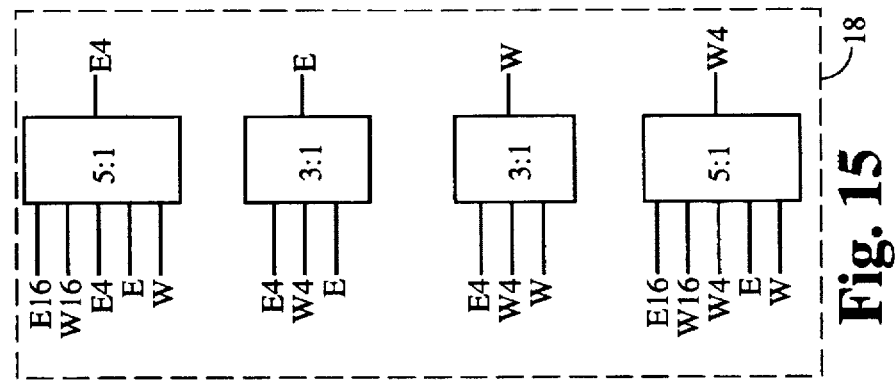
FIG. 15 is a schematic layout of a switching function for use at 4-cell boundaries.

FIG. 15 depicts a preferred switching function for use at 4-cell boundaries. East, West, North and South are the same since the switches are symmetrical, and therefore only the East and West switching functions are shown. Switch 18 has two 3:1 multiplexers (that is for the East and West cells) and two 5:1 multiplexers for the East flyover (4) and West flyover (4). With reference to FIGS. 1 and 2, it is clear that the switch 18 exists physically at the East/West boundary between blocks. There is a similar switch at the edge of the array to handle connections to the I/O pads, as will be later described with reference to FIG. 26a.

Figure 16:
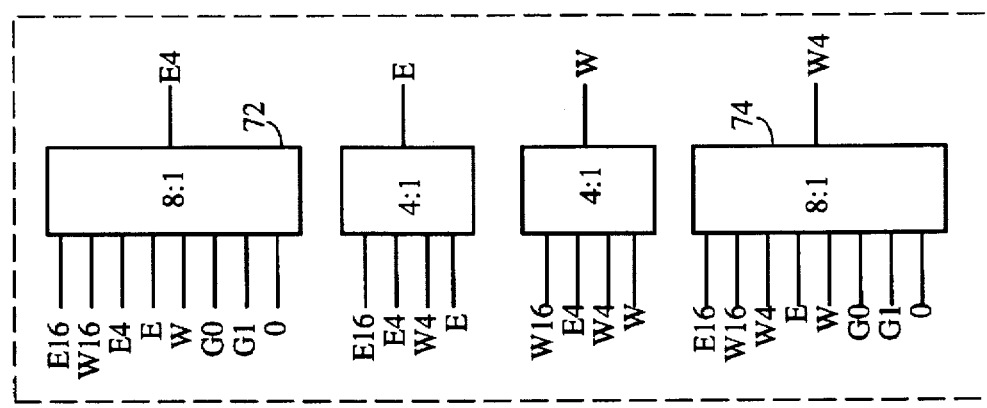
FIG. 16 is similar to FIG. 15 and depicts an extended switching function for use at 4-cell boundaries with global signals and connections to programming bit signals.

FIG. 16 depicts a switching function similar to that shown in FIG. 15 but which accommodates global signals. Switch 18a of FIG. 16 has multiplexers for driving the East and West cells which are the same as those shown in FIG. 12. However, 8:1 multiplexers 72, 74 receive inputs from the neighbouring East and West cells, the length-4 East and West flyovers, the length-16 East and West flyovers, and additionally three inputs from horizontal global signals G1 and G2, and a constant 0 signal. Although not shown in the interests of clarity, it will be appreciated that a corresponding switch used for vertical signals will have two vertical global signals G3, G4. Otherwise, switch 18a for the vertical signals will be the same as the horizontal switch 18a. 8:1 multiplexers are preferred so as to allow a straightforward implementation using three RAM-controlled pass transistors. However, in an embodiment in which additional multiplexer inputs are acceptable, four global signals G1, G2, G3, and G4 will all be provided as multiplexer inputs to the flyover multiplexer.

It is also desirable that routing delays from one cell to a neighbouring cell across 4-cell and 16-cell boundary switches should be negligible and, consequently, to achieve this the number of sources (inputs) to the multiplexers which connect neighbouring cells must be minimised.

Figure 17:
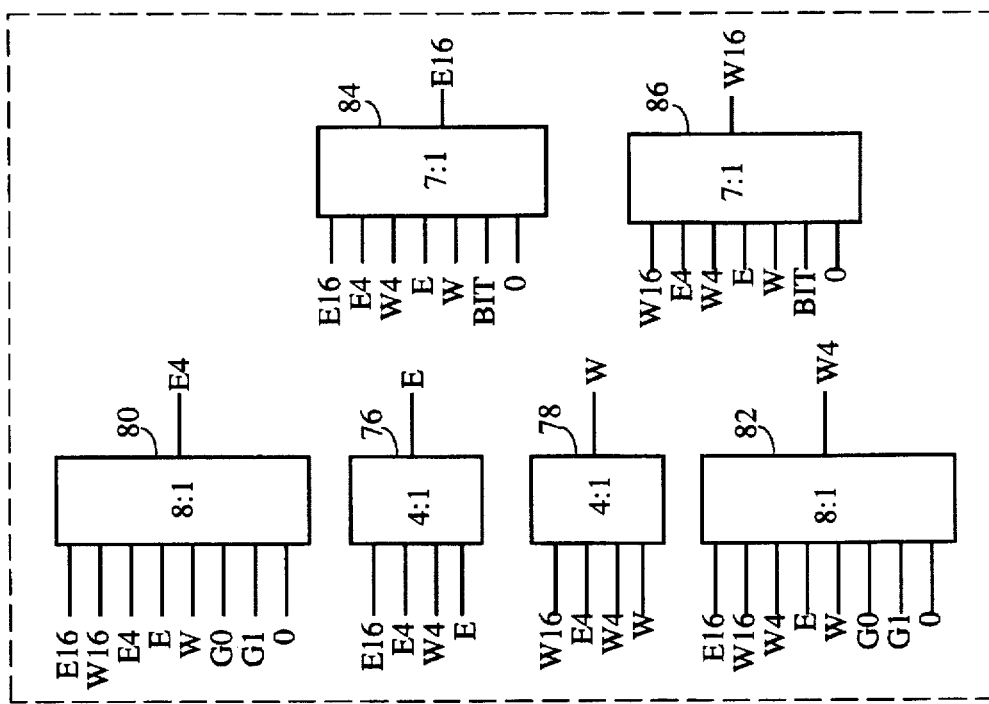
FIG. 17 is a similar schematic diagram but for a preferred switching function for use at 16-cell boundaries.

FIG. 17 depicts switch 20 located at a 16×16 cell boundary. As before, only a switch 20 for an East/West direction is shown, but it will be appreciated that a similar switch 20 is necessary for signal conductors in the North/South direction because of symmetry. Switch 20 includes six multiplexers: two 4:1 multiplexers 76 and 78 for driving neighbour wires, two 8:1 multiplexers 80, 82 for driving length-4 flyovers, and two 7:1 multiplexers 84 and 86 for driving length-16 flyovers. The 8:1 and 7:1 multiplexers also receive inputs from the length-4 and length-16 flyovers. In addition to the length-4 switches of the form of FIG. 16, switch 20 includes additional connections for the corresponding multiplexers for driving the length-16 flyovers. In FIG. 17, the BIT signals in multiplexers 84 and 86 are from the RAM bit line. Corresponding North/South switches have a WORD line from the RAM, instead of the BIT line in multiplexers 84 and 86.

The switches shown in FIGS. 15 through 17 and described above for the 4-cell×4-cell and 16-cell×16-cell boundaries can be extended for use in larger arrays if required. An appropriate rule for deciding what is connected to each multiplexer in a switch is that a multiplexer outputting a signal at level L in the hierarchy should have inputs from 1) signals going in the same and opposite directions as the multiplexer output at level L+1 if level L+1 exists, 2) a signal going in the same direction as the multiplexer output at level L, and 3) signals going in the same and opposite directions at levels L−1, L−2, etc. down to level 0.

It should also be appreciated that this is not the only possible rule and that there are a large number of possible switching functions which can be used in a hierarchical array. Many potential modifications to the switches present here will be immediately apparent to those of ordinary skill in the art. One modification is to include provision for 90° turns in the switches by providing inputs from a perpendicular edge (via an additional selector, in conjunction with extra routing resources in the switches themselves, and a different choice of input signals to the multiplexers). Another modification is elimination of the 180° wraparound options (for example, eliminating west neighbour input to east length-4 flyover output).

The additional routing resources provided by the hierarchical FPGA can be used in four separate ways:

1. User Designs at lowest level, FPGA hardware selects longer wires. The user can design using the simple neighbour routing models ignoring the availability of longer connections. Hardware in the FPGA detects when a signal is placed on a series of connections straight through a row or column of cells extending the full length of a flyover, and places the signal on the flyover as well.

2. User Designs at lowest level, CAD software selects longer wires. In this case low level CAD software automatically detects nets in the layout which can benefit from the new routing resources and takes advantage of them to speed up the design. With this methodology the flyover wires will often carry the same signal as the neighbour connect at the same position in the cellular array. Adding redundant wiring of longer lengths is easy for the software, and is independent of the number of levels of routing provided by a given FPGA chip, thus providing design portability between different chips.

3. User Designs at All Levels, FPGA hardware selects longer wires if usable and control store indicates they are unused. In this case the FPGA hardware uses longer wires when appropriate, but some long wires will have already been taken up by the user. In this case the hardware (an extra NOR gate input, see FIG. 18 discussed below) must detect whether the control store bit has marked the longer wire as unused. In one embodiment, an extra bit is provided for the user to disable the automatic long line selection.

4. User Controls Selection of Long Lines. The user can design using a programming model which includes the longer wires, and make explicit assignments to the extra routing resources. In such an embodiment, no automatic selection of long lines by hardware is provided. With this embodiment, CAD software may be selected which optimizes the placement of signals on the various lines in the device.

It is advantageous to use the CAD software to detect places in the completed design where wires can advantageously be transferred to longer routing resources. Such occasions can arise where two sub-units of the user's design which themselves must use shorter connections are placed side by side. Providing redundant wiring, for example on both length-4 and length-16 flyovers increases speed. And substituting a longer wire for four shorter wires increases speed and also frees the shorter wires for other uses.

Hardware Selects Longer Wires

The chip may contain special circuitry which can determine when to use longer routing resources. For example, a logic gate can detect when a path through 4 neighbour interconnects is used and then automatically route the signals through a length-4 flyover. This hardware option provides more portability. If a company produces new "fast" versions of existing chips by adding longer wires and related logic gates to automatically select the longer wires, existing user designs can be implemented on these faster chips without requiring any changes or effort by the user. In addition, the direct hardware selection of the longer routing wires simplifies the CAD software, allowing it to run faster. Chip hardware which automatically selects faster routes is particularly attractive for applications which dynamically reprogram FPGA chips, where a-priori determination of long routing lines is difficult. Automatic selection of long lines is an extension of a technique disclosed in U.S. Pat. No. 5,243,238, where a NOR gate was used in 4:1 multiplexers to detect the state of two RAM cells and output a 0 corresponding to routing "straight through" (for example, North to South) the multiplexer.

Figure 18:
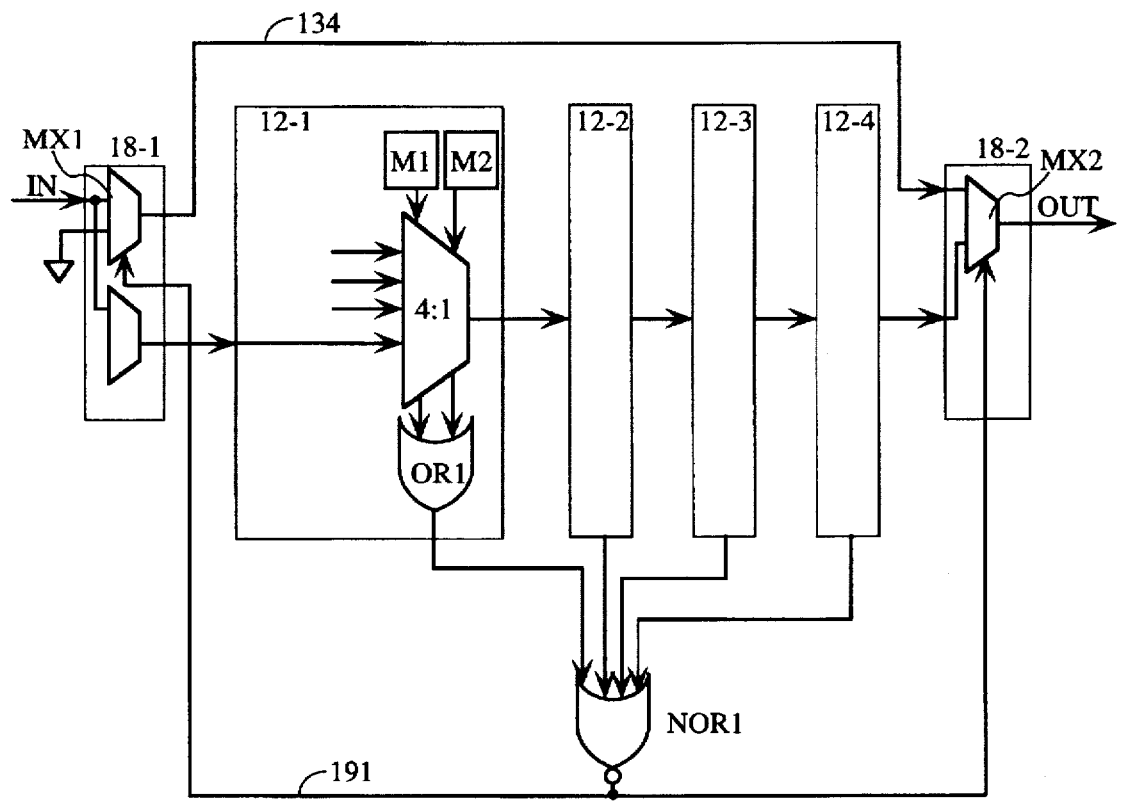
FIG. 18 depicts a NOR gate circuit for automatically moving local signals to a flyover.

FIG. 18 shows a NOR gate circuit which automatically uses a length-4 flyover in response to a user's design which specifies a path through four adjacent neighbour interconnects in a 4×4 block. The portion of cell 12-1 which detects that RAM cells M1 and M2 both carry logic 0, indicating that a signal from the West is to be routed to the East is illustrated. Corresponding portions are present in cells 12-2 through 12-4, but for simplicity are not illustrated. OR gate OR1 outputs a logic 0 only when RAM cells M1 and M2 both carry logic 0. When corresponding RAM cells for controlling logic cells 12-2 through 12-4 all carry logic 0, four logic 0 signals are input to NOR gate NOR1, causing NOR gate NOR1 to output a logic 1. Switches 18-1 and 18-2 show only the circuits which automatically select the length-4 flyover. Multiplexer MX1 located in switch 18-1 is controlled by the logic 1 output of NOR gate NOR1 to place its input signal onto flyover line 134. Multiplexer MX2 in switch 18-2 is controlled to pass the signal on line 134 in response to this logic 1 from NOR gate NOR1. Thus switch 18-2 will provide an output signal OUT faster than if the input signal IN had been routed through cells 12-1 through 12-4.

Figure 19:
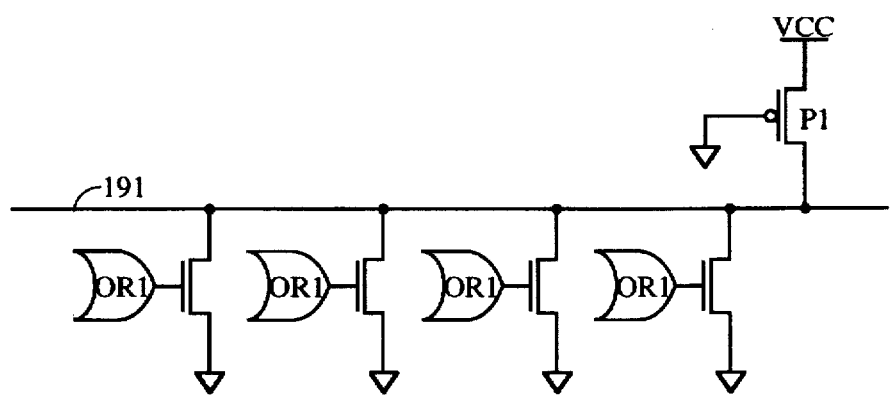
FIG. 19 depicts one implementation of the NOR gate of FIG. 18.

FIG. 19 shows an implementation of NOR gate NOR1 of FIG. 18 available as a single metal wire 191 extending through cells 12-1 through 12-4 into multiplexers MX1 and MX2. The four OR gates OR1 can be physically positioned in their respective cells, so the layout of the NOR gate of FIG. 18 is very compact. The additional NOR gates can be implemented using a standard pull-down technique using an extra wire with transistors which can be pulled down at any one of 4 positions and a p-type device at the end of the wire which acts to pull the wire high in the absence of a pulldown signal. Using several pulldowns and a p-type pullup has the advantage of allowing a distributed layout where the main overhead is a single metal wire routed in parallel with the flyover.

The signal from the 4-input gate NOR1 can be fed to the cells 12-1 through 12-4 so that function unit 48 inputs (see FIG. 10) use the flyover inputs rather than the neighbour interconnects (for example multiplexer 58 can be programmed to select its X1 signal from line W4 instead of line W). In a similar way, the technique can be scaled up so that signals travelling on a group of 4 length-4 flyovers under a length-16 flyover running in the same direction can be detected. This is achieved using a further 4-input gate, e.g. NOR gate, which takes as inputs, the outputs of the four 4-input NOR gates NOR1. The output of this further NOR gate can be fed to switches at both ends of the length-16 flyover to ensure that the faster length-16 flyover path is used for signal routing. This NOR gate output can also be fed to intermediate length-4 flyovers to allow signals to be taken directly from the faster path.

Hardware selection of flyovers is transparent to the user, who obtains the benefit of an automatically faster chip, and results in a simpler programming mode. The technique can be extended straightforwardly to longer wires, i.e. length-64, or length-256 flyovers, for blocks at higher levels of hierarchy. This technique is equally applicable when the flyovers scale by factors other than four. Similar techniques can be used in other areas where a "short-cut" path is provided to supplement routing resources.

User Control of Wire Length

The user can also design using a programming model which includes the longer wires, and make explicit assignments to the extra routing resources. In this case, extra density as well as extra speed is achieved by assigning different nets to the various levels of interconnect at the same point in the cellular array. For example, the CAD software can select a length-16 wire to carry a signal over a sub-unit without disturbing the local interconnect in that sub-unit. With a design style using a programming model which includes the longer wires, and makes explicit assignments to the extra routing resources, blocks of the user design may have to be aligned on 4-cell or 16-cell boundaries in the array. Replacing neighbour wires with longer wires can change timing and power consumption, and these changes may be undesirable to the user. To allow user control of long line replacement, an additional bit is added to the control store, and must be set in order to allow automatic addition of longer wires.

Function Unit 48 of Cell 12, Several Embodiments

Figure 20:
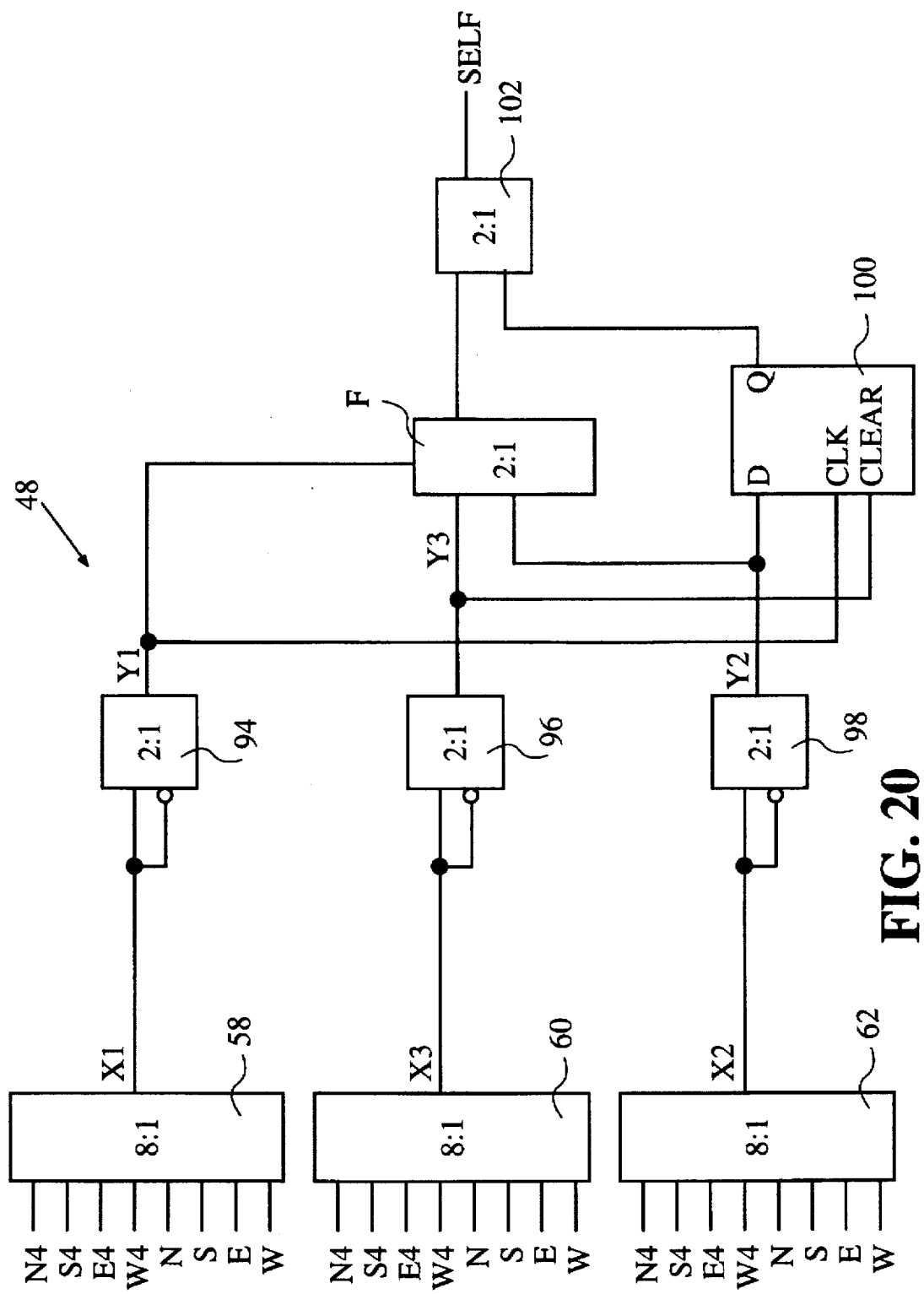
FIG. 20 depicts a first version of a function unit in accordance with the preferred embodiment of the present invention.

FIG. 20 is a schematic block diagram of a multiplexer based function unit capable of implementing the function of the function unit disclosed in the corresponding published PCT Application WO90/11648 (equivalent to U.S. Pat. No. 5,243,238), but with additional functions. Experience with the CAL 1024 chip which implemented the CAL I architecture indicated it would be desirable to include two new cell functions, a 2:1 multiplexer and a D-register with clear. These are both three-input functions. Use of a multiplexer to speed up carry propagation in cellular logic structures is well known in the literature, for example, Fast Carry-Propagation Iterative Networks, Domenico Ferrari, IEEE Transactions on Computers Vol. C17 No. 2, August 1968 and European patent application serial no. 91 304 129.9, owned by Xilinx, Inc., entitled "Logic Structure and Circuit for Fast Carry", published 13 Nov. 1991 under publication no. 0 456 475 A2. The multiplexer function is useful for building adder and counter circuits, and a D register serves many user's expressed preferences for TTL like D-registers instead of latches. Both functions were considered for the original CAL 1024 part. One problem with including three input functions in the CAL 1024 architecture was that only the four neighbour inputs could be selected as function inputs. This meant that for a three input function, inputs had to come from three of the four neighbour directions, which is hard to achieve without using adjacent cells for routing alone. Use of a cell for routing alone reduces density. With the new routing architecture of CAL II, it is attractive to allow the length-4 flyovers to be used as function unit inputs, providing a total of eight possible inputs. The additional flyover routing resources mean that the three input functions can be used and density maintained.

FIG. 20 shows an embodiment of function unit 48 depicted in FIG. 10 which can easily support a 2-input multiplexer and a D-register with clear. Function unit 48 consists of the three 8:1 multiplexers 58, 60, 62 each of which receives eight inputs. The eight inputs are from the four immediately neighbouring cells plus the North (N4), South (S4), East (E4) and West (W4) length-4 flyovers and the multiplexers 58, 60 and 62 provide outputs X1, X3 and X2 respectively. The three outputs, X1, X2 and X3, are fed to 2:1 multiplexers 94, 96 and 98 respectively which provide conditional inversion of X1, X2, and X3. Three further outputs Y1, Y2 and Y3 are created which are fed to a further 2:1 multiplexer F which is controlled by the output of the Y1 multiplexer. It will therefore be appreciated that the function unit 48 is based on the 2:1 multiplexer F which is the only multiplexer in the cell which is controlled by a data signal (output of Y1) rather than by the control store. As well as implementing all boolean function of two variables, the 2:1 multiplexer F can be used directly with true or inverted input variables. As will be later described, the 2:1 multiplexer function is useful in a wide variety of circuits including adder carry chains. FIG. 11 shows the two-input boolean functions and the three-input (two data, one control) multiplexer and three-input D-register functions implemented by FIG. 20. Generating combinational logic functions using 2:1 multiplexer based function units is well known and is disclosed in the CAL I application. Function unit 48 includes a D-type edge triggered flip-flop 100 which allows it to achieve certain logic functions. D-register 100 receives as a clock input the output Y1 from multiplexer 94, as a clear input the output Y3 from from multiplexer 96, and as data input the output 42 from multiplexer 96. In another embodiment, flip-flop 100 may have an enable input connected to Y3 and no clear input. Alternatively, a clear input may be provided and connected to a special global clear signal fed to every cell. The F multiplexer receives these same three signals, as shown in FIG. 20. The output of the F multiplexer and the output (Q) of D-flip-flop 100 are fed to a further 2:1 multiplexer 102, the output of which is designated as the "self" output. The path through multiplexer 98 to the function unit output has been optimised for speed and, where possible, signals on the critical path in the user's logic use this input in preference to X1 or X3.

With the function unit shown in FIG. 20 the three-input function capabilities over the existing CAL 1024 chip function unit are achieved. This is in part due to the symmetry of the inputs to the function unit 48 because any of the neighbour and length-4 flyovers can be selected as sources for each of the function unit inputs as can be seen by inspecting multiplexers 88, 90 and 92. Two drawbacks of this function unit 48 are a relatively large delay caused by the 8:1 multiplexers and the fact that a constant 0 cannot be forced onto the clear input of the register to produce a non-clearable flip-flop. Instead a source for clear input must be found which, for example, can be from a global signal via one of the switch units on the 4×4 cell block boundaries or by using an adjacent cell to form a constant 0. This is a further advantage of having constant 0 as a source for the length-4 flyover wires.

Figure 21:
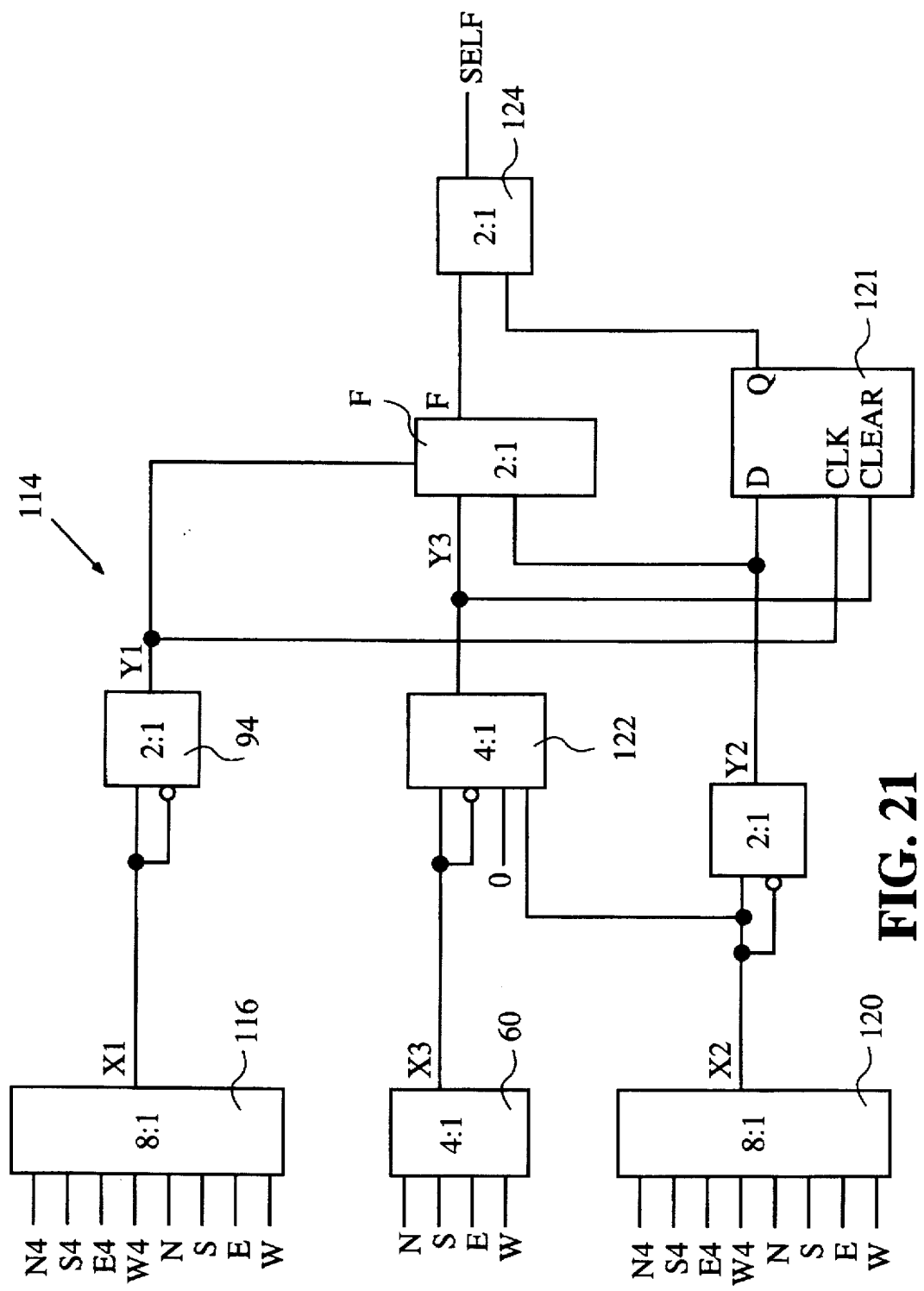
FIG. 21 depicts an alternative version of a function unit for use with the preferred embodiment of the present invention.

FIG. 21 depicts an alternative function unit 114 which can serve as function unit 48 in all of cells 12 shown in FIG. 10 and FIG. 2. Function unit 114 provides a constant source for the register clear input and requires the same number of bits of control store RAM as the FIG. 20 embodiment. One more bit controls multiplexer 122 and one less bit controls multiplexer 118. But function unit 114 is less symmetrical in its input selection than the function unit of FIG. 20, as can be seen from an inspection of multiplexers 116, 118 and 120. Lack of symmetry in function unit 114 complicates the software which implements a design, thereby making it more difficult to make effective CAD tools. As before, multiplexers 116, 118 and 120 provide the three outputs, X1, X3 and X2 respectively. The structure is otherwise the same except for the inclusion of a 4:1 multiplexer 122 between multiplexer 118 and 2:1 multiplexer F. The output multiplexer 124 receives outputs from the F multiplexer, still controlled by Y1, and the D-type flip-flop 121.

Figure 22:
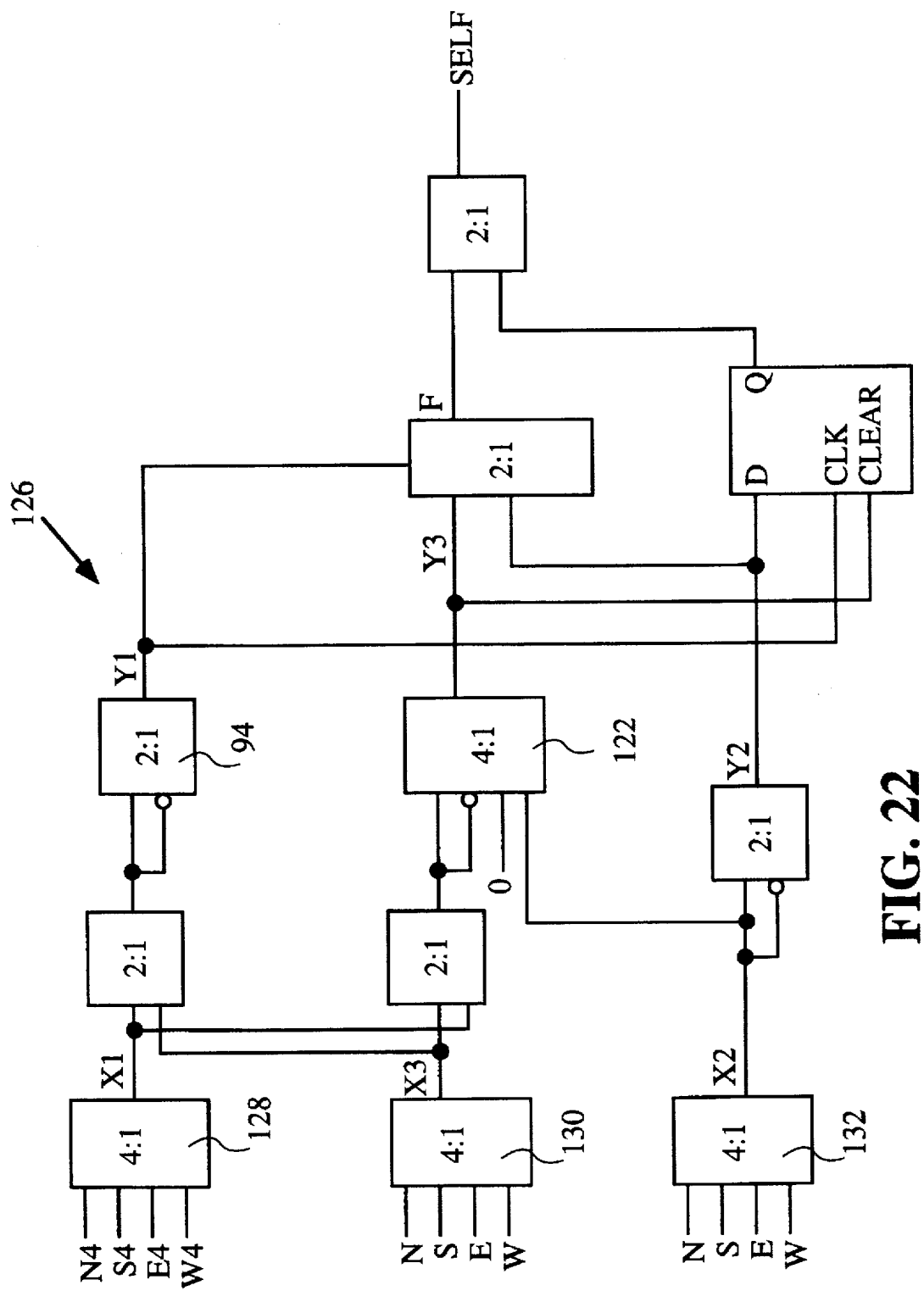
FIG. 22 depicts a further alternative version of a function unit for use with the preferred embodiment of the present invention, this version reducing the symmetry of the input selection multipliers.

A further alternative version of a function unit 126 to be used as function unit 48 in cell 12 is depicted in FIG. 22. In this design, the symmetry of the input 4:1 multiplexers 128, 130 and 132 is further reduced. The attractions of FIG. 22 are the lower fan-in on the length-4 wires which are connected to 1 multiplexer per cell rather than 3 per cell, and the fast X2 path through the function unit itself which improves performance over the function unit of FIG. 20.

Figure 23:
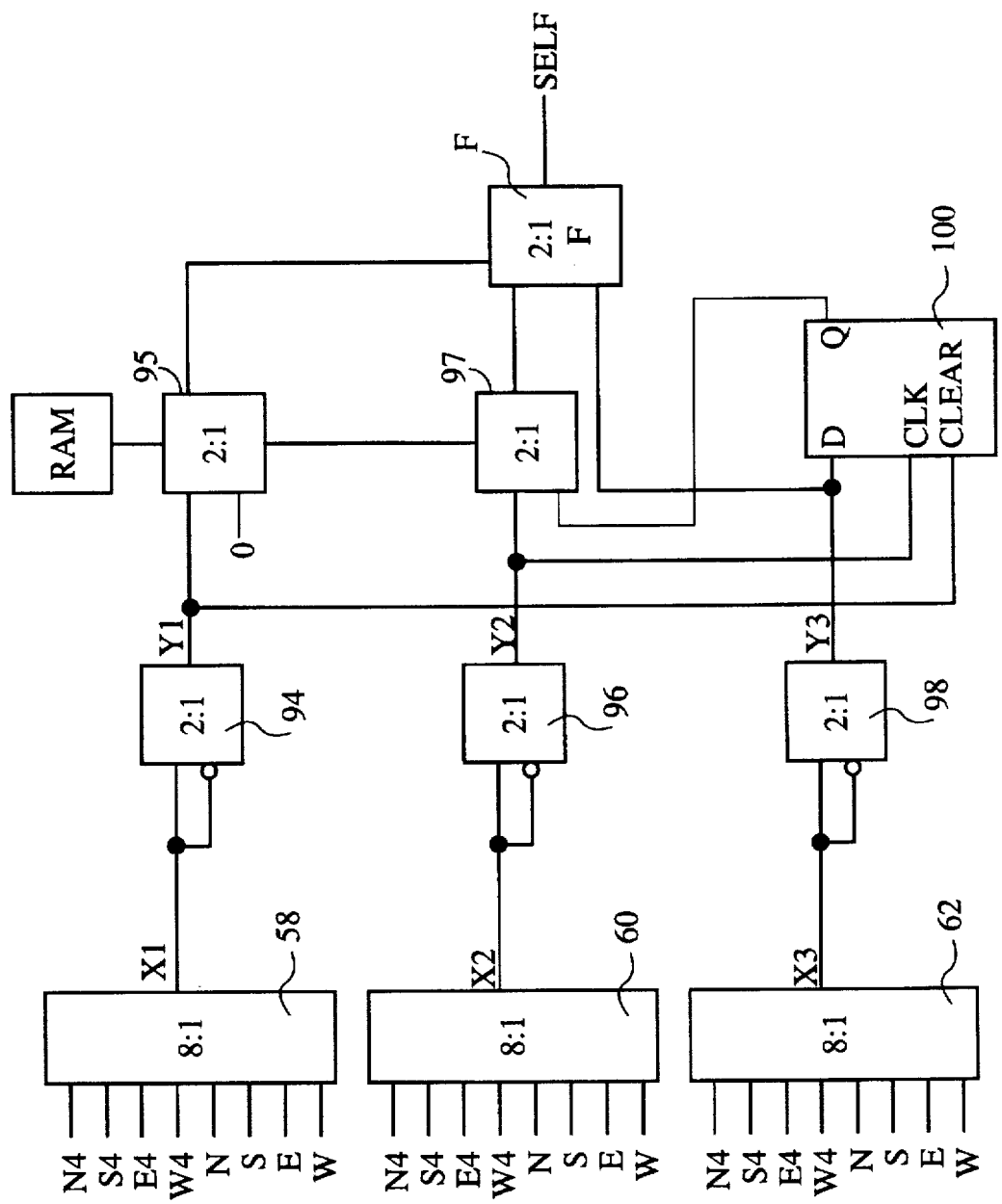
FIG. 23 is a further embodiment of a function unit similar to that shown in FIG. 20.

FIG. 23 shows a further variation on the function unit of FIG. 20 which implements the same operations. The additional 2:1 multiplexers 95 and 97 are controlled by the same bit of RAM which provides for routing the register to the self output via the combinational function multiplexer F, and the 2:1 multiplexer 102 is deleted. The advantage of this unit is that the number of multiplexers between input and output for combinational functions and the X3 input is reduced from 4 to 3 while all other paths still require 4 multiplexers. Thus X3 provides a fast path through the function unit without requiring more control store RAM than the function unit of FIG. 20.

The performance of multiplexer based switching structures such as those in FIGS. 18, 21, 22 and 23 can be improved using standard techniques at the expense of increasing the area required to implement them. However, because of the area cost it is not considered desirable to increase area of more than a small sub-set of multiplexers. In the network of logic gates in a user's design, a critical path corresponding to the longest signal delay between input and output can usually be identified. To improve the performance of the network of logic gates it is necessary to reduce the delays along the critical path; reductions in delay elsewhere will have no effect. CAD software tools are available which can automatically determine the critical path through a block of combinational logic and implement the critical path using fast path hardware to reduce delay.

Figure 24:
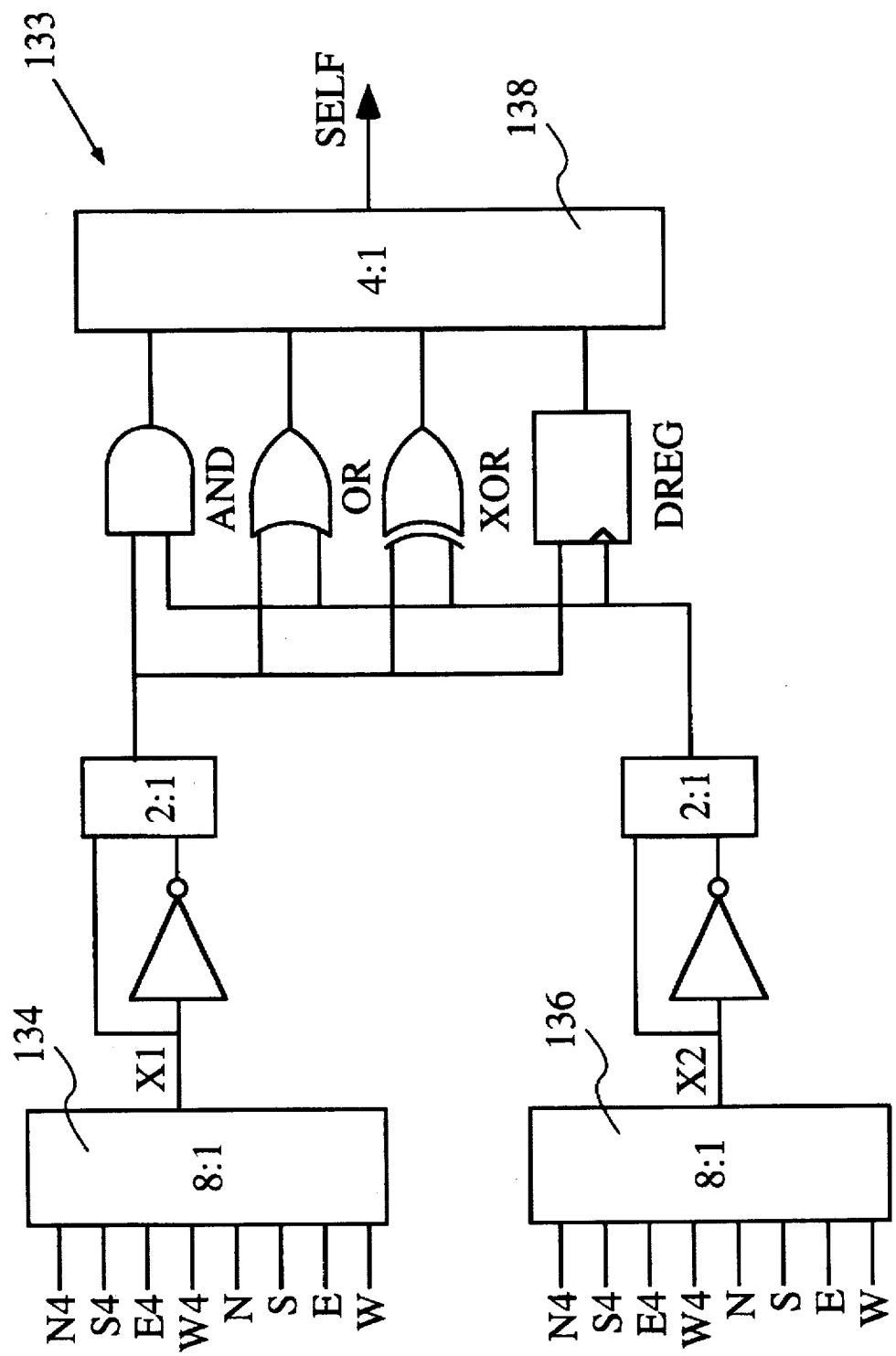
FIG. 24 depicts a schematic diagram of a 2-input function unit for use with the present invention.

FIG. 24 depicts an implementation of a gate-based function unit indicated by reference numeral 133. In this case, there are two 8:1 multiplexers 134 and 136, which provide outputs X1 and X2 respectively. X1 and X2 are optionally inverted, then 4:1 multiplexer 138 selects one of the four functions of the resulting variables, that is AND, OR, XOR or DREG. Function unit 133 has only two input variables similar to that of the function unit used in the CAL I FPGA as described in WO90/11648 (U.S. Pat. No. 5,243,238) and, consequently, it cannot implement a 2:1 multiplexer as a cell function. This design shows that multiplexer based function units are not the only possible way of implementing functions in the cellular array. Another possibility would be to use a 4 bit RAM lookup table addressed by X1 and X2, as discussed in U.S. Pat. No. 4,870,302, as U.S. Pat. No. Re 34,363, invented by Ross Freeman, entitled "Configurable Electrical Circuit Having Configurable Logic Elements and Configurable Interconnects".

Figure 25:
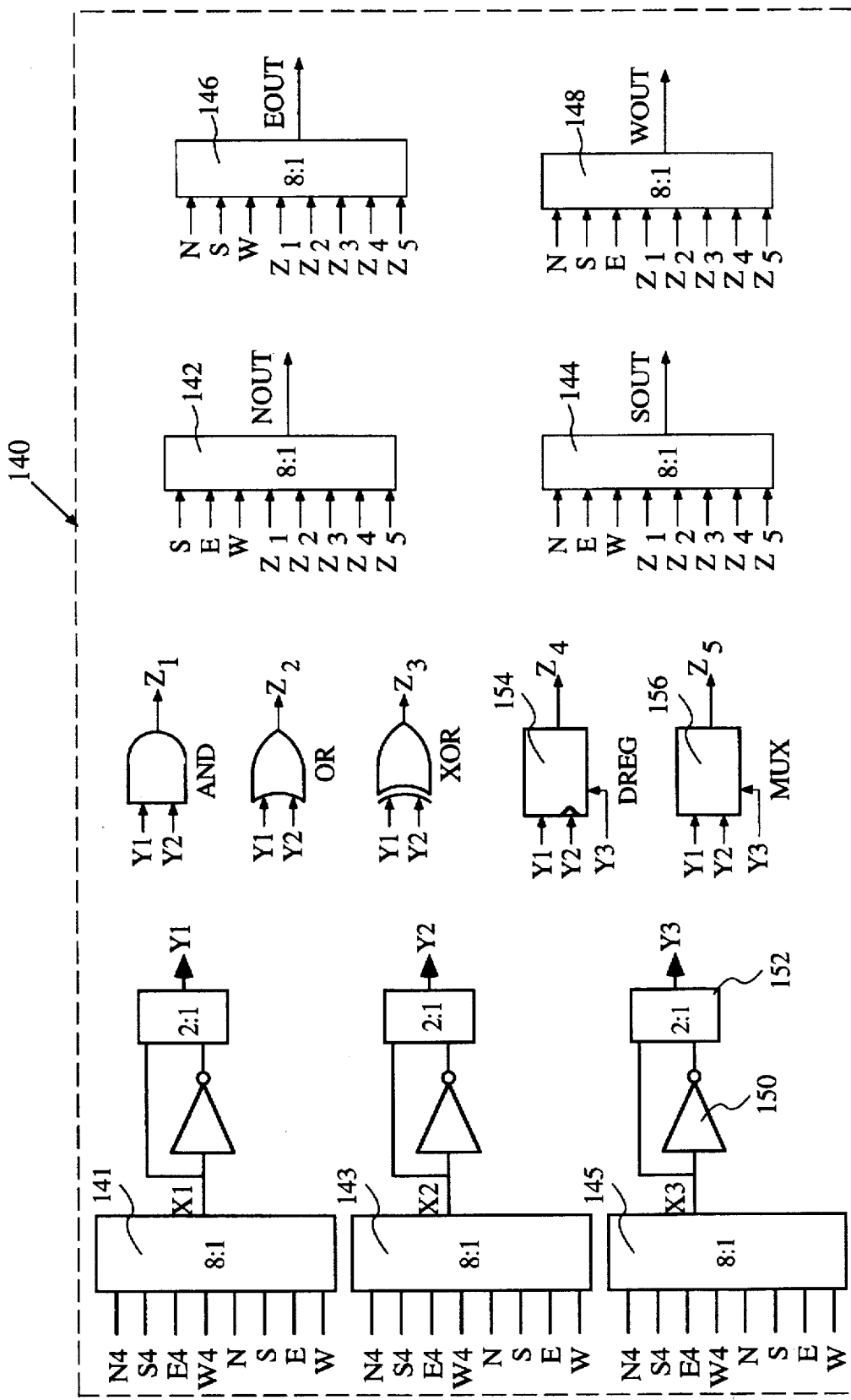
FIG. 25 is a schematic diagram of a 3-input function unit for use with the present invention.

FIG. 25 depicts a further gate-based version of a function unit 140 to implement function unit 48. Function unit 140 is somewhat similar to that shown in FIG. 24 except that 4:1 multiplexer 138 is combined with the neighbour routing multiplexers which become 8:1 multiplexers 142, 144, 146 and 148. In addition, 8:1 multiplexer 145 provides an X3 output which passes through an inverter 150. There is also a 2:1 multiplexer 152 to generate a Y3 output which can be fed to the D register, and a 2:1 multiplexer 156 which is controlled by data signal Y3 rather than the control store. Thus, five function outputs $Z_1$, $Z_2$, $Z_3$, $Z_4$ and $Z_5$ are generated. Therefore, in this structure cell 12 can compute several different functions of its input variables (X1 to X3) simultaneously and route them to neighbour outputs (Nout, Sout, Eout, Wout). Offering several outputs is advantageous for important functions like adders, but nevertheless requires extra control memory and more chip area, thus function unit 140 is harder to design with.

One Fast Path

The version of function unit 48 shown in FIG. 20 can be constructed in such a way that the path between one of the input variables X1, X2 or X3 and the function unit output SELF is optimised for speed using standard techniques while the other paths are not. Such a function unit 48 requires significantly less area than a function unit 48 in which all input paths are optimised. Software may be written so that signals on the critical path in a user design can be directed where possible to use the optimized X2 input to the function block, ensuring that critical path signals incur minimal delay. This may be done by having the software make selective changes to the user design taking advantage of the symmetrical nature of the function unit which allows inputs of combinational functions to be permutated. FIG. 11 shows logic functions of A and B which are available from the embodiment of function unit 48 shown in FIG. 20. For example, function X1·$\overline{X2}$ with X1=A and X2=B, where A is on the critical path can be transformed to $\overline{X1}$·X2 with X1 equal to B and X2 equal to A by making changes to the sources of X1, X2 which drive function unit multiplexers 58, 60, and 62 in the local cell. Such a technique allows most circuits to obtain similar performance to that available from a function unit where the delays through X1 and X2 are both equally fast, but with much less area overhead.

Input/Output Structure

FIG. 26a depicts a schematic block diagram of the input/output architecture of the embodiment of the CAL II array illustrated in FIG. 8. The circuit of FIG. 26a occurs on the east side of the chip. At the edge of the array of cells 12 there are programmable input/output (I/O) blocks 110. Each I/O block 110 is connected to an external pad. Three bits of control store RAM are provided to each I/O block for selecting input threshold voltage (LEVEL), selecting pad slew rate (SLEW), and providing an input pull-up resistor. Flexibility is increased by using additional control store bits to get additional control over pad parameters in this case slew rate and threshold voltage level, or to provide switchable pull ups.

There is one I/O block 110 for every two cells 12-A and 12-B along the West and East edges of the chip and also one external pad for every two cells along the North and South edges of the chip. This arrangement has the advantage of reducing cost by reducing the number of package pins required. Normally, wide (16–32 bit) buses are connected to the West and East edges as shown in FIG. 8 so that the chip registers latching these buses will be arranged vertically (as will be later described in detail) and hence are efficiently accessible through the control store interface by the host processor. Many variations on this allocation of pads are possible, including providing one I/O block and pad per external cell position on all edges and putting one pad per cell on two adjacent edges and one pad per two or four cells on the other two edges.

With regard to the architecture depicted in FIG. 26a, each I/O block 110 has a data input (OUT) and an enable input (EN), each of which are connected directly to cells 12 on the periphery of the CAL II array. Similarly, I/O block 110 can provide on its IN line a signal to cell 12-A or cell 12-B or on West length-4 flyovers W4B or W4A or West length-16 flyovers W16B or W16A. Likewise, I/O block 110 can receive on its OUT line a signal from East flyovers E4B, E4A, E16B, or E16A as well as from cell 12-A or 12-B. Thus, the data input to I/O block 110, which is a pad output (labelled OUT in the I/O block) receives data from switch 112 and is enabled by the EN output of switch 112. This design minimises delays between the internal array and off-chip by eliminating separate I/O control logic signals. By placing suitable values on the data and enable input signals (which could be achieved by using constant cell functions 0 and 1), I/O block 110 can be programmed to operate in input, output, bi-directional, or open drain mode, as shown on the I/O block mode table of FIG. 26b.

FIG. 26d shows one embodiment of switch 112 of FIG. 26a. Eight multiplexers are provided, as shown. Signal lines and flyover lengths are labeled as shown in FIGS. 15-17. Thus, the details of FIG. 26d, which reference the same signals, are not described further. Supporting all 6 input signals from the two cells allows data and enable signals to be sourced from either cell, making it less likely that a pad will not be used because of routing constraints. Additional inputs are provided, in particular, constants 1 and 0, and a bit line as inputs to the enable multiplexer. The constant values are particularly useful for the enable signal when the pad is to function as an input (enable=0) or as an output (enable=1) rather than a bidirectional pad. Constant values on the data signal and a computed value on the enable signal produce open drain pull-up (in=1) or pull-down (in=0) pads. However, the I/O architecture of the CAL II array has been designed to minimise input and output delay by eliminating extra pad control logic and, consequently, represents a considerable simplification over the CAL I pad control architecture.

The I/O routing switches for the North, South, and West sides of the chip are derived in the same way as the East routing switch shown in FIGS. 26a and 26d.

In addition to I/O signals, input and output signals at positions which do not have associated external I/O pads can be connected to programming signals on the FPGA (data bus, address bus, mode, read/write, $\overline{CE}$, $\overline{CS}$, FHZ). This allows circuits implemented on the FPGA to monitor these important external signals. Thus, a circuit implemented on the FPGA can detect external reads and writes to the status or control memory and automatically clock itself to process an input value or produce the next output value.

When global signals are provided, they can be driven from logic signals at the edge of the array in the same manner, as well as from dedicated input pads, as is conventionally the case with the CAL I arrangement. Thus use of logic connections from the edge of the array increases the flexibility of the device and allows additional chip logic to be eliminated, further reducing the part count.

FIG. 26c shows an example circuit in which a global signal on line 205 can be taken from four possible sources by a user programmable multiplexer. A programmable multiplexer may be used to select between various potential sources for global signals so the number of potential sources can be larger than the number of global clock lines in the array. First, multiplexer 207 can take an external signal such as a clock signal, which is applied to pad 206, buffered by input buffer 203 and provided to multiplexer 207. Second, multiplexer 207 can select an internally generated power-on-reset (POR) signal on line 204, which can be provided as a result of a voltage disturbance or other reason. A reset signal generated automatically by detecting transitions in the power line to allow user logic to be initialised is particularly valuable for chips which use non-volatile control memory such as a flash EPROM or support a low voltage data retention mode for their RAM control store. Third, multiplexer 207 can select a signal from counter/timer 209, which may include an internal or external oscillator. A programmable counter/timer driven by an external crystal or other clock source can provide a flexible clock to user logic. Fourth, multiplexer 207 can select a signal generated by the user's internal logic and selected by I/O block 110-6 from the output of cell 208, an east length-16 flyover, and an east length-4 flyover. Such a global signal could be a clock driven from a cell output. ps Register Access: Control Store Manipulation and FPGA Reconfiguration CAL II supports direct access from the processor to nodes within the user's circuit. The output of any cell's function unit 48 (see FIG. 10) can be read and the state of a cell which is configured to implement a register can be written by the processor. These accesses are done through the control store interface and require no additional wiring lines to be added to the user's design. The row and column signals which address these registers can be selected as sources within a length-4 switch unit, so that user circuits can detect that an access has been made and take the appropriate action, for example, calculate a new value for an output register or process a value to be placed into an input register. In many applications, this access to internal nodes will be the main path through which data are transferred to and from the processor. In some coprocessor applications, it may be the only method used by the processor to access nodes in the FPGA. User programmable I/O pads may not be used at all.

Figure 27A:
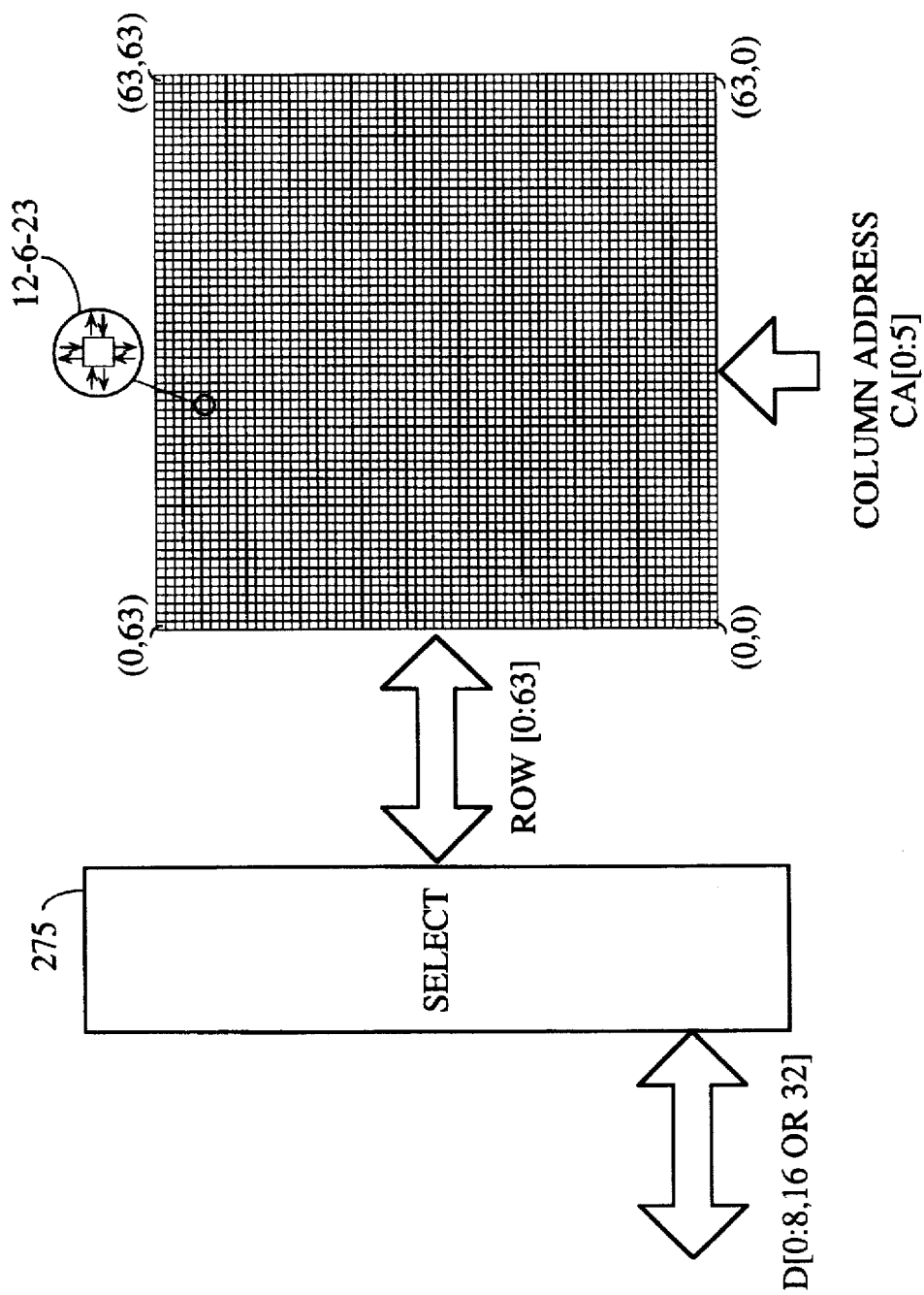
FIG. 27a shows the memory map and row and column address structures for accessing the register or node output of each cell in the CAL II array.

To allow high bandwidth transfers between the processor and internal nodes of the FPGA, it is necessary to transfer a complete processor data word of up to 32 bits in one memory cycle. For this reason, register or gate access bits in CAL II are mapped into a separate region of the device address space from configuration bits. FIG. 27a shows the mapping of this area of the address space. In an embodiment of the CAL II architecture having 4096 cells, there are 64 columns and 64 rows of cells. Since there is only one function unit per cell, one memory cell in the control store is sufficient to represent one cell function unit output. FIG. 27a represents a memory space which the processor can address to access the cell function unit outputs. One cell, cell 12-6-23 (where the 6 designates the row and 23 designates the column) is shown as a blown-up cell, equivalent to cell 12 shown in the earlier figures. A 6-bit column address CA[0:5] selects a particular column of cells to access. All bits to be accessed in one memory cycle must be in the same column of cells. Select unit 275 selects a subset of these rows to connect to an external data bus. Several possible implementations of select unit 275 are discussed below in connection with FIGS. 28, 34a, 34e, 35, 36a, 36b, and the run length register discussion. The advantage of select unit 275 is that the fixed relationship between rows or words in a memory array and lines on a data bus in prior art structures is replaced with a programmable relationship. A row select decoder selects one or more of rows 0 through 63 and reads the programmably selected values, applying them to data bus D[0:8,16 or 32], or writes the data bus value into the selected memory locations.

The functional operation of storage manipulation and reconfiguration of data in the array will now be described.

Figure 27B:
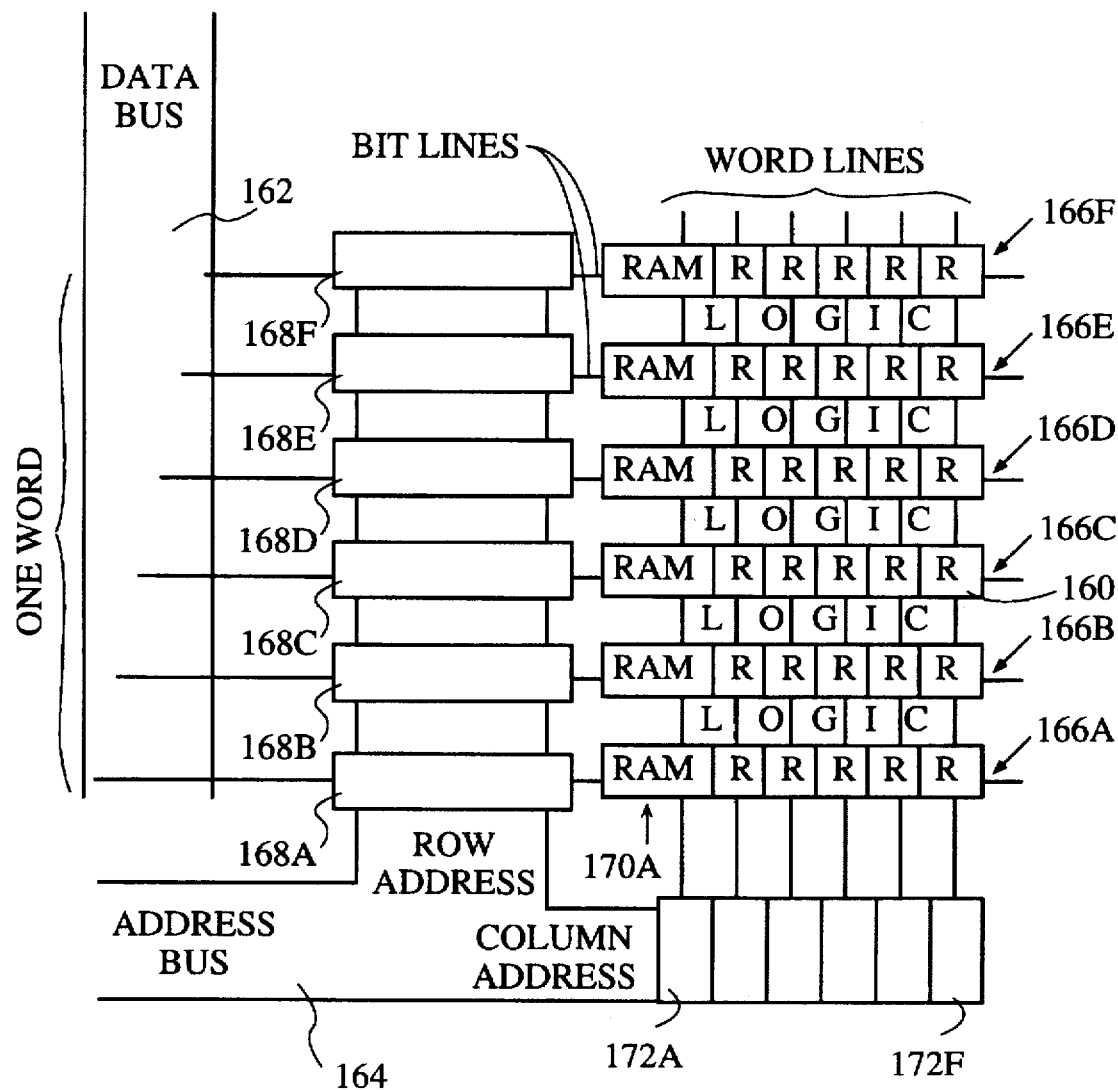
FIG. 27b is a diagrammatic representation of a RAM programmed FPGA which consists of an array of RAM cells within which are embedded active logic structures.

FIG. 27b is a diagrammatic representation of a RAM programmed FPGA, which consists of the array of RAM cells 160 embedded in which are active logic structures controlled by the neighbouring RAM cells. The logic structures implement signal switching and function generators as required by the application mapped onto the FPGA. Details of the functioning of the RAM cells and their use in the FPGA control store are disclosed in WO90/11648 to Algotronix Limited and Principles of CMOS VLSI Design, A System Perspective, Weste, N. and Eshraghian K., published by Addison Wesley 1985.

In the structure shown in FIG. 27b it will be seen that there is a data bus 162 and an address bus 164. Each row 166a, 166b etc. of RAM cells 160 is connected to the data bus 162 via a row decoder 168a, 168b, etc. Address bus 164 is similarly connected to each column 170a, 170b, 170c etc. of RAM cells via a column decoder 172a, 172b, 172c etc. The lines interconnecting columns of RAM cells 160 are termed word lines and similarly the lines connecting horizontal rows of RAM cells with row decoder are termed bit lines. When an address is applied to the RAM array shown in FIG. 27b, a single word line and a single bit line for each bit of the data bus will be activated. Since bits of a word are in a vertical line, addressing a RAM cell results in a vertical vector (column) of RAM cells being written.

Reconfiguration time for dynamically programmed FPGAs is an overhead which reduces the potential advantage in computation time over conventional computers. It is therefore essential to minimise reconfiguration time if dynamic reconfiguration is to become practical for user applications. It is also essential to minimise reconfiguration time to reduce the cost of device testing where a large number of configurations is required.

If a single word line is active then a narrow data bus is a limiting factor on the number of write cycles required to configure the array. Consequently, narrow data bus width limits or restricts the configuration time. Making the data bus width identical to the number of row decoders enables an entire column of RAM cells to be written simultaneously. In this case, the row address is redundant. In the case of the CAL I array this would require a data bus 128 bits wide and hence require 128 external pads for maximum throughput. It will be appreciated that FPGAs have a large number of logic I/O pins from the array (in the case of the CAL 1024, 128 pins) so if the data bus pins are shared with logic I/Os, wide data buses can be supported. Although one data bus bit per row decoder is unfeasible, a system which supports a data bus bit for every two or four row decoders is feasible. Using the I/O pins on the same edge of the chip as the row decoders means that no long wires between pads and row decoders are required. Driving two to four decoders with one I/O pin is especially useful for device testing to minimise the number of vectors required. However, very wide data buses are less useful in actual applications because of the mismatch to the data bus widths of conventional processors and the overhead of board wiring. Using the same pad for both I/O and programming data is also a considerable inconvenience to the designer of boards containing FPGAs. Systems which take advantage of bit line parallel writes by providing block transfer modes such as those becoming common on commercial DRAM chips ("A New Era of Fast Dynamic RAMs", Fred Jones IEEE Spectrum, October 1992) allow high bandwidth for relatively low pinout, and may be attractive for use in future FPGAs.

Figure 27C:
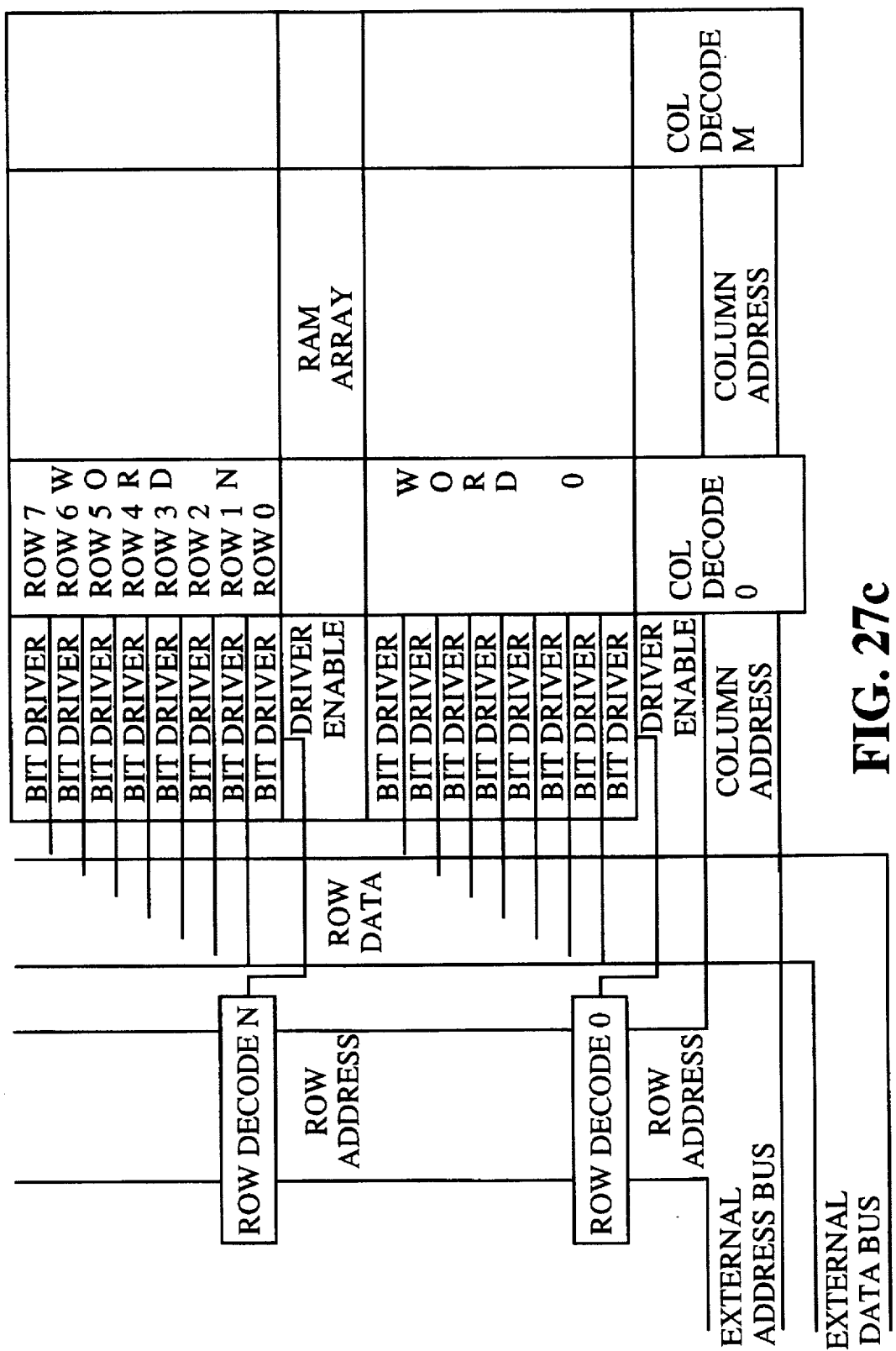
FIG. 27c is an enlarged representation of the RAM programmed FPGA shown in FIG. 27b depicting the word boundaries in the control store.

FPGA configurations are usually high ly regular compared with the data found in normal data memories. This regularity is especially apparent in the configuration data for user designs implementing computational applications where the circuits themselves usually consist of vectors of repeating bit slice units. Regularity is also apparent in configurations for testing the device. As depicted in FIG. 27c, which shows in more detail the RAM addressing circuits, if the columns of the FPGA device are considered as consisting of a sequence of words the same width as the data bus, each word having a unique row address, then it is likely that many of the values in these words are the same. In the CAL 1024 FPGA (CAL I array) device there are 16 such words and in a typical configuration there are an average of 3.4 distinct values in the 16 words. This implies that an architecture in which all the words with the same configuration could be written simultaneously could reduce the number of writes required on average from 16 per column to 3.4 per column. Similarly, in a row of 144 words, there may only be 35 distinct values. Thus, an FPGA architecture which activates several word lines simultaneously can also reduce the number of write cycles required. However, activating several word lines simultaneously during a write cycle is more complex because there is a fan-out problem; the buffer at the row decoder must potentially overcome the opposite value stored in several RAM cells on that bit line. This limits the number of word lines which can be active simultaneously, with the exact number depending on a variety of factors, but the number of active word lines is much less than the total number of word lines and a value of 4 is reasonable.

Operation of Match Registers

Figure 28:
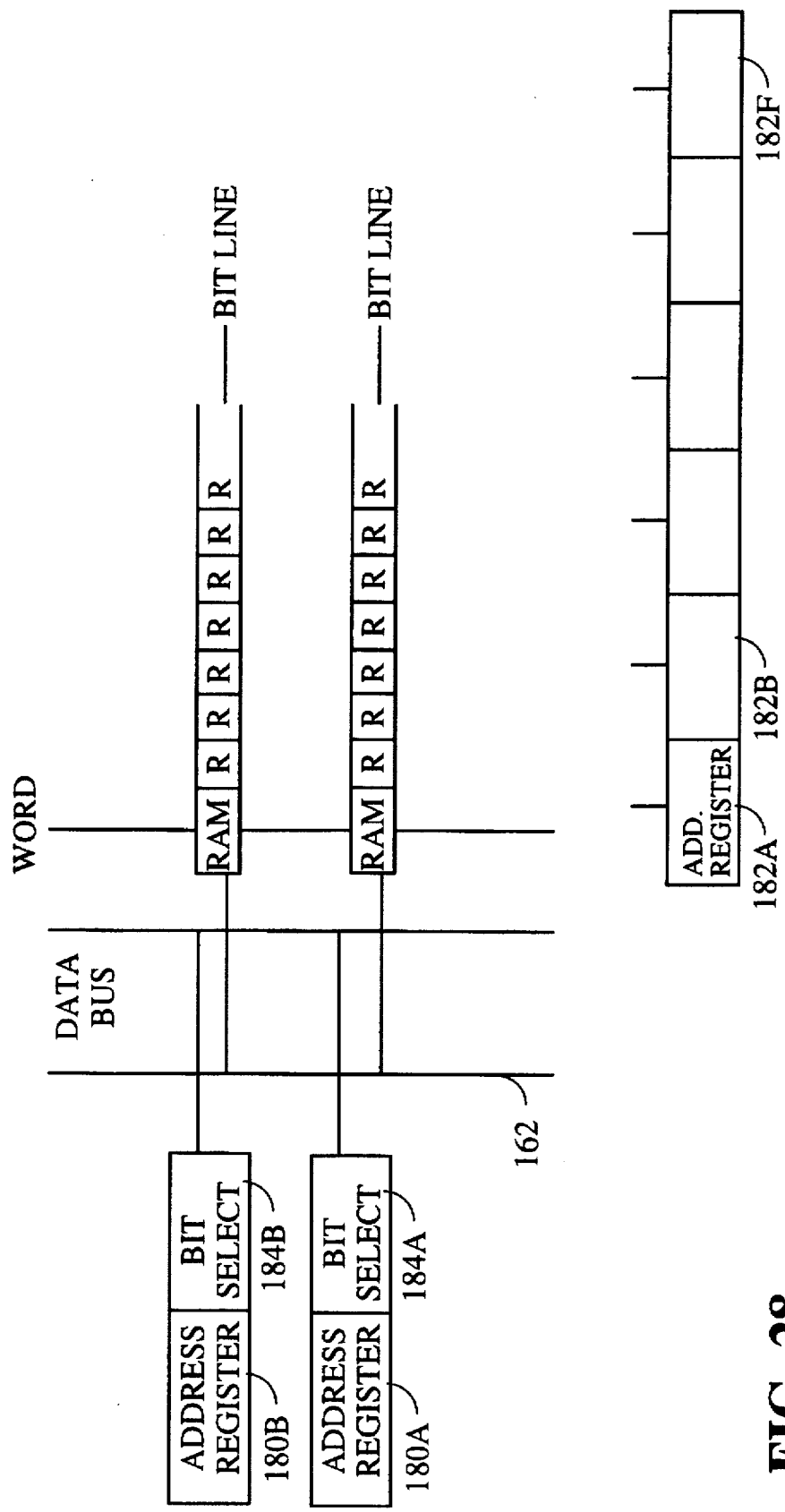
FIG. 28 depicts a RAM programmed array in which the row and column decoders have been replaced by match registers.

One method of advantageously providing or facilitating multiple writes is to replace either the row or column or both address decoders with match registers which compare the value of the address applied to the value stored in the local register. There will be one match register (programmable decoder) where each decoder would otherwise be. If the match register detects that the address matches its stored value, the register activates the corresponding bit or word line, as shown in FIG. 28. Match registers can be programmed to respond to different addresses. Thus, different patterns of registers can be written to simultaneously by programming the same address into a selected group of match registers. In FIG. 28, both row and column decoders have been replaced by match address registers 180a, 180b, etc. for the rows and 182a, 182b etc. for the columns. If the value stored in each register 180, 182 is the index of the corresponding bit or word line, then this structure will function as a normal RAM. Functioning as a normal RAM is a desirable state to initialise the match registers to. By storing the same value in multiple registers, the system can be set up to write multiple words when a given address is presented.

An additional level of flexibility is provided if the row address decoder is replaced by the structure shown in FIG. 28 where the match register is supplemented by an additional register 184a, 184b which holds a number of the bit of the data bus 162 (which bit in the row) to be used to drive the bit lines when the match occurs. In conventional memories, there is one row address decoder per word and each data bit is connected to a fixed data bus line. However, In FIG. 28, there is one address decoder per bit line, and the mapping to data bus lines is programmable. Thus, there are no fixed word boundaries. This has the considerable advantage of allowing multiple sub-fields to be written simultaneously. The structure of FIG. 28 is considerably more efficient in dynamic reprogramming applications where it is desired to make a change to multiple bit slices.

In an embodiment of the CAL II architecture having 4096 cells, the format of the address bus is shown in the table of FIG. 29. The first six bits define the cell column, the next six bits the cell row, bit 12 the side, and bits 13 and 14 the mode.

Smaller CAL II devices have proportionally fewer bits allocated to row and column addresses. The mode bits determine which area of the control store is to be accessed according to the table shown in FIG. 30.

When the address bus is in cell routing mode, bytes read from and written to the control store have the format shown in the table of FIG. 31a, which shows the control store byte for programming routing multiplexers. When side =0 the external routing multiplexers are accessed, i.e. South, West, East or North. In this embodiment, no data are provided for side=1 and mode=cell routing.

This control store layout corresponds to function unit 126 of FIG. 22. When the address bus is in the cell function mode, bytes read from and written to the control store have the format shown in the table of FIG. 31b. When the address bus is in the channels, I/O mode, bytes read from and written to the control store control the multiplexers in the switches (see switches in FIGS. 15–17, and 26d). When the address bus is in the state access or device configuration mode, the state of function units of the device will be read or written (written if the function unit is a flip flop). Control store registers which control shift and mask units, wildcard units, and the state access mask register are mapped into the state access region of the device address space when the "side" bit is set to 0. State access transfers (reading and writing to function units) take place when the "side" bit is set to 1. One additional device control register includes two bits which allow selection of external data bus width, in one embodiment between 8, 16, and 32 bit width. A third bit can force all user I/O pins to high impedance irrespective of the configuration of the I/O control store value for individual pins. This third bit overrides the FHZ signal which forces high impedance on an individual pin. (see FIG. 26d) Upon reset of the device, the data bus width goes to 8 bits and this third bit selects high impedance. During operation, after a valid configuration has been loaded, an external microprocessor will set this bit (select not high impedance) to allow user I/O signals to drive the pins. These tables are included only byway of example to make concepts more concrete. Many other encodings are possible.

Although the match register approach allows for maximum reduction in the number of writes to the array, it entails a considerable overhead for setting up the values in the match registers and bit selection registers. For example, if a system with two data lines D0 and D1 is considered, a column of the RAM could be set up with a single write cycle by setting all the match registers on bit lines whose RAMs were to be 0's to select D0 and all the match registers on bit lines whose RAMs were to be 1's to select D1, then writing binary 10. One write cycle per bit line is required to set up the select registers, so this technique is less efficient than the standard RAM interface for configuring the entire array. However, in some computational applications where it is necessary to make one of a smaller number of changes to the control store very quickly (for example, to select a source operand for a computational unit by reprogramming a vector of switches through a control store interface), the match register approach represents an improvement over prior art programming.

It is desirable to support multiple simultaneous writes to take advantage of the regularity of the control store (configuration memory) programming data but to minimise the overhead operations required. This can be done by:

1. The use of run length registers. A run length register tells how many sequential words are to be written in response to a single address. In this technique the row and the column address decoders are supplemented with additional run length registers. When an address matches the corresponding decoder, the next N decoders, where N is the value stored in the run length register, are enabled and write the word on the data bus onto the bit lines. If the value of 0 is stored in the length registers then only the address decoder is enabled and the device functions as a normal random access memory.

The principal advantage of this approach is its ability to configure small rectangular areas of the chip. But a disadvantage is that no implementation has been found which is both small enough to require roughly the same area as the standard decoder and to allow write cycles of the same duration as standard RAMs. However, the technique can be readily implemented by a sequence of single word writes to numerically successive locations. Although this is not as fast as truly parallel writes, it is significantly faster than a sequence of writes under the control of an external processor and would free that processor to undertake another task simultaneously with the writes.

2. Wildcard addressing. In this technique the row and address decoders are supplemented with additional wildcard registers which can be written through the RAM interface. The wildcard register has one bit for each bit in the row address. A logic 1 bit in the wildcard register indicates that the corresponding bit in the address is to be taken as "Don't-Care": that is, the address decoder will match addresses independent of this bit. When power is applied, the wildcard registers are initialised to logic 0 so that all address bits are treated as significant. Also, the wildcard register is disabled during read operations and when the address bus is in State Access mode. The wildcard register allows many cell configuration memories in the same column of cells to be written simultaneously with the same data. This is used during device testing to allow regular patterns to be loaded efficiently to the control memory but is more generally useful especially with regular bit sliced designs because it allows many cells to be changed simultaneously. For example, a 16-bit 2:1 multiplexer can be built using cell routing multiplexers and switched between two sources using a single control store access. For example, using East routing multiplexers, the two sources could be a cell's function unit output, perhaps a register output, and the cell's West input. When a bit of the wildcard register is active the corresponding bit of the address is ignored, for example if the wildcard register for the lowest order bit holds 01 and the address supplied is 10, then decoders 10 and 11 are both enabled. If the wildcard register for the lowest order bit holds 00, then the device functions as a normal RAM.

FIGS. 32a, 32b, and 32c show three examples of wildcard addressing. In FIG. 32a, a user has not set any bits in the wildcard and has applied the row address 010101 (decimal 21). Thus only row 21 is addressed, as shown. In FIG. 32b, the user has set the wildcard address 100001 and again applied the row address 010101. This time, the value 1 in the least and most significant bits causes rows with addresses 010100 (decimal 20)
010101 (decimal 21)
110100 (decimal 52) and
110101 (decimal 53)

to be addressed. In FIG. 32c, the user has set the wildcard address 000111 and applied the same row address 010101. This combination causes rows 16 through 23 to be addressed. Thus many combinations and densities of multiple rows can be addressed by selecting an appropriate entry in the wildcard register and an appropriate row address.

Figure 33C:
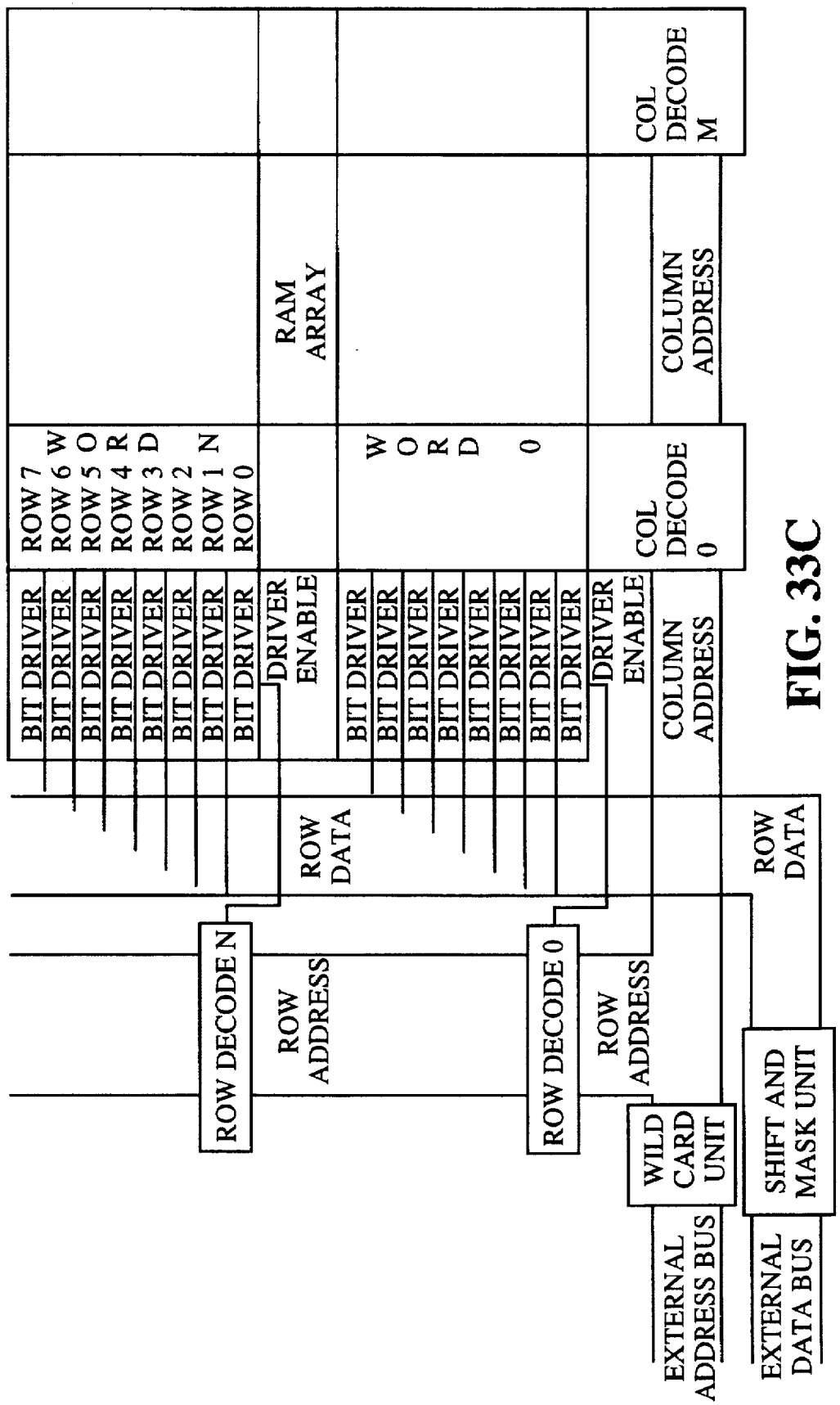

The principal advantage of the wildcard addressing approach is that it can be implemented with standard address decoders without space and time penalties. This arrangement is depicted in detail in FIGS. 33a, 33b and 33c. As indicated in the aforementioned application WO90/11648 (U.S. Pat. No. 5,243,238) and in the aforementioned Weste and Eshraghian book, the standard address decoder for RAMs consists of a CMOS NOR gate. Both true and complemented values of each address bit, that is A and $\overline{A}$ (eight in this case $A_0\overline{A_0}$ to $A_7\overline{A_7}$) are fed through all gates. Each individual gate selects either the true or the complemented value of the address bit according to the address it decodes by placing a contact on the appropriate metal line. For example, as shown in FIG. 33a, address decoder 183 for decoding 0 uses all true forms (so that if any of the address inputs is high, the corresponding decoder output is low). This is repeated for each of N row decoders. As shown in FIG. 33b, by inserting AND gates controlled by the wildcard register on both the true and complemented signals being fed to the array, both the true and complemented signals for a given address bit can be forced to the low condition. This means that any NOR gate for which the other address bits match will have its output active (high) independent of this bit. FIG. 33b shows part of such art AND gate in the wildcard unit circuit. It will be appreciated that this circuitry is duplicated for each address bit. The $E_n$ signal applied to the AND gate input of FIG. 33b comes from the corresponding bit of the wildcard register. Normally, these AND gates would not be present and the $\overline{A}$ signal would be derived from A using an inverter. FIG. 33c shows that the wildcard unit of FIG. 33b is located within the RAM between the external address bus and the bus to the row and column decoders.

As well as being easily implemented, the wildcard address register has an additional important benefit. In many bit-sliced structures found in computational applications, it is desirable to change the same cell in each bit slice unit simultaneously. In addition, it is often the case in fine-grained FPGAs that the cells to be changed simultaneously would be every second, fourth, or eighth cell along a row or column. The wildcard address decoder allows this sort of operation to be performed efficiently by masking out the second, third, or fourth bit, respectively, of the address bus.

Testing

A further advantage of the wildcard address register is the reduced time required to functionally test the FPGA. Following manufacture it is desirable to test the device to confirm that processing errors or defects have not introduced cells or areas of the FPGA which do not function correctly. Reprogrammable FPGAs are well suited to such testing. The cost of testing is a significant portion of the total manufacturing costs and the cost of testing is almost directly proportional to the number of test vectors. In its most basic form such testing may involve writing then reading particular bit patterns to and from the control store. By comparing the value written with that read back, it can be confirmed that the control store memory is functioning correctly. It is well known that a careful choice of bit patterns can be used to verify correct functioning of the control store with only a small number of test vectors.

An alternative and more exhaustive test of the FPGA behaviour would involve the stimulation of every multiplexer with each possible combination of inputs. The procedure for testing the multiplexer behaviour requires that a large number of regular configurations need to be written in order to test each multiplexer. Such a test would involve exercising function multiplexers and also the routing multiplexers.

Both control store testing and multiplexer testing involve writing repetitious and regular bit patterns to the configuration memory. Each benefits from the wildcard address register. By using the wildcard address register it is possible to apply a common test configuration pattern to a large number of cells using fewer write cycles than is required when using a conventional memory interface. Similarly, when exercising the multiplexers, the ability to read back function unit outputs from a group of cells provides a substantial reduction in the number of read cycles required. The FPGA testing using wildcard registers thus takes significantly less time to test exhaustively, or alternatively the FPGA could be subjected to a more extensive test in a given time period.

Shift and Mask Registers

It is also desirable to provide access to sub-fields of configuration words. However, this is not achievable using normal RAM addressing or even using wildcard or run length registers. Access to sub-fields is a common requirement because a single word of configuration memory usually contains configuration data for several separate switching units which it is often desirable to change independently. With a word-wide interface, a complex sequence of shift and mask operations is necessary on the host processor in order to change one logical unit without affecting the states of the others. These shift and mask operations often make it impossible to take advantage of the ability to perform the same write operation on several words simultaneously since the bits of the words not to be changed might well be different in each word. This problem is solved by providing a separate mask register and placing a shift and mask unit between the external data bus and the data bus to the bit line drivers as shown in FIG. 33c.

A detailed arrangement of a shift and mask register for read cycles is shown in FIG. 34a. For write cycles the same unit as shown in FIG. 34a would be used facing in the opposite direction (that is, its input would come from off the chip and its output would go to the bit line driver data bus) and additional enable lines for each data bus bit would be supplied to the bit line drivers sourced from the mask register. From FIG. 34a it will be seen that the shift and mask register generally indicated by reference numeral 200 includes switches 201 placed between the external data bus and the internal data connections 162 to the RAMs 160 (FIG. 27b). After power up, register 200 contains all logic 0s corresponding to a conventional RAM interface. Data are loaded into the shift and mask register as part of the control store configuration, or periodically by the microprocessor during reconfiguration. A logic 1 in a particular bit of the mask register indicates that the corresponding bit of the internal data bus 162 is not relevant. On the read operation, only "valid" bits, that is those with a logic 0 in the shift and mask register, are presented in right justified form on the external interface, i.e. at data out. This is depicted by the table in FIG. 35 of the drawings. FIGS. 34a, 34b and 35 show that each switch 201 has an input from the mask register 200. Switch 201 operates as follows: on switch row 7, switch 201-77 receives bit b7 as data input InB (see FIG. 34b). Data input InA of switch 201-77 is connected to ground. When mask register bit M7 is high, transistor 203a is on, and the InA input (ground) appears at the output, i.e. bit b7 on InB is masked. The output of switch 201-77, which is ground, is fed to switches 201-66 and 201-67 in row 6. Also fed to switch 201-67 is aground signal, and fed to switch 201-66 is bit b6. FIG. 34c shows that in row 6 there is no enable signal, therefore transistor 203a in switches 201-66 and 201-67 stays off and transistor 203b is on, so that inputs b7 and b6 on InB pass to the output. At row 5, again the shift and mask register is not enabled, so signals b7, b6, and b5 pass straight down. At row 4, the mask register bit M4 is enabled, so bit b4 is not shifted down and bits b7, b6, and b5 are shifted to the right and down. This is repeated for other switches depending on the value of the bit in the mask register. FIG. 34c shows the effect of the bits in the mask register have on bits passing from Data In to Data Out. It will be appreciated that the shift and mask register simplifies changing isolated multiplexers in the control store. For example, changing a source for a cell's North multiplexer without the shift and mask register would entail the following operations:

1. Read control store at appropriate address.
2. Mask out bits corresponding to North register with binary 00111111.
3. Get new value for North register and align with bits 6 and 7. Make sure other bits are 0.
4. OR new value with value from operation 2.
5. Write back.

Using the shift and mask unit the following steps suffice:

1. Write mask register with binary 00111111.
2. Write new value to control store at appropriate address.

On write cycles the unit disables those bits of the data bus to the bit line drivers corresponding to the 1 bits in the mask register so that no writes are performed on RAM cells in those bit lines. The values in the other bit lines are sourced from input data bus bits in order starting with the least significant bit. This has the advantage of allowing single multiplexers to be written using right aligned data so that the processor does not have to perform additional shift operations. The wildcard register with the shift and mask facility can also be used to allow multiple writes to the same sub-unit of several control store words. For write cycles, the same unit as shown in FIG. 34a is used, but the input comes from off the chip and the output goes to the bit line driver data bus. Enable lines for each external bit are supplied to the bit line drivers sourced from the mask register. It should be apparent that the shift and mask functions are independent, and that shift only and mask only units could easily be derived.

State Access

Figure 37:
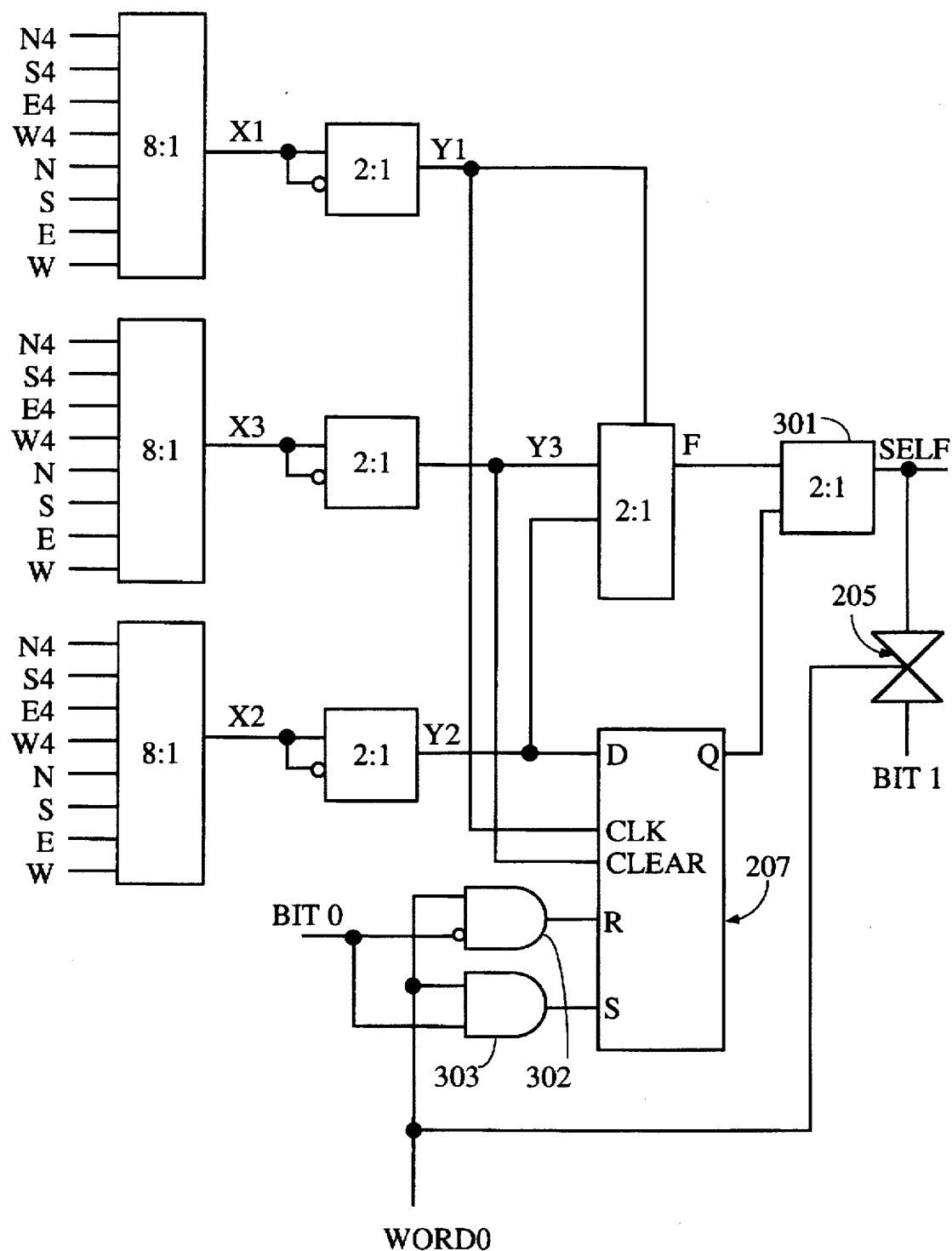
FIG. 37 depicts a function unit similar to that shown in FIG. 20 which has been modified to support state access.

Current FPGA designs allow read access to the outputs of individual gates and flip-flops of user designs by mapping them into bits in the device control store. FIG. 37 shows the additional logic in function unit 48 to support read and write state access. Read and write operations to flip flop 207 are to separate addresses: here write uses Bit 0, Word 0 and read uses Bit 1, Word 0. Transmission gate 205 is controlled by word 0. For reading, when word 0 is addressed, transmission gate 205 places the output of 2:1 multiplexer 301 onto the bit1 line. If the bit1 line is addressed, this value is read. If 2:1 multiplexer 301 has been programmed by its control store bit to pass the Q output of D flip flop 207, this value will be read. For writing to register 207, bit 0 and word 0 are addressed. Register 207 has asynchronous Set and Reset (R,S). AND gates 302 and 303 are connected to Set and Reset respectively. If word0 is 0, AND gates 302 and 303 both carry logic 0, and the value in D flip flop 207 is not changed. If the signal at word0 is 1, a logic 0 on bit0 produces a high reset output from AND gate 303, causing D flip flop 207 to store logic 1. Likewise if bit0 is logic 0, D flip flop 207 stores logic 0. Similar logic to that provided by AND gates 301 and 303 and transmission gate 205 can be applied to other function unit designs such as shown in FIGS. 18–23. AND gates 302 and 303 need to have non-standard threshold voltages on their inputs connected to bit line bit0. This ensures that in this case that the bit0 voltage is at an intermediate value neither logic 1 nor logic 0, the register state will remain unchanged. Such a situation occurs for registers whose word line is selected by the column address but whose bit line is not selected, i.e. the access is to another register on the same word line. Alternatively, complementary bit lines bit0 and $\overline{bit0}$ as used in 6-transistor SRAM cells can be used to avoid the need for nonstandard gates.

Register Access: User Registers Separated from Configuration Memory

Access to gate output and register state is in itself of limited use as an I/O mechanism for communicating data between FPGAs and a host processor. (Access to gate output and register state is, however, very useful for debugging systems.) I/O use has been limited because a large number of overhead shift and mask operations are required to assemble a single word of data from bits taken from multiple RAM cells in the FPGA, possibly from different words in the processor address space. To make gate output and register state access a useful communications interface, it is necessary to provide hardware which allows word-wide read and write accesses from the processor to registers which are part of the user design.

The techniques described here to provide access to internal state are perhaps most conveniently applied to an FPGA with a RAM control store because the circuitry can easily be shared with that to access the control store. However, providing internal state access can be used for other types of FPGAs including, but not limited to, anti-fuse and EPROM based structures.

In particular, if it is assumed that every computation unit in the FPGA is assigned a single bit within the device control memory to allow read access to gate output and register state and write access to register state, then the first step in improving the bandwidth of the interface is to map bits of RAM which represent register state or gate output into a logically distinct segment of the address space, rather than intermingling them with other configuration memory bits. In one embodiment, register state bits are still physically intermingled with the configuration bits of the array. Segregating the register state bits from the configuration bits is achieved in the simplest way by providing an additional "mode" bit within the address bus as discussed in connection with FIG. 29, and designing the decoders such that the decoders which correspond to the device configuration bits use the true form of the mode signal and decoders which correspond to the state access bits use the complemented form. This segregation results in making the address space less dense but makes it much easier to dynamically change configuration bits or to access state bits. An address bit format is depicted in FIGS. 29 and 30. This segregation scheme can be used where the state access bits respond to the same bit and word lines as the configuration bits at the expense of additional complexity in the row and column decoders; thereby each decoder now has two NOR gates corresponding to addresses within the two address spaces and the mode bit selects which NOR gate output is used to enable the bit or word line circuits. It is also convenient to connect the bit line to a different data bus line when the bit line is active in state access mode than when active in configuration access mode. Selecting the data bus is done using extra circuitry in the bit line driver.

Word-Wide Interface Having Row and Column Separation Registers

Given that the state bits are mapped into a logically distinct section of the address space, the best interface to allow word-wide access to internal registers must be considered. Word-wide access techniques could also be applied to access small RAMs in the FPGA such as those in the Xilinx XC4000 system. One reasonable constraint is that bits of registers should occur in order from least significant bit to most significant bit evenly spaced along a single row or column of cells. This constraint is met by most user designs on existing fine-grained FPGAs. With this constraint one can specify an interface using two additional registers which contain row and column separation information. Writing into one of these additional registers would automatically clear the other additional register and determine whether a register was to be accessed along a row or column of the array. One register value would specify the number of cells between register bits. For example, if the data bus width was 8 bits and one accessed address 8 with the separation register holding the value 2, one would get addresses 8, 10, 12, 14, 16, etc. This example of the separation register controlling the state access of the bits is illustrated in FIG. 35.

Use of Wildcard and Shift/Mask Registers to Access State Information

While the above interface is, in many ways, ideal, involves additional logic in registers which cannot easily be shared with the logic required for programming the configuration memory. An attractive option is to use the existing wildcard and bit shift and mask units for accesses to state information as well. While they are not as flexible as the interface using separation registers and require some overhead operations in the processor when registers do not align well with cell addresses in the array, they do provide a significant increase in flexibility over standard RAM access modes. In this context, it may be convenient for the internal data bus to the bit line drivers to be much wider than the external data bus.

A variation on the above approach is to use a larger shift and mask register with one bit per cell row. In this case, the row wildcard units are unnecessary for accessing state information. Since the shift and mask register is likely to be significantly wider than the external data bus and the data bus to the bit line drivers, more than one external write operation will be required to set the contents of the shift and mask register. FIG. 34c shows how the circuit of FIG. 34a can be extended to support systems where the width of the input and mask registers is wider than that of the output bus.

It is also possible to provide several mask registers, each of which holds a pattern corresponding to a different register of the user's design, and each of which can be conditionally connected to the shift and mask logic. During a register access operation, bits on the address bus can be used to select which of these mask registers is used. Having several mask registers considerably increases the flexibility with which registers can be placed in a user's design.

Figure 36A:
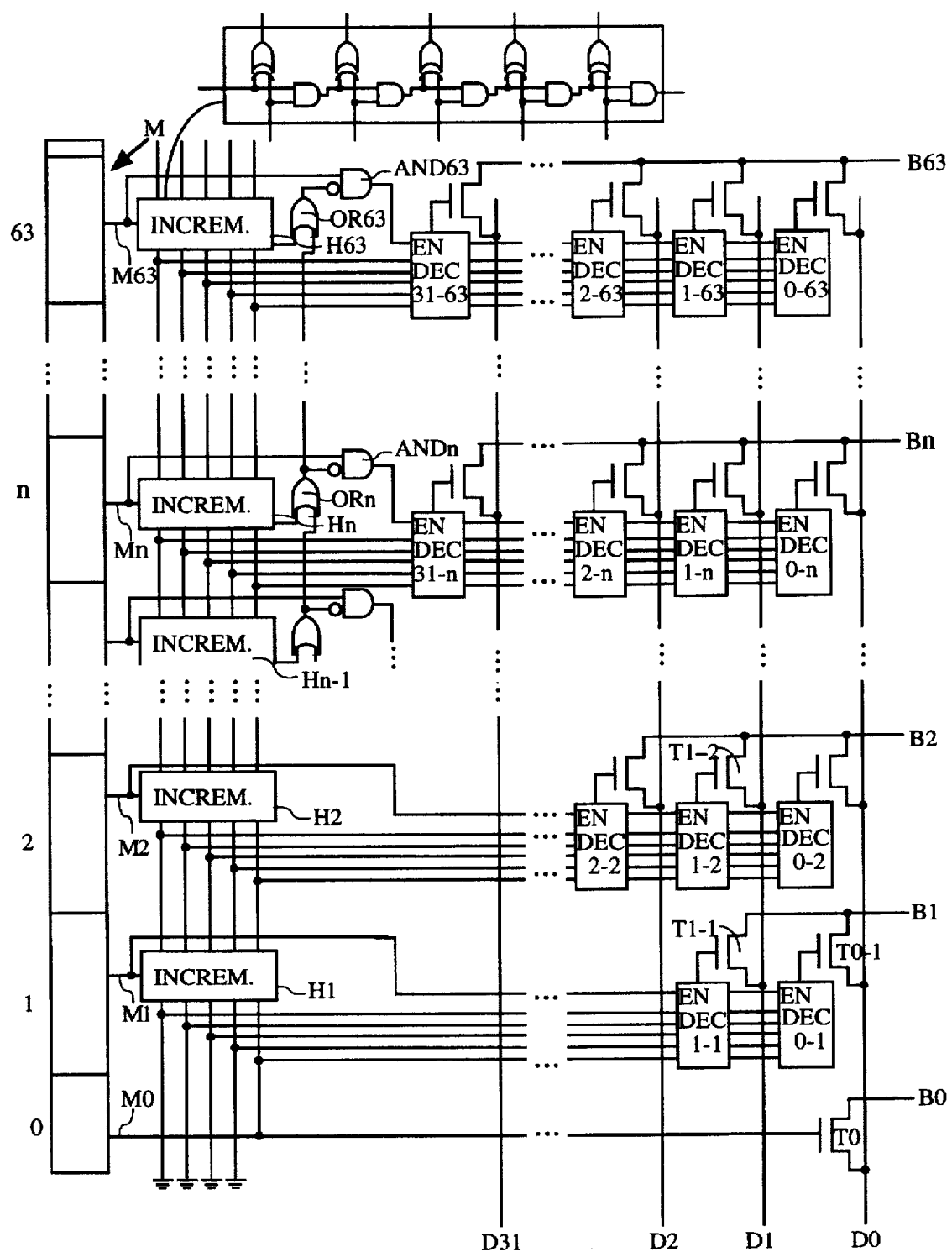

One disadvantage of the shift and mask circuit of FIG. 34a is that a signal must pass through a significant number of switches 201 on the path between input and output. This reduces speed of register access operations. FIG. 36a illustrates an alternative shift and mask unit which has only a single switch on each path between input and output, with additional decoding to enable the particular switch. The decoding circuit incurs delay, but this delay is during the write to the mask register, not during access to the user's register. The particular embodiment of FIG. 36a includes 64 mask bits for accessing 64 bit lines, of which no more than 32 will be accessed at one time.

As shown in FIG. 36a, a mask register M holds 64 mask bits M0 through M63. A column of 63 incrementers H1 through H63, of which only a few are illustrated, keeps count of the number of logic ones stored in mask register M. Each logic 1 causes a corresponding data bit to be provided as data. Circuitry for mask bit M0 is simplest. When M0 is logic 1, transistor T0 is turned on, thus connecting bit line B0 to output data line D0. This logic 1 is applied to incrementer H1, which causes incrementer H1 to output the value 1 on the five-bit bus leading to incrementer H2. (This value 1 will prevent any of decoders DEC 0-1 through DEC 0-63 from turning on corresponding transistors T0-1 through T0-63 to place a conflicting value from bits B1 through B63 onto output data line D0.)

If mask register bit M1 is logic 0, no value will be added by incrementer H1 to the value 1 input to incrementer H1. Thus the value 1 will be output by incrementer H1. Even though decoder DEC 1-1 would decode the value 1, the logic 0 value of M1 disables decoder DEC 1-1. Thus the value B1 is not placed onto either of data lines D0 or D1. If mask register bit M2 is logic 1, a 1 will be added by incrementer H2 to the input value 1 and output to incrementer H3 (not shown for clarity). Since M2 is logic 1, decoders in that row are enabled. Therefore, the value 1 input to incrementer H2 is decoded by decoder DEC 1-2, which turns on transistor T1-2 to place the bit line signal B2 onto data line D1. From the above discussion, it can be seen that other values in mask register M will produce other connections from a bit line to an output data line.

Decode circuitry for mask bits M0 through M31 is as discussed above. For mask register bits M32 through M63, no more decoders are added, in the present embodiment, because the data bus includes only 32 data lines D0 through D31. In this portion of the circuit, error detection circuitry is included comprising an OR gate which detects an overflow if the number of logic 1's in mask register M is greater than 32. The error detection circuitry for a mask register bit Mn is shown. OR gate ORn receives a logic 1 if incrementer Hn detects that a 33rd logic 1 has been entered into mask register M. At its other input, OR gate ORn receives a logic 1 if any lower order incrementer has detected an overflow. This logic 1 value propagates through all OR gates above ORn and causes AND gate ANDn and all AND gates above ANDn to output a logic 0, thus disabling all decoders above row n.

Thus it can be seen that the circuit of FIG. 36a forms a set of data bus outputs as specified by 64-bit mask register M from the 64 bit line inputs B0 through B63, and right-justifies the selected bits. Yet each selected bit line value passes through only a single transistor to reach its data line.

Decoders in FIG. 36a are preferably implemented as NOR gates, though other implementations are of course possible. The incrementer circuits of FIG. 36a may be implemented as shown in the inset attached to incrementer H63.

Figure 36B:
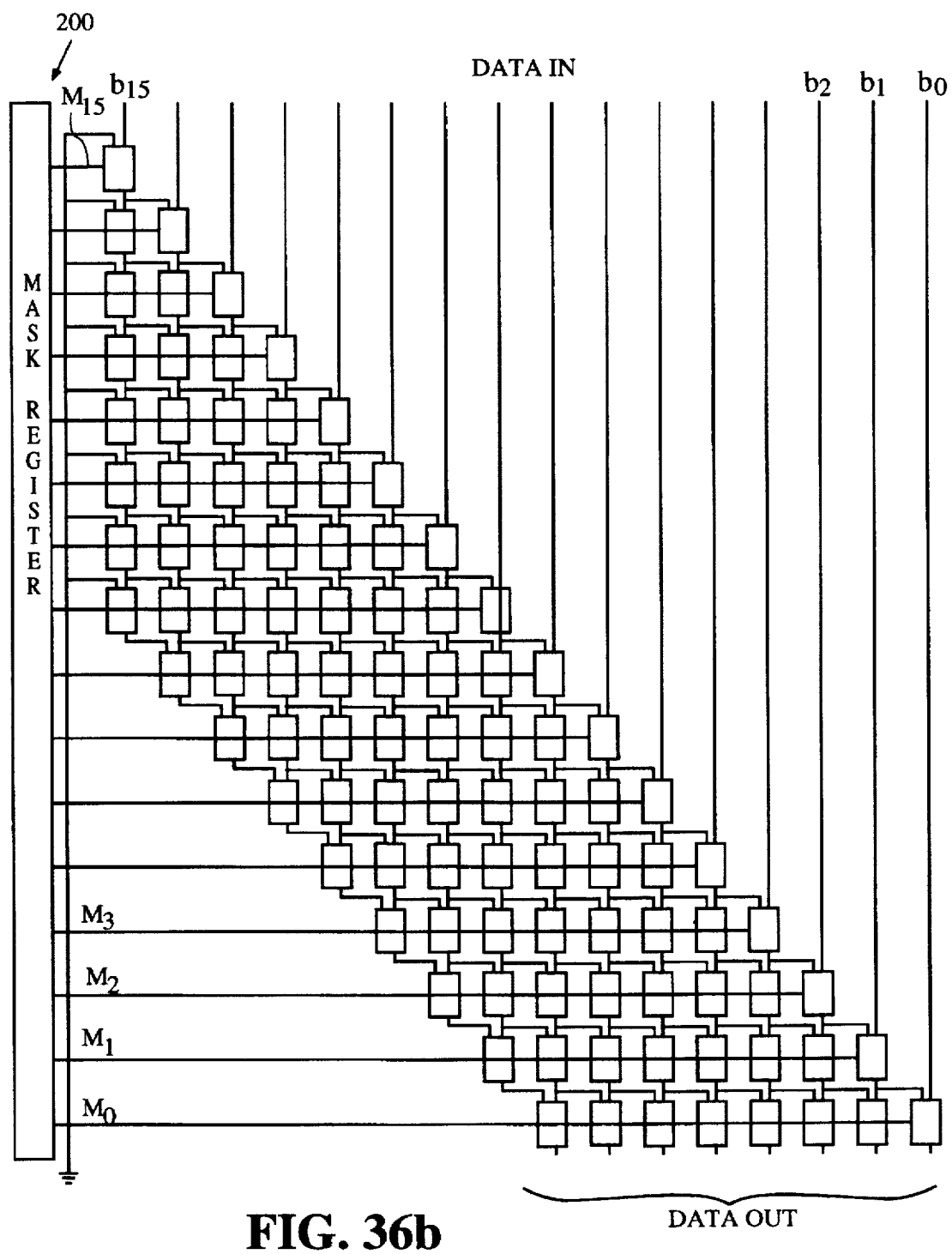
FIG. 36b shows how the circuit of FIG. 34a can be extended to support systems where the width of the input and mask registers is wider than that of the output bus.

FIG. 36b illustrates another shift and mask register similar to that of FIG. 34a but having 16 data bits and an 8-bit data register. Mask register 200 allows the shift and mask circuit of FIG. 36b to select up to 8 of the 16 DATA IN bits $b_0$ through $b_{15}$ to place on the DATA OUT bus. Values $M_0$ through $M_{15}$ are loaded into mask register 200. As with FIG. 34a, a value 1 in the mask register causes a bit value $b_0$ through $b_{15}$ to be shifted down and to the right, whereas a value 0 in the mask register causes the bit value to be shifted straight down. If mask register 200 contains more than eight 1's, the higher order bit values will be lost.

Writing to the mask register is an inherently faster operation than accessing configuration memory because it does not involve setting up the long bit and word lines in the configuration memory via the row and column decoders. Thus, there is likely to be adequate time in a normal write cycle to allow the decoding circuitry to settle. If there are multiple mask registers selected by address bits, and only a single set of decoding circuitry, then the decoding delay will be incurred during the access to the user register. Thus, the shift and mask unit of FIG. 36a is mainly of benefit when there is only a single mask register.

Access to Registers Implemented Horizontally

The interfaces to registers and gate outputs provide for word-wide access to registers in the device running in the vertical direction so that the bits of the register all occur on different bit lines. If the register runs horizontally then all bits will occur in the same bit line and parallel word-wide access will not be possible. Because the number of bits of control store corresponding to state access is likely to be approximately 20 times less than the total number of bits of control store, it is quite feasible to use "dual-ported" memory for the feedback bits along with a second set of bit and word line drivers running in the perpendicular direction to the first set. The extra port allows horizontal as well as vertical registers to be accessed in a word-wide fashion. Dual-ported memories are well known and are disclosed in the above mentioned Weste & Eshraghian book. This second set of drivers may have their own dedicated shift and mask unit and wildcard register or share with the first set according to detailed layout considerations.

Control Store Duplication

Control store duplication will now be described. In some situations it is convenient to have multiple bits of the control store of an FPGA which are guaranteed to always contain the same value. This duplication of control store bits can eliminate wiring which would otherwise be required to route the output of a single control store bit to a distant location in the array. One important example of the application of this technique is when a single routing wire is provided which can be driven by more than one possible source using 3-state drivers and the control store contains bits which select which driver is active. A solution may be achieved by routing the bits of the control store in parallel with the wire itself to all drivers, but this involves considerable area overhead for a long wire. An alternative solution is achieved by simultaneously writing duplicate bits to those control store locations which must be identical. If the duplicate bits are on the same bit line of the control store address, then simultaneous writing of the duplicate bits is readily achieved by using the same column address for the various columns of RAM containing duplicate bits. By increasing the complexity of the row and column decoders, for example by providing more than one NOR gate in a given decoder and routing row address bits to the column decoders and vice versa, a flexible structure can be built which reads and writes the duplicate bits.

Figure 38:
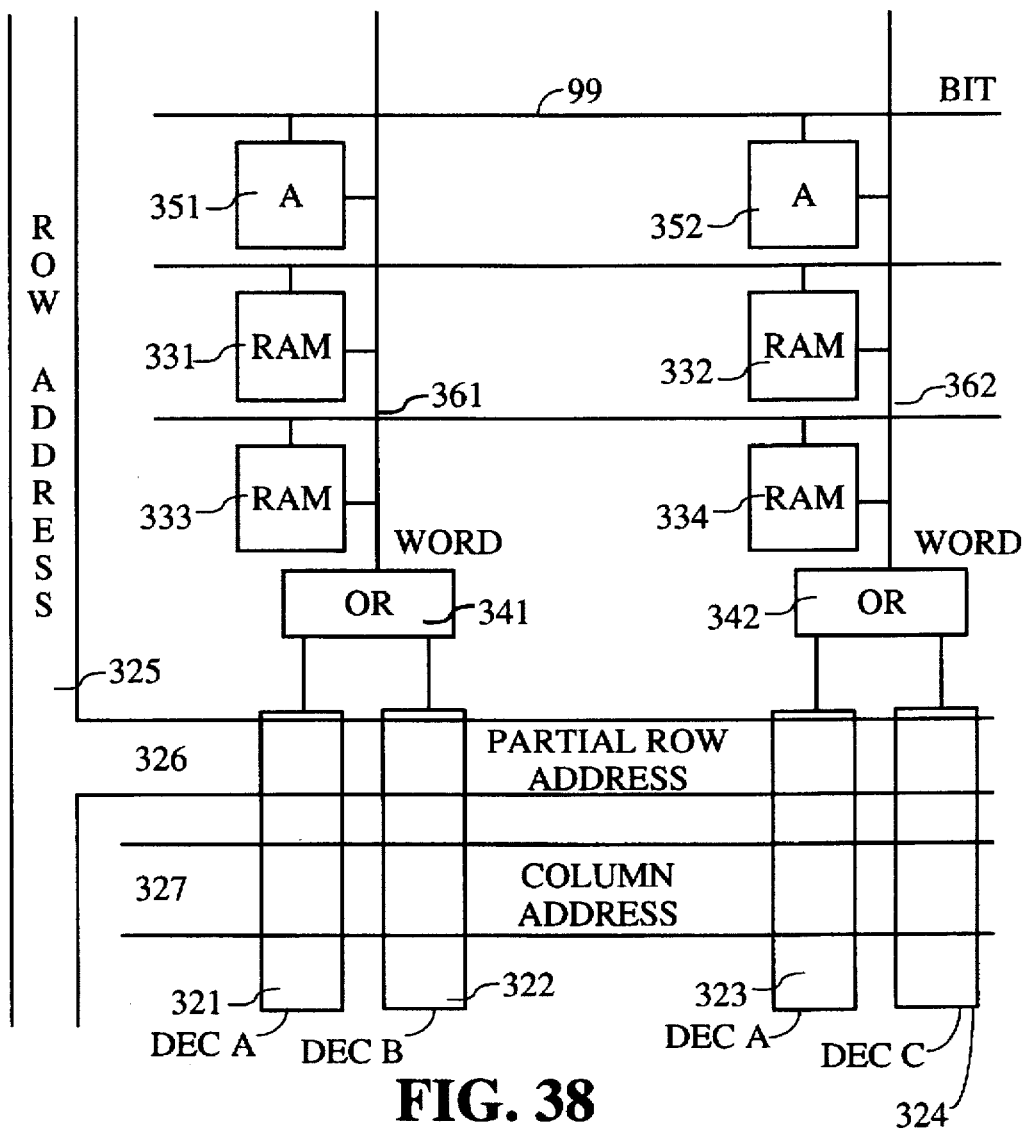
FIG. 38 depicts a structure on which duplicated bits of control store can exist on the same bit line as normal bits of control store.

This arrangement is best seen in FIG. 38. The letter A represents those memory cells (cells 351 and 352 are shown) in which bits are to have the same value. Additional memory cells A may be provided but are not shown in FIG. 38. All memory cells A which are to have the same value are placed on the same bit line 99. Other cells such as 331–334 labeled RAM are each separately addressable and are in the same columns (word lines) as memory cells A. Word lines 361 and 362 can be selected by two different column addresses. Word line 361 is selected by either of decoders 321 or 322 and word line 352 is selected by either of decoders 323 or 324. Decoders 321 and 323 decode the same address, and such decoders are provided for all columns in which memory cell A is located. In other words, all columns having a memory cell A include a decoder which decodes a single row and column address. Decoder 322 decodes the column address for RAM cells 331 and 333, while decoder 324 decodes the column addresses for RAM cells 332 and 334. Decoders 321 and 323 for memory cell A include row address bits for selecting bit line 99, so the outputs of decoders 321 and 323 go high only when the columns having memory cells A are selected and bit line 99 is also selected. Decoders 322 and 324 for the RAM cells go high only when bit line 99 is inactive. Thus, multiple memory cells A can be simultaneously read or written, and yet high density in the remainder of the memory is retained. The reminder of the memory remains high density because no extra word lines are added for accessing the duplicate bits A. Another useful way of applying control store duplication is to feed the read/write signal to the address decoders and set decoders 321 to decode logic 0 and decoder 323 to decode logic 1 on the read/write line. Feeding the read/write signal to other decoders such as 322 and 324 allows two row and column addresses, one for reading and one for writing to a cell's function unit register to be mapped onto a single address in the device address space.

The exact structure of the row and column decoders will depend on a variety of factors, for example, the way in which the duplicated bits are interspersed through the control store and the performance required for read and write operations. Appropriate circuit designs for decoders can easily be arrived at using conventional design techniques as disclosed in the aforementioned Weste & Eshraghian book.

Processor Interface to FPGA

The processor interface will now be described. Current FPGA designs do not provide any means for handshaking information transfers between the user logic on the FPGA and host microprocessors. Consequently, a variety of ad hoc mechanisms have been used. The most flexible existing mechanism presently in use is to clock the FPGA directly from the processor, which keeps the two computations in complete synchronisation. However, clocking the FPGA from the processor slows the FPGA down too much in high performance applications. Thus, clocked transfer is most useful when relatively small amounts of data are transferred to and from registers implemented on the FPGA and provides a useful debugging methodology.

It is also possible to write data into a buffer memory and then initiate a free-running clock implemented on the FPGA itself or implemented on adjacent logic which runs for enough cycles to complete the operation on the data and then stops. This technique works efficiently for large data streams but the overhead of initiating the clock in a separate operation is significant for single operands written to and read from the registers on the FPGA. The processor can poll a hardware flag continuously, use an interrupt generated by the FPGA or wait for a known delay until the FPGA has finished computing and then reads back the results. When an interrupt generated by the FPGA is to be used by the processor, it may be convenient to provide a small number of global output signals which can be selectively driven by any cell function unit output. These global signals can be used as interrupt request signals. (The global signals may be implemented as wired ORs so that several cells can activate the external interrupt. The FPGA device may be programmed to latch the external interrupt line until the latch is cleared by the processor writing to an interrupt status register.

In many applications it is desirable to initiate processing on the FPGA directly by the action of writing data into registers on the array. We described above the addressing scheme for input/output transfers from internal device state registers where the row and column (bit and word) wires used in this addressing scheme pass through the array and have exactly the signals required to synchronise computations on the FPGA. For example, in the case of a write to a vertical register along the bit line, the word line for those bits of RAM will go high during the transfer and low when the transfer is complete. Although these bit line and word line signals are normally concerned only with programming and state access, they can easily be provided as a source to one of the logic routing multiplexers in the array. (Conveniently at a length-4 switch block, bit lines are connected to East/West switches and word lines to North/South switches.) Thus, user defined logic in the FPGA can be triggered by the low going edge on the word line signal to initiate the next computation to clock a new value into the register.

When a relatively short operation (that is less than the execution time of a small number of processing instructions, say 500 nanoseconds with today's technology) is implemented in the FPGA, it can be convenient to extend the above state access mechanism by using the ability of most processors to lengthen read and write cycles by inserting "wait-states" when dealing with slow devices. The FPGA generates a "wait" signal when the register is accessed before its new value has been computed, forcing the processor to wait until it can read the valid result. Similarly, in the write cycle the processor is held up until the previous data in the register has been processed. This arrangement provides a very simple and low overhead method of synchronising the processor with the FPGA.

CAD Software Tools

We will now describe and discuss the CAD software tools for the FPGA and thereafter we will discuss the application of CAL II to the implementation of several common logic structures.

The present CAD tools for FPGAs represent a design as a static hierarchy of connected components; this hierarchy is then flattened into a set of basic components and converted into a bit pattern representing the configuration of the whole device. In a fine-grained FPGA, hierarchical blocks of the design normally specify a rectangular area of the fine-grained array and map onto a rectangular area in the device configuration memory. If the FPGA is designed such that the bit patterns for a given rectangular array of memory depend only on the configuration of the resources in the corresponding area of the design, it is possible to program the FPGA rapidly on a block-by-block basis, all instances of the same block having the same bit pattern. Two instances of the same block with different external connections may have different programing bit patterns. With current FPGAs the configuration generation program performs transformations on the user's design. The transformations require the configuration program to be able to analyse the entire design in order to determine the configuration information for a block of that design.

One way for dynamic reconfiguration to be used is for the host processor to construct the CAL II design dynamically with an internal data structure and compute the bit patterns corresponding to the design and then download them directly into the chip. In such a case there is no specialist translation program or static file containing configuration bit patterns. This approach is made practical by having a less highly encoded translation between design representation and bit pattern (for example certain bits in the bit pattern are reserved for representing a single parameter). Translation can be applied hierarchically or on a block-by-block basis. In addition, the fact that every instance of the same block has the same configuration can be used in conjunction with the multiple write capability of the CAL II chip (implemented by wildcard registers) to decrease programming time. The shift and mask register feature allows overlapping blocks, each of which specifies some resources in the same cell and the same word of control memory, to be programmed independently by allowing a sub-set of bits in a byte to be changed.

Easy Reconfiguration Through Block Design

Although an algorithm may be used to construct some CAL II designs, in most cases users will wish to use more traditional CAD tools to generate the CAL II designs without losing the advantages of dynamic reprogramming. Dynamic reprogrammability may be achieved by using replaceable blocks. For each block of the design the user specifies a number of possible configurations where each of these configurations is a static design which can be produced and analysed using conventional tools. Configuration data for each potential configuration of each replaceable block and the single initial configuration for the whole design can be computed and stored in a disk file or non-volatile memory such as an EPROM. A run-time library routine (that is, a library routine written by the FPGA supplier and called by the user's application programs to interact with the FPGA) for the host processor which controls the CAL II chip can then provide for replacing any replaceable block configuration with one of its alternative configurations. Replacement can be very simple and fast because it requires only block transfers to regular areas of configuration memory.

The software can also provide for initialisation of state registers in replaceable blocks of the design. Conveniently, state registers may be initialised to a deflault value associated with the block definition or to the previous state of the current instance of the block, thus restoring its status. This can be achieved using the CAL II architecture's ability to read and write registers randomly.

To ensure rapid reconfiguration, it is desirable to impose some restrictions on replaceable blocks. For example, each version of a replaceable block must have the same bounding box. I/O signals must appear at the same point on the block periphery on all versions of a replaceable block, and no versions of a replaceable block may use any chip resources which extend outside their bounding box. For example, it would be unacceptable to use in a replaceable block a flyover wire which extended outside the bounding box of the replaceable block. A more restrictive rule which considerably simplifies the software is that no chip resources lying within the boundary of an instance of a replaceable block may be assigned to any other block in the design. CAD software can easily check whether these restrictions have been met. If they are not met, the block can be ruled illegal. Alternatively, a more general purpose and slower reconfiguration algorithm which checks individual resources for conflicts rather than checking bounding boxes can be used.

In some cases, there are relatively few potential configurations of the device, and extremely rapid switching between these configurations is desirable. In such a situation, in order to minimise the number of device accesses, optimisation software (which could have a long run-time) may be used to analyse the device configuration file and a list of potential reconfigurations. This optimisation software will produce a set of configuration operations which take advantage of the multiple write capabilities of the device and change only those bits of control store which are different. The optimiser output could be stored in high level language code or machine language program segments for a host processor. These precomputed instructions, when executed, will then perform the reconfiguration rather than a data file controlling reconfiguration.

Figure 39:
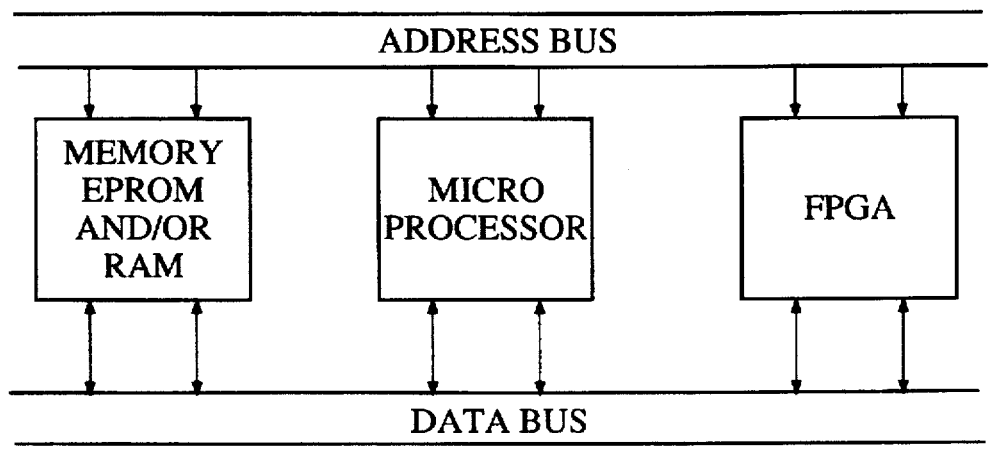
FIG. 39 is a schematic diagram of the relationship of an FPGA, microprocessor and memory device in a typical application.

FIG. 39 is a schematic diagram of an FPGA shown located on an address bus and data bus with a microprocessor and memory (EPROM and/or RAM). This depicts the simplicity of using the FPGA in a microprocessor based circuit application. The CAL II architecture does not support bi-directional and tri-state wires. The principal reason for this is that the CAL II is intended to support dynamic reconfiguration by user software. It is possible that during dynamic reconfiguration, the control store may be configured incorrectly either as the result of the program being terminated mid-way through configuring the array, or because of errors in the user's software. In an architecture where a wire can be driven by multiple transceivers each of which is controlled by an independent bit of RAM, there is the inherent potential for conflict, resulting in high power dissipation and potential damage to the device if the control store is incorrectly configured. Such a situation is tolerable when configurations are static and generated by trusted software, but is unacceptable in a device intended to support frequent reconfiguration. The function of tri-state buses can be emulated using wire-OR or wire-AND buses implemented using the cell logic gates and the longer logic wires provided by the CAL II array.

Example Applications Using CAL II

FIGS. 40–48 show example applications of the CAL-II architecture. The drawing convention used in FIGS. 40–48 represents function units of a cell which are used by a design as a central box with a name on the box to represent the selected function. The drawing convention places signals in order according to decreasing length from the perimeter towards the center of the cell, so that, for example, length-4 flyovers near the perimeter of cells and the neighbour interconnects closer to the function block. Lines which turn at a single dotted line and pass to the central box in the cell represent signals being handled by one of multiplexers 58, 60, or 62 of FIG. 10. Lines which terminate at the edge of a box represent inputs to the function unit. The side of the function unit contacted corresponds to input terminals on FIG. 11 as indicated in Table I.

TABLE I

| Function Class | Left | Right | Top | Centre |
|---|---|---|---|---|
| ZERO and ONE | Not used | Not used | Not used | F |
| A and Ā | A | Not used | Not used | F |
| B and B̄ | Not used | B | Not used | F |
| Two Input Comb. | A | B | Not used | F |
| Multiplexer | A | B | Sel | F |
| Register | D | Clk | Clr | Q |

Figure 41:
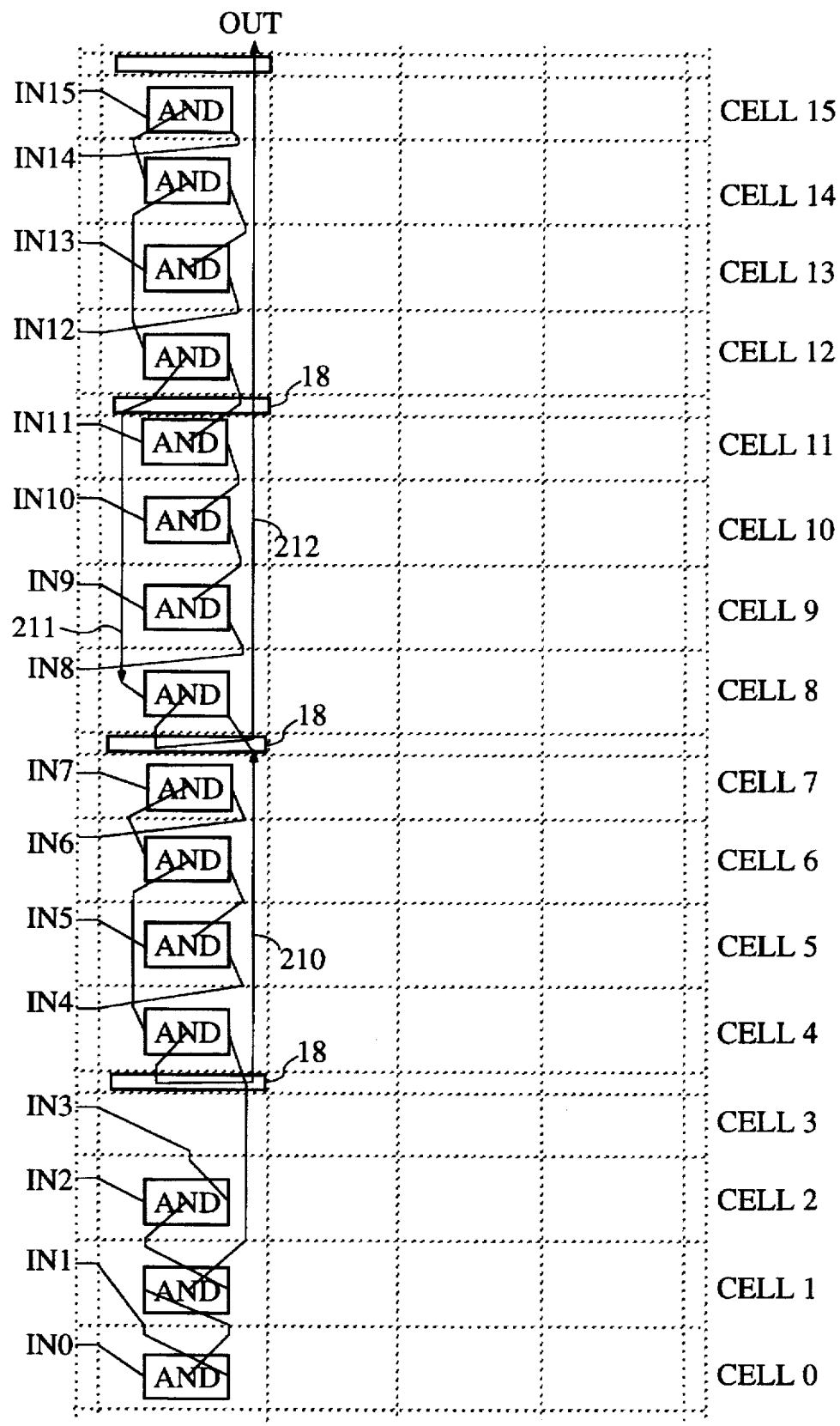
FIG. 41 depicts a diagrammatic representation similar to FIG. 40 but of a 16 bit wide AND gate implemented on four 4-cell×4-cell blocks with the 16 cells arranged in one column of the array.

Lines which exit from the center of a cell function unit represent signals which have been placed on the SELF line by function unit 48 of FIG. 10 and further connected to a neighbour cell by one of multiplexers 50, 52, 54, or 56. Lines which pass through one cell close to the function unit and to the next cell represent signals being received on a N, S, E, or W input by one of multiplexers 50, 52, 54, or 56 of FIG. 10 and passed to NOUT, SOUT, EOUT, or WOUT by that multiplexer. In order to simplify the drawings, the switches 18 or 20 (switches are illustrated in FIGS. 15, 16, and 17), which are shown and labeled in FIG. 41, are not labeled in FIGS. 42–48. These switches are positioned between the double lines which separate cell blocks, as shown in FIG. 41.

Figure 40:
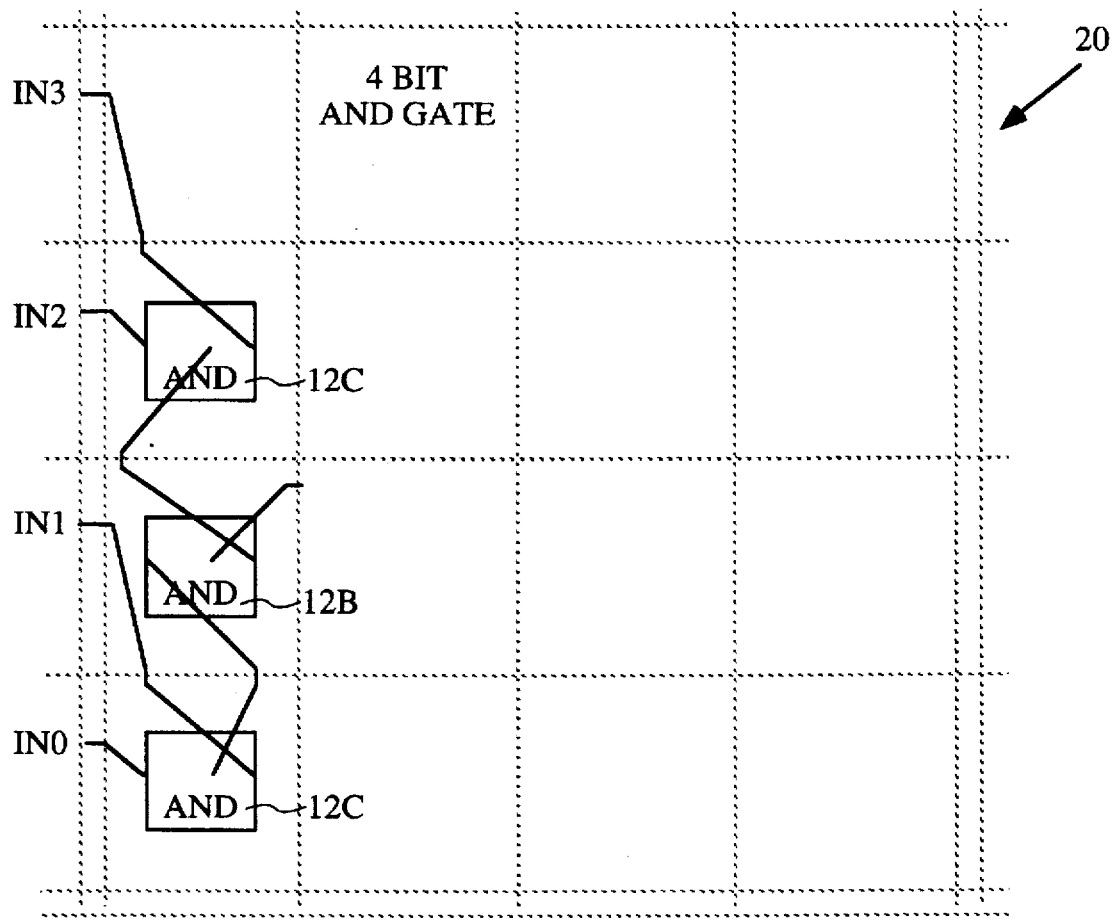
FIG. 40 is a diagrammatic representation of an FPGA architecture showing a 4 bit wide AND gate implemented on an FPGA in accordance with an embodiment of the present invention.

FIG. 40 depicts a first implementation of an application using the CAL II architecture using a 4-input AND gate. The 4-input AND gate is provided in a 4×4 block of cells which typically implements additional functions, although for clarity only those cells which implement the AND gate are shown. Wide gates are found in many important logic structures including address decoders and the AND and OR planes of ROM/PLA/PAL type structures. It is essential to be able to implement such wide gates efficiently in terms of both speed and area. The CAL II architecture supports the fast implementation of these wide gates by using a tree of two-input, one-output logic cells 12. In the tree structure shown in FIG. 40, the delay grows logarithmically rather than linearly with the number of inputs. The drawing convention in FIGS. 40 through 48 represents function units within the logic cells as rectangles labeled with their selected function. Those cells whose function unit is unused do not contain a rectangle. Input signals to the logic cells are shown contacting the logic cell rectangles at their edges, and outputs are shown leaving the logic cell rectangles from their centers. Switches which connect neighbor cells are positioned on the single dashed lines, but for clarity are not shown. Switches 18, which were illustrated in FIGS. 1, 2, 15, and 16 are also not shown but are positioned between the double dashed lines.

In FIG. 40, AND gate 12a receives two inputs, IN0 and IN1, and AND gate 12c receives two inputs IN2 and IN3. The outputs of AND gates 12a and 12c form the inputs to AND gate 12b from whence the output OUT is taken. The function units depicted in FIGS. 18 to 25 allow true or complemented values of each input variable to be used, which is essential for decoders. The flexibility of the function unit in the OR plane of a ROM enables the number of product terms to be halved, and the routing resources provided by the CAL II architecture allow tree-structured gates with up to 32 inputs to be implemented in a single column of cells.

FIG. 41 depicts a 16-cell AND gate with the 16 cells arranged in a column of the array. There are four 4-cell×4-cell blocks arranged vertically. This arrangement not only depicts the connections between neighbour cells but also the connections between the blocks of cells using the length-4 and length-16 flyovers. The cells are numbered from cell 0 at the bottom to cell 15 at the top. In FIG. 41, switches 18 are shown located in the spaces between the cell blocks. In addition, it will be seen that lines 210, 211 and 212 depict length-4 flyover routing. Signals can only enter flyover 210 at switch 18 between cells 3 and 4 although a signal can exit flyover 210 directly into cells 4, 5, 6, 7 and into the switch 18 between cells 7 and 8. In the bottom block comprising cell 0 through cell 3, there are three AND gates in cells 0 to 2. The output of cell 1 passed through an unused cell 3 and enters the switch 18 at the boundary to the bottom block. The output of cell 1 forms an input of the AND gate in cell 4. The output of the AND gate in cell 4 is sent via the switch 18 between cells 3 and 4 to length-4 flyover 210. Cell 8 has one input from length-4 flyover 210 and the other input from cell 12 via flyover 211 (without going through the switch 18 between cells 7 and 8). Output of the 16-input AND gate is taken from the output of cell 8 and is routed via the switch 18 between cells 7 and 8 onto flyover 212 to the switch 18 between cells 11 and 12, and provided as output at the top of FIG. 41.

Figure 42:
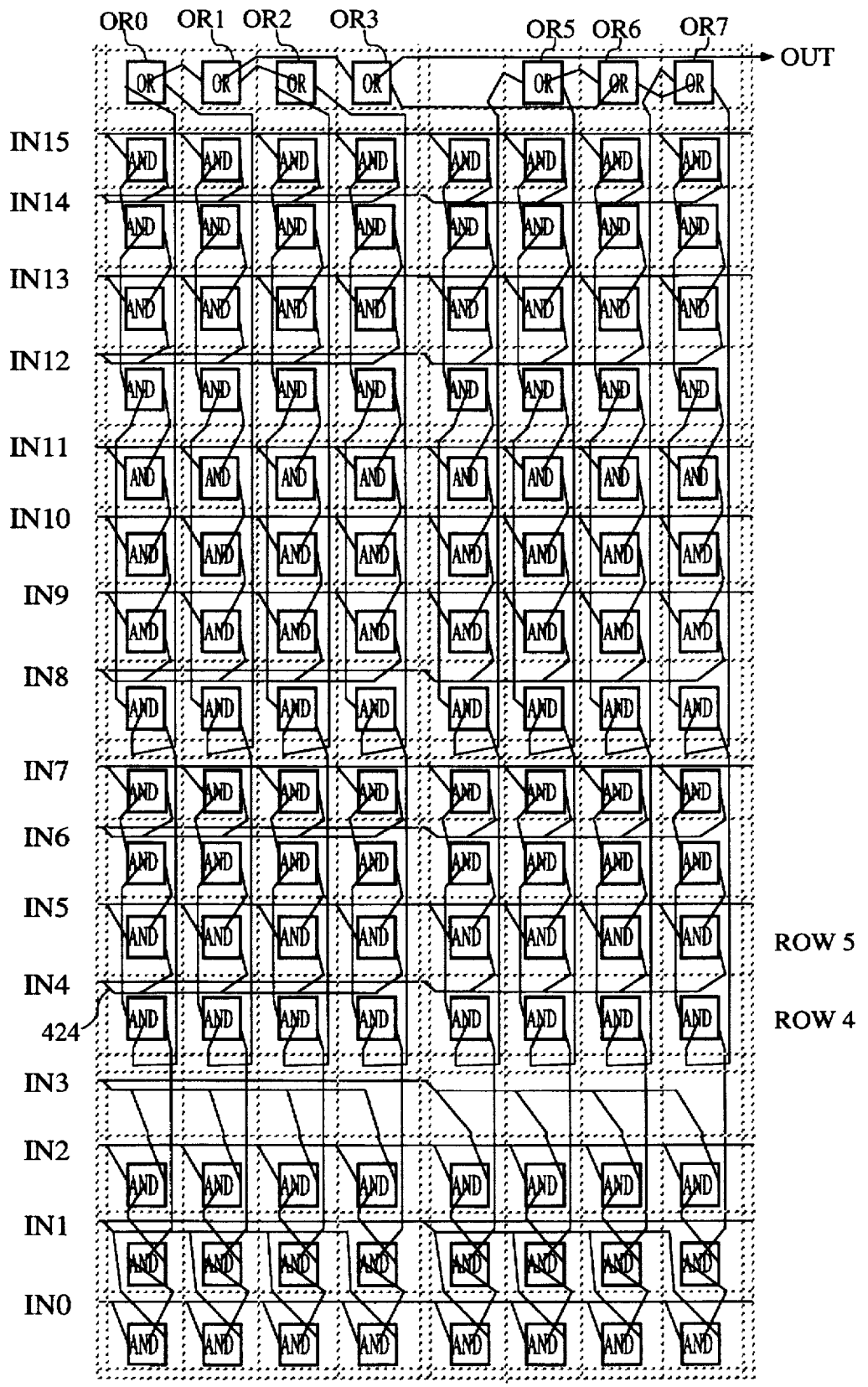
FIG. 42 depicts a PAL-type structure showing how the AND plane is structured and mated to an OR plane to form a general purpose logic block.

FIG. 42 depicts a PAL-type structure showing how an AND plane is built up and mated to an OR plane to form a general purpose logic block. Inputs IN0 through IN15 are provided to 8 columns of 16 rows of AND gates. Each column is connected as shown in FIG. 41 to form a tree structure. Because there are eight columns of AND gates, connections from the input signals IN0 through IN15 are applied to length-4 flyovers. Input signals are applied at the left of the figure and the East flyovers are used. Since two input signals are applied to AND gates at the lowest level of the tree, and only one East length-4 flyover is provided for each cell. in even rows, the East length-4 flyovers of adjacent cells are used, and signals transferred through neighbor interconnect. For example, the row of cells labeled ROW 5 receives its IN5 input from the East length-4 flyovers of ROW 5 and its IN4 input from the East length-4 flyover of ROW 4. But in the embodiment shown in FIG. 10, there is no provision to take routing from one neighbour cell to another from a length-4 flyover. Therefore at the switches indicated by double dotted lines the signal on the east length-4 flyover is transferred to east neighbour routing. One such switch transfer is labeled 424 in FIG. 42. For simplicity, other transfers are not labeled. The IN4 signal is then transferred east through neighbour routing to the next three adjacent cells. The signal is also transferred by cells in row 4 upward along neighbor interconnect to cells directly above in row 5. In accordance with the invention, the IN4 signal runs on the east length-4 flyover as well as through neighbour interconnect, so that it reaches the four AND gates at the right of the figure with less delay than if it had passed through eight neighbour cells. Another switch equivalent to 424 transfers the IN4 signal to the neighbour interconnect of the right 4 columns. In this application, it is not necessary to also place the signal on the east length-4 flyover at the right of the figure because no further connection of the IN4 signal to the right of the figure is made. Rows 6, 8, 10, 12, and 14 include the same combination of length-4 flyovers and neighbour routing to get high speed. Rows 1 and 3 also include this combination, though in these cases, the signal is passed downward to rows 0 and 2, respectively, rather than upward.

One row of 7 OR gates is positioned at the top of FIG. 42. OR gate OR0 receives as input the outputs of the first two columns of AND gates. OR gate OR2 receives as input the outputs of the third and fourth columns of AND gates. OR gate OR1 receives as input the outputs of OR gates OR0 and OR2. A similar tree structure is formed by OR gates OR5 through OR7, with the output signal OUT taken from OR gate OR3 through a length-4 flyover.

Figure 43:
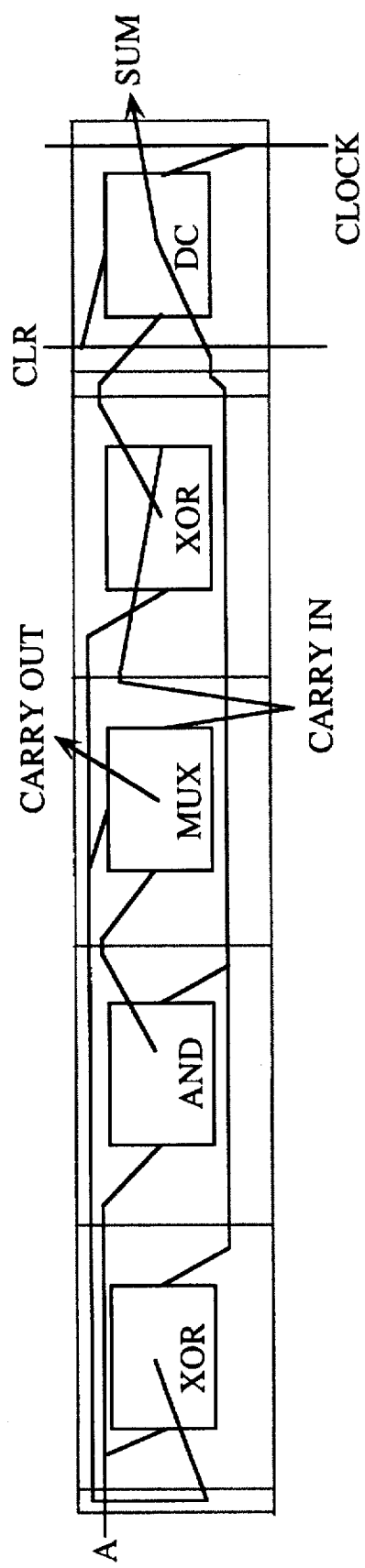
FIG. 43 depicts a one bit accumulator structure from a row of five cells in two 4-cell×4-cell blocks.

FIG. 43 depicts a one-bit accumulator constructed from a row of 5 cells in two (4×4) cell blocks. The cells are configured for XOR, AND, MUX and DC as shown to create a SUM output and a CARRY output.

Figure 44:
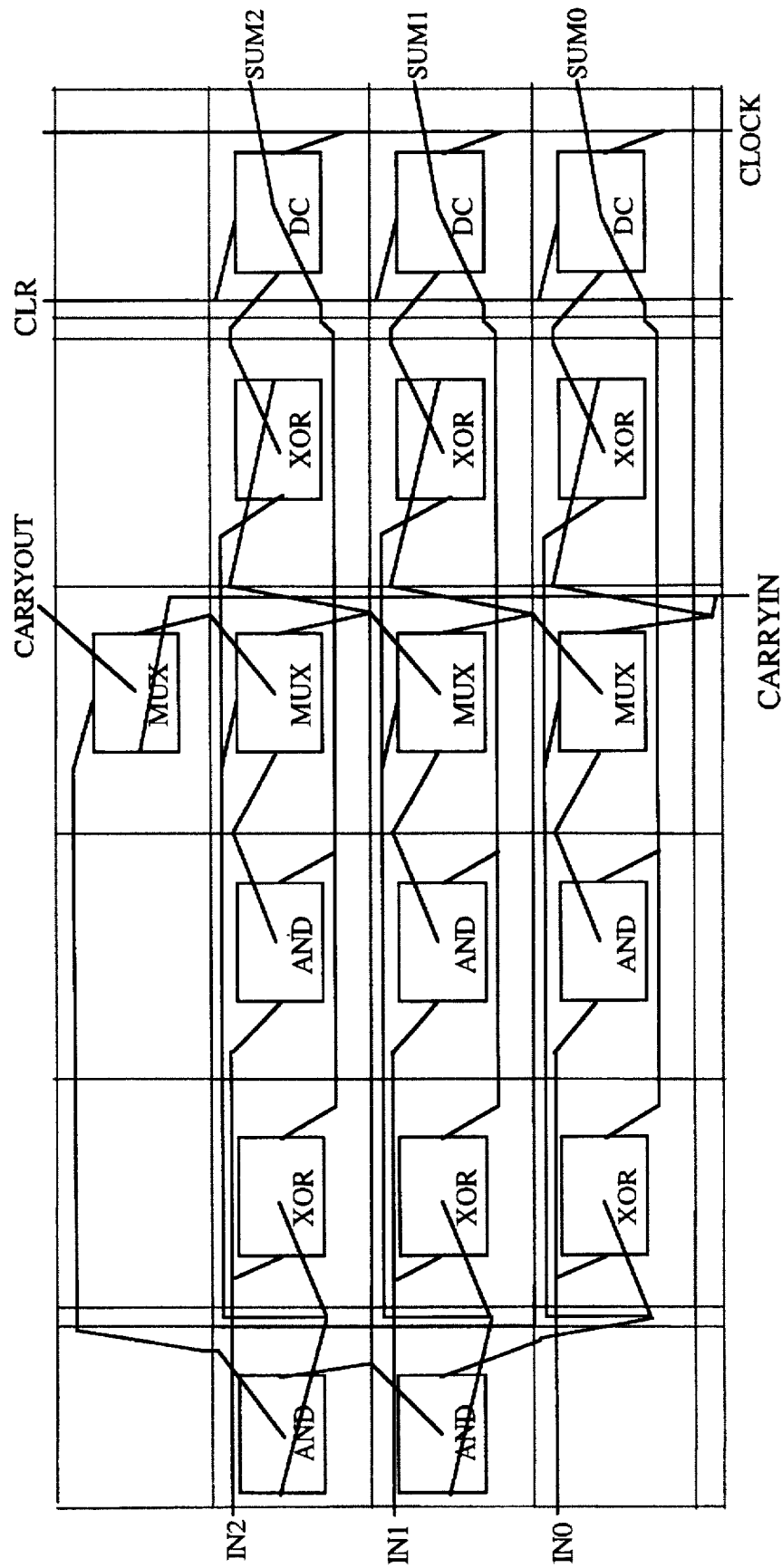
FIG. 44 depicts a three bit accumulator with a look ahead carry.

FIG. 44 depicts a three bit accumulator with a look ahead carry (for 3 inputs In0, In1 and In2 generating SUM0, SUM1, and SUM2, and CARRYOUT).

Figure 45:
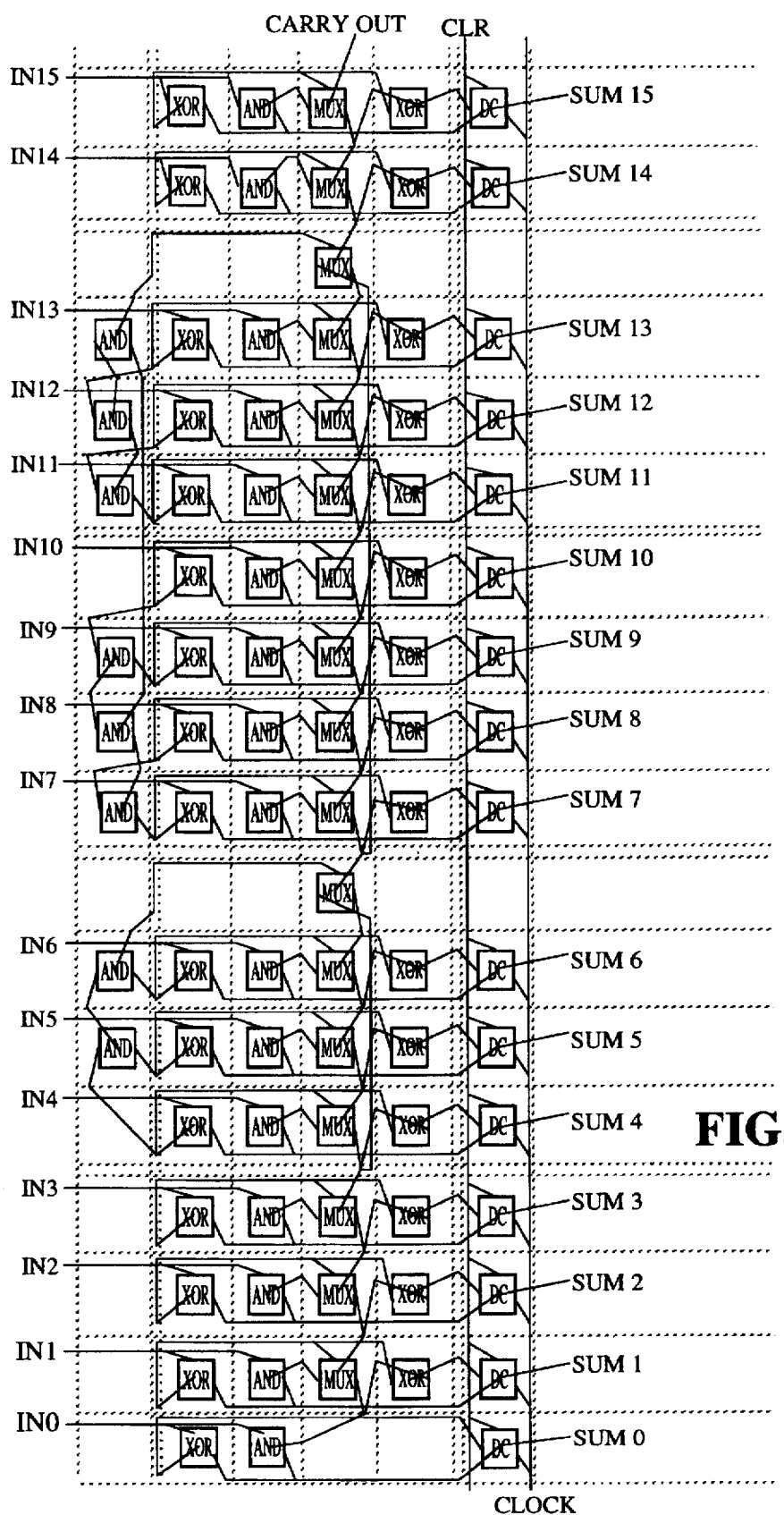
FIG. 45 depicts a 16 bit accumulator with a carry look ahead which is a more complex arrangement but similar to that shown in FIG. 44.

FIG. 45 depicts an adder which is a 16 bit accumulator with a look ahead carry for minimising the delay along the carry chain. The CAL II architecture supports the 2:1 multiplexer as a cell function, as can be seen from FIGS. 43, 44 and 45, and this reduces the carry path delay from two gate delays in the CAL I architecture to one gate delay in this architecture. The extra routing resources provided by the flyovers allows the one bit adder shown in FIG. 43 to be implemented in a single row of cells, which reduces routing delays on the carry path as compared to a two-cell-high (CAL I) implementation. In this way it will be appreciated that accumulators and adders of various complexity can be constructed using the CAL II architecture and, of course, the routing resources can be used as shown in FIG. 45 to route the carry from a previous stage over a block of adders in a look ahead structure.

Figure 46:
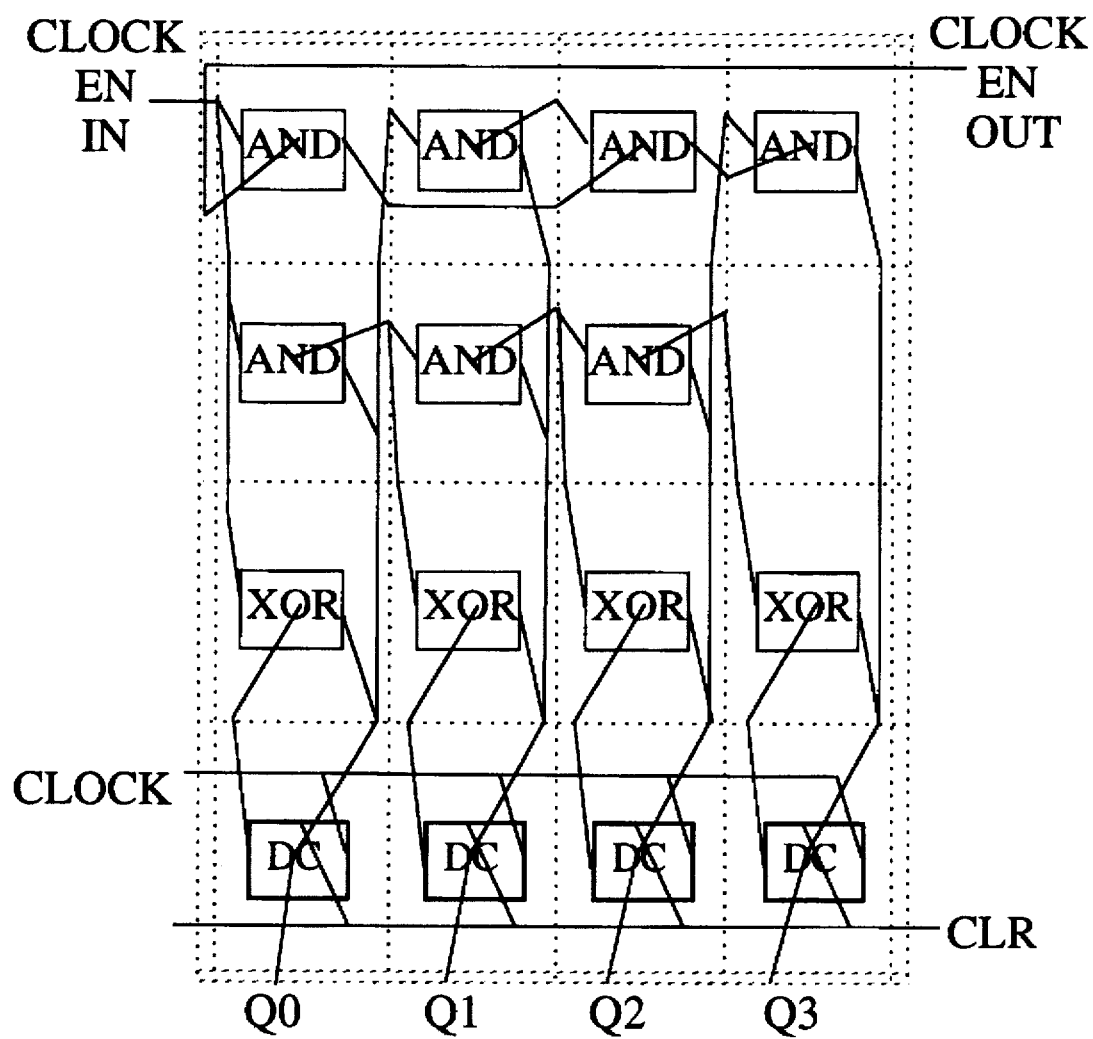
FIG. 46 is a diagrammatic representation of a 4 bit synchronous counter implemented in a single 4-cell×4-cell block.
Figure 47:
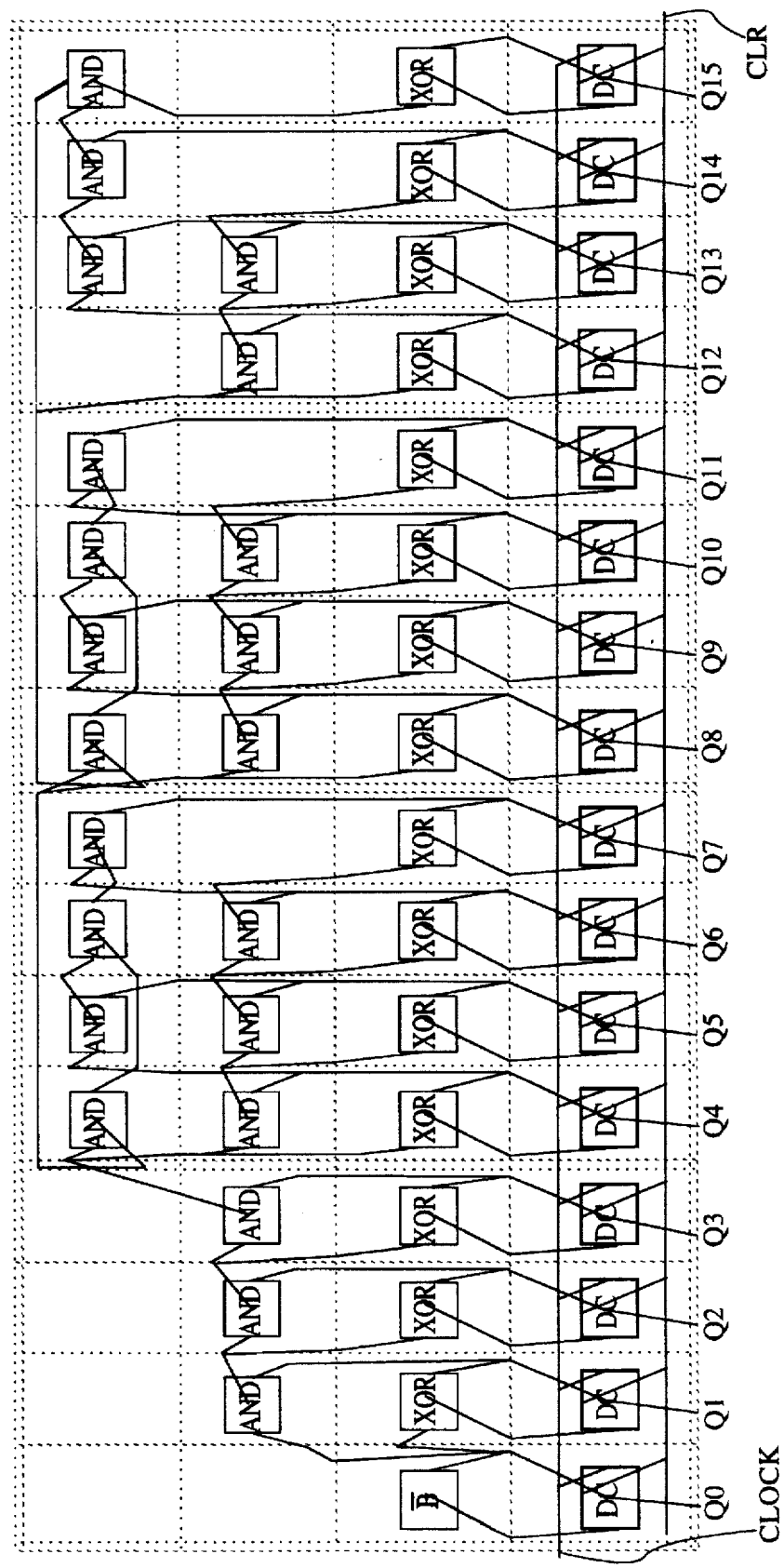
FIG. 47 depicts a 16 bit synchronous counter realised on four 4-cell×4-cell blocks having flyover routing resources.

The CAL II architecture can also implement synchronous counters. As described above, the CAL II architecture provides an edge triggered flip-flop as a cell primitive, which allows a more efficient implementation of such synchronous counters. FIG. 46 depicts a 4-bit synchronous counter stage which has the usual signals such as Clock Enable In, Clock Enable Out, clock, and output signals Q0, Q1, Q2 and Q3. It will be seen that the clock enable output signal comes from a length-4 flyover and that the clock signal can be communicated to all cells in the row used for flip flops via the length-4 flyover. The CAL II architecture is particularly effective because it provides flyover routing resources to route the clock lines directly into the cells. Also, the look ahead function required by the fast synchronous counters is provided using wide gates. The 4-bit counter stage shown in FIG. 46 can be cascaded and expanded to form a 16 bit synchronous counter as shown in FIG. 47 using 4 blocks of 4 cells×4 cells.

Figure 48:
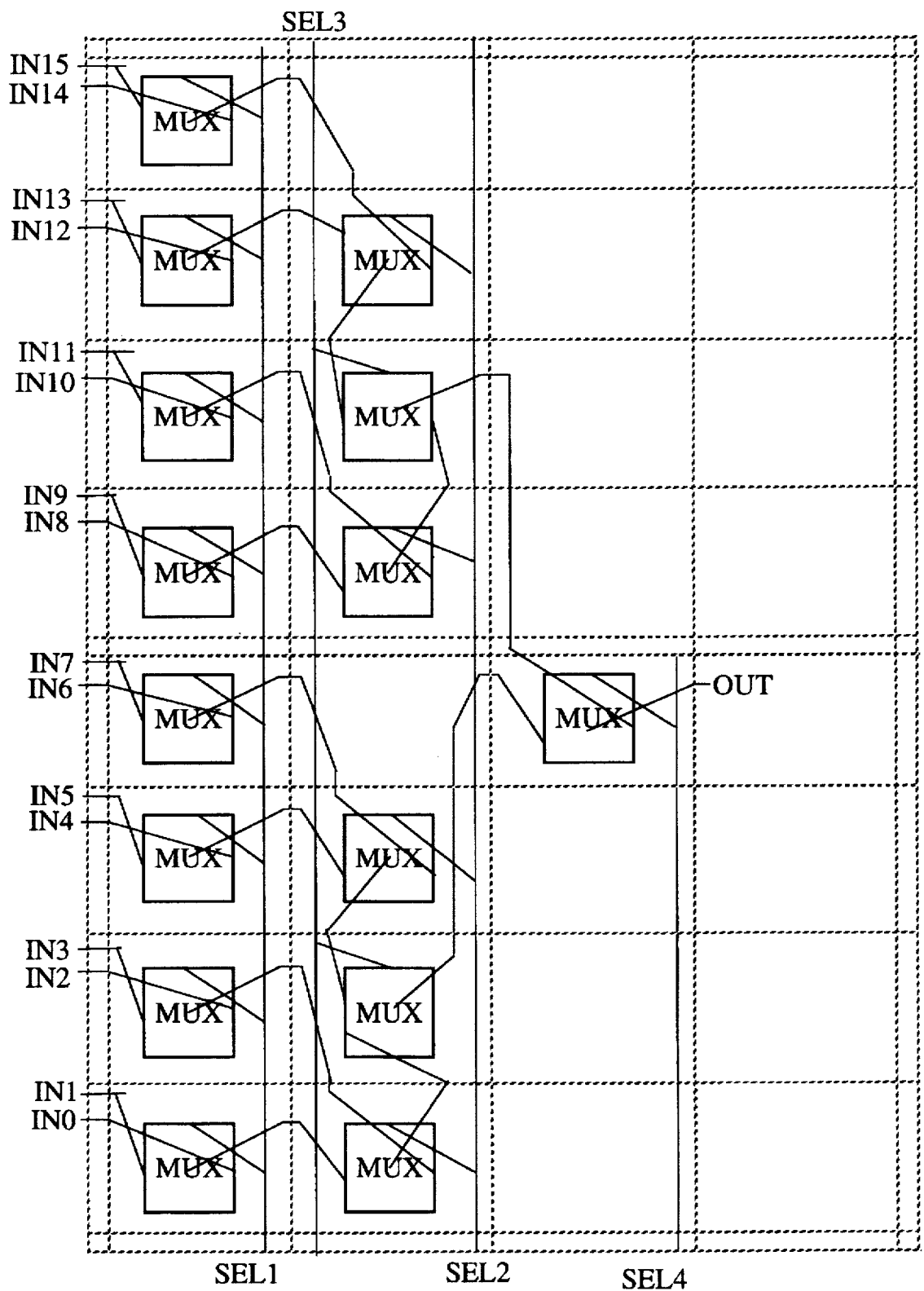
FIG. 48 depicts a 16:1 multiplexer realised in two 4-cell×4-cell blocks, and which is implemented as a tree of 2:1 multiplexers.

It will also be appreciated that wide multiplexers such as 16:1 multiplexers can be efficiently implemented as a tree of 2:1 multiplexers. Such an arrangement is depicted in FIG. 48 in which two 4×4 blocks of cells are used to form the tree. The first row of cells has eight cells implementing 2:1 multiplexers. The outputs of these multiplexers are fed to the inputs of multiplexer cells in the second row whereupon two outputs are taken from the 2:1 multiplexer shown in the third row which provides the output of the 16:1 multiplexer.

SUMMARY

It will readily be appreciated that all common logic structures can be implemented using this technology. The main additional features supported by the CAL II architecture are that the control store layout is arranged so that closely associated groups of resources within a cell are accessed through the same byte of the control store, additional logic circuits on the control store interface allow for word-wide read and write access to internal state registers in the user design, wildcard registers are provided in the control store address decoder to allow vectors of cells and bit slices in the user designs to be changed simultaneously, and a hierarchical routing structure consisting of length-4, 16 and 64 wires is overlaid on the basic cell grid to reduce the delay on longer wires. As described above, length-4 wires are used as function unit inputs to the basic cells. This structure can be extended upwardly in a hierarchical manner to length-64 and length-256 and so on for wires in future product families.

The CAL II architecture provides the ability to make dynamic accesses to a CAL II FPGA by mapping its control store into the address space of a host processor. This offers design opportunities which are not available from any other FPGA. Significant benefits can be gained from this architecture without abandoning traditional CAD frameworks. The CAL II architecture can be used in a variety of modes and four principal modes have been identified:

1. Conventional ASIC: In this mode, conventional ASIC/FPGA design tools are used to produce a static configuration file which is then loaded into the device from an EPROM or other non-volatile store at power up. No host processor is needed, although it will be appreciated that if such a host processor is available, savings inboard area can be obtained by storing the CAL II design configuration within the host processor's memory. The use of the host processor also allows configuration time and configuration data size to be greatly reduced by taking advantage of the wildcard units in the CAL II address decoders.

2. Processor Access to Internal State: In this arrangement, again a conventional ASIC process flow is used to produce a static configuration which is then down-loaded on power up. While the device is active the processor accesses internal registers of the user's design to store and to retrieve values.

The control store interface can be regarded as providing free wiring to all internal registers of the user's design. Use of existing control store wiring can increase density by eliminating wires which would otherwise be required to route signals to the chip edge, and can also reduce design complexity. This design style is particularly attractive in applications where the FPGA provides an interface between a microprocessor and external hardware. Software running in the host calculates the addresses of internal registers using trivial computations based on placement information output from the CAD system.

3. Multiple Unrelated FPGA Configurations: In this design style several complete FPGA designs are undertaken in parallel using a conventional CAD system and then verified independently. Run-time software on the host processor can then swap between various configurations of the FPGA device. Conveniently, FPGA configurations can be associated with processes running on the host processor and swapped during process context switches, preserving the state of internal registers. In this way, each process can appear to have access to its own virtual FPGA. These multiple configurations must, however, be designed to co-operate with each other if any user I/O pins are shared by multiple configurations. The additional circuits on the CAL II control store interface greatly reduce the number of write operations to switch between various device configurations. One example of an application suited to this technique is a laser printer controller where the FPGA initially operates as an RS232 interface to down-load a printer image file and is then reconfigured to control the print engine and implement low level graphics operations.

4. Algorithmic Use of Dynamic Reconfiguration: In this design style portions of the circuit implemented on the FPGA are reconfigured dynamically as part of the computation being performed. For example, the routing network in the FPGA may be used directly to perform a permutation function over the FPGA input pins. The largest part of the design work and much of the verification can be done using conventional ASIC design tools.

A high percentage of system designs in present use consist of a processor, memory, and chips to interface to I/O devices on the circuit board. The design of such a system consists of both hardware design of any ASIC or FPGA and the board itself, and also software design of the program for the processor which implements most of the desired functionality. Mapping of the control store of the FPGA into the address space of the processor provides the opportunity to move elements of the design from the hardware engineer to the software engineer which simplifies the overall design process. It is still necessary for software to lay out the user's design onto the hardware of the CAL II device, but the software for this task can be less complex because of the regularity of the CAL II architecture.

A principal advantage of the CAL II structure is that it is simple, symmetrical, and regular, which allows novice users to quickly make use of the array of fine-grained cells, and permits CAD tools to make efficient use of the resources available. A further advantage of the CAL II array is that it provides flexibility in placing functional blocks of designs on the array to meet an overall size constraint. The arrangement of the control store and the use of the wildcard registers and shift and mask registers minimises the number of microprocessor instructions required to access device resources and status. The specific structure of the control store allows many control bits to be written simultaneously instead of one at a time because of the structured set of data in the RAM. This has the advantage of reducing the testing overhead because testing uses regular configurations. The advantage of the hierarchical scaling is that delays are logarithmic in terms of distance in cell units and delays are hence considerably reduced in comparison with previous designs. Since the flyover wires can only be driven by one element, dynamic access to the control store is safer because there is no possibility of incorrect configurations causing contention. This added safety is useful in situations where the FPGA configuration is intended to be frequently altered by a user.

I claim:

1. A register structure comprising:

a plurality of input lines;

a mask register having one bit for each input line;

a plurality of output lines;

a matrix of programmable connectors for programmably connecting each of said input lines to each of said output lines;

for each of said programmable connectors, a decoder receiving an enable signal from a corresponding bit in said mask register and a decode address signal derived from all less significant bits in said mask register, each of said decoders enabling a corresponding input line to be connected to a corresponding output line only when said decode address signal indicates that no previous input lines have been connected to that output line.

2. A register structure as in claim 1 further comprising for each mask register bit an increment register for generating said decode address.

3. A register structure comprising:

a plurality of input lines;

a mask register having one bit for each input line;

a plurality of output lines;

a matrix of programmable connectors for programmably connecting each of said input lines to each of said output lines;

for each of said programmable connectors, a decoder receiving an enable signal from a corresponding bit in said mask register and a decode address signal derived from all more significant bits in said mask register, each of said decoders enabling a corresponding input line to be connected to a corresponding output line only when said decode address signal indicates that no previous input lines have been connected to that output line.

* * * * *